United States Patent
Lee et al.

(10) Patent No.: US 8,345,481 B2
(45) Date of Patent: *Jan. 1, 2013

(54) NAND BASED NMOS NOR FLASH MEMORY CELL, A NAND BASED NMOS NOR FLASH MEMORY ARRAY, AND A METHOD OF FORMING A NAND BASED NMOS NOR FLASH MEMORY ARRAY

(75) Inventors: Peter Wung Lee, Saratoga, CA (US); Fu-Chang Hsu, San Jose, CA (US); Hsing-Ya Tsao, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/317,678

(22) Filed: Oct. 25, 2011

(65) Prior Publication Data

US 2012/0044770 A1 Feb. 23, 2012

Related U.S. Application Data

(63) Continuation of application No. 12/387,771, filed on May 7, 2009, now Pat. No. 8,072,811.

(60) Provisional application No. 61/126,854, filed on May 7, 2008, provisional application No. 61/130,381, filed on May 30, 2008, provisional application No. 61/131,554, filed on Jun. 9, 2008, provisional application No. 61/132,122, filed on Jun. 16, 2008, provisional application No. 61/132,628, filed on Jun. 20, 2008.

(51) Int. Cl.
*G11C 11/34* (2006.01)

(52) U.S. Cl. .............................. 365/185.17; 365/185.24
(58) Field of Classification Search ............. 365/185.17, 365/185.24
See application file for complete search history.

(56) References Cited

U.S. PATENT DOCUMENTS

| 4,761,768 | A | 8/1988 | Turner et al. |
|---|---|---|---|
| 5,563,827 | A | 10/1996 | Lee et al. |
| 5,596,523 | A | 1/1997 | Endoh et al. |
| 5,768,192 | A | 6/1998 | Eitan |
| 5,862,082 | A | 1/1999 | Dejenfelt et al. |
| 6,163,048 | A | 12/2000 | Hirose et al. |
| 6,498,752 | B1 | 12/2002 | Hsu et al. |
| 6,556,481 | B1 | 4/2003 | Hsu et al. |
| 6,614,070 | B1 | 9/2003 | Hirose et al. |

(Continued)

OTHER PUBLICATIONS

PCT Search Report—PCT/US 09/02817, Mail Date—Jun. 30, 2009.

(Continued)

*Primary Examiner* — Michael Tran
(74) *Attorney, Agent, or Firm* — Saile Ackerman LLC; Stephen B. Ackerman; Billy Knowles

(57) ABSTRACT

A NOR flash nonvolatile memory or reconfigurable logic device has an array of NOR flash nonvolatile memory circuits that includes charge retaining transistors serially connected in a NAND string such that at least one of the charge retaining transistors functions as a select gate transistor to prevent leakage current through the charge retaining transistors when the charge retaining transistors is not selected for reading. The topmost charge retaining transistor's drain is connected to a bit line parallel to the charge retaining transistors and the bottommost charge retaining transistor's source is connected to a source line and is parallel to the bit line. The charge retaining transistors are programmed and erased with a Fowler-Nordheim tunneling process.

160 Claims, 30 Drawing Sheets

U.S. PATENT DOCUMENTS

| | | | |
|---|---|---|---|
| 6,620,682 B1 | 9/2003 | Lee et al. | |
| 6,628,563 B1 | 9/2003 | Hsu et al. | |
| 6,756,632 B1 | 6/2004 | Chen et al. | |
| 6,765,825 B1 | 7/2004 | Scott | |
| 6,777,292 B2 | 8/2004 | Lee et al. | |
| 6,788,611 B2 | 9/2004 | Hsu et al. | |
| 6,788,612 B2 | 9/2004 | Hsu et al. | |
| 6,818,491 B2 | 11/2004 | Lee et al. | |
| 6,828,563 B2 | 12/2004 | Ducourant | |
| 6,862,223 B1 | 3/2005 | Lee et al. | |
| 7,064,978 B2 | 6/2006 | Lee et al. | |
| 7,075,826 B2 | 7/2006 | Lee et al. | |
| 7,087,953 B2 | 8/2006 | Lee | |
| 7,102,929 B2 | 9/2006 | Lee et al. | |
| 7,110,302 B2 | 9/2006 | Lee et al. | |
| 7,120,064 B2 | 10/2006 | Lee et al. | |
| 7,141,474 B2 | 11/2006 | Ichige et al. | |
| 7,203,092 B2 | 4/2007 | Nazarian | |
| 7,263,003 B2 | 8/2007 | Edahiro et al. | |
| 7,283,401 B2 | 10/2007 | Lee et al. | |
| 7,289,366 B2 | 10/2007 | Lee et al. | |
| 7,324,384 B2 | 1/2008 | Lee et al. | |
| 7,332,766 B2 | 2/2008 | Hasegawa et al. | |
| 7,359,245 B2 | 4/2008 | Kim et al. | |
| 7,411,822 B2 | 8/2008 | Specht et al. | |
| 7,411,827 B2 | 8/2008 | Guterman et al. | |
| 7,505,324 B2 | 3/2009 | Umezawa et al. | |
| 7,539,053 B2 | 5/2009 | Kanda | |
| 2009/0279360 A1* | 11/2009 | Lee et al. | 365/185.17 |
| 2009/0310405 A1 | 12/2009 | Lee et al. | |
| 2009/0310411 A1 | 12/2009 | Lee et al. | |
| 2009/0310414 A1 | 12/2009 | Lee et al. | |
| 2009/0316487 A1 | 12/2009 | Lee et al. | |
| 2010/0095047 A1* | 4/2010 | Grandin | 711/102 |

OTHER PUBLICATIONS

"A Dual-Mode NAND Flash Memory: 1-Gb Multilevel and High-Performance 512-Mb Single-Level Modes," by Taehee Cho et al., IEEE Journal of Solid-State Circuits, vol. 36, No. 11, Nov. 2001, pp. 1700-1706.

"Intel StrataFlash TM Memory Technology Development and Implementatioin," by Al Fazio et al., Intel Technology Journal, vol. 1, Issue 2, Q4, 1997, found www.intel.com, Apr. 21, 2009, pp. 1-12.

"Intel StrataFlash TM Memory Technology Overview," by Greg Atwood et al., Intel Technology Journal, vol. 1, Issue 2, Q4 1997, found www.intel.com, Apr. 23, 2007, pp. 1-8.

"ETOX TM Flash Memory Technology: Scaling and Integration Challenges," by Fazio et al., Intel Technology Journal, vol. 6, Issue 2, May 2002, found www.intel.com, Apr. 21,2009, pp. 23-30.

\* cited by examiner

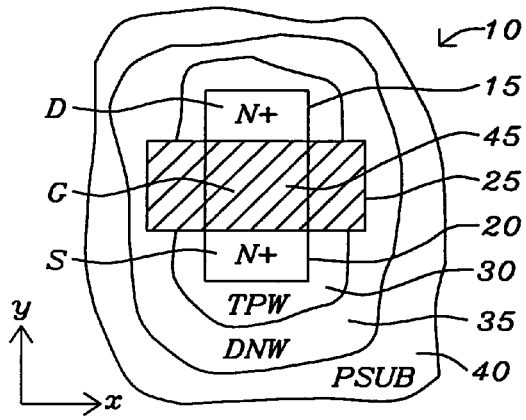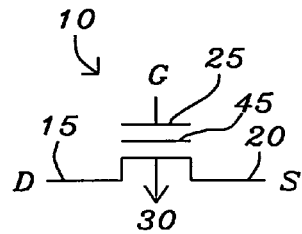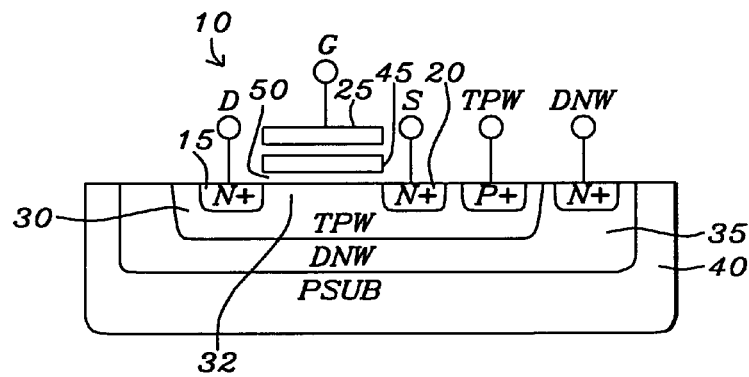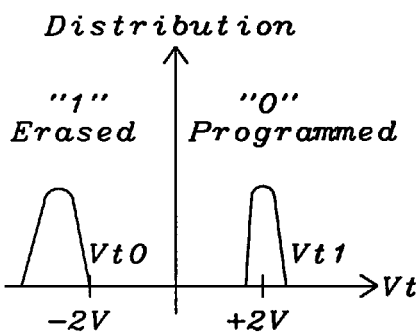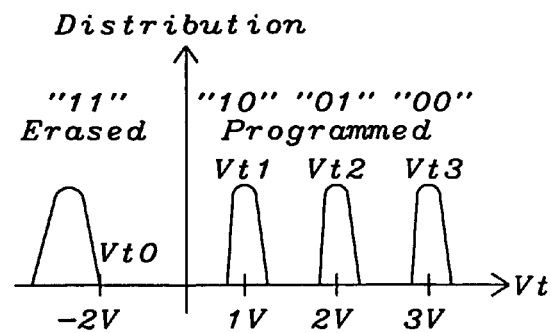

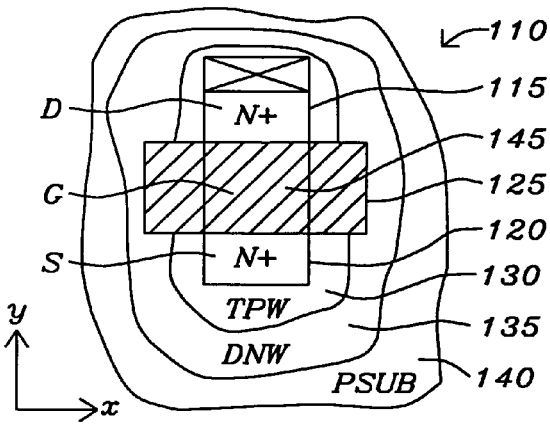
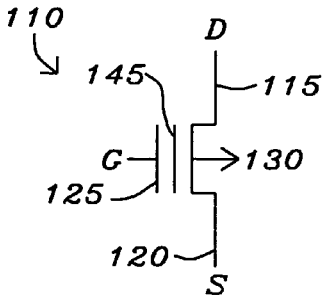
FIG. 2a    FIG. 2c
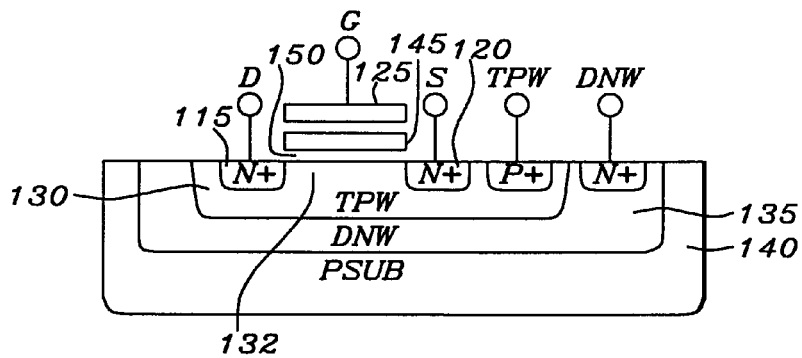
FIG. 2b
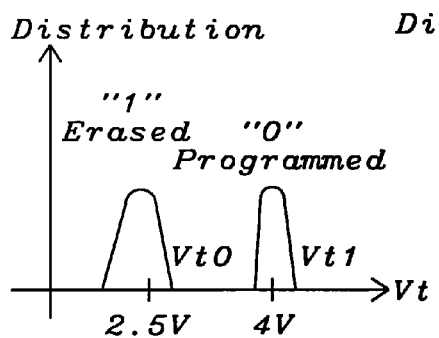
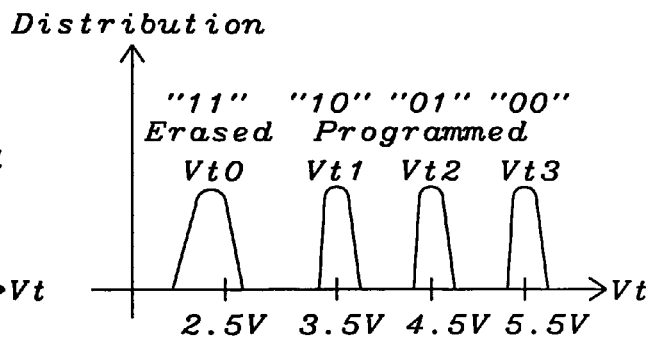
FIG. 2d    FIG. 2e

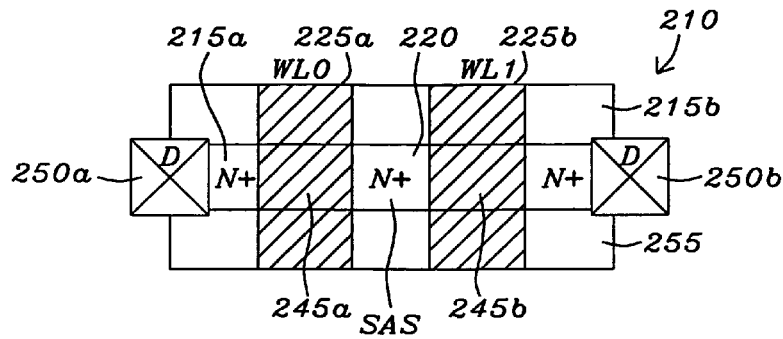
FIG. 3a — Prior Art
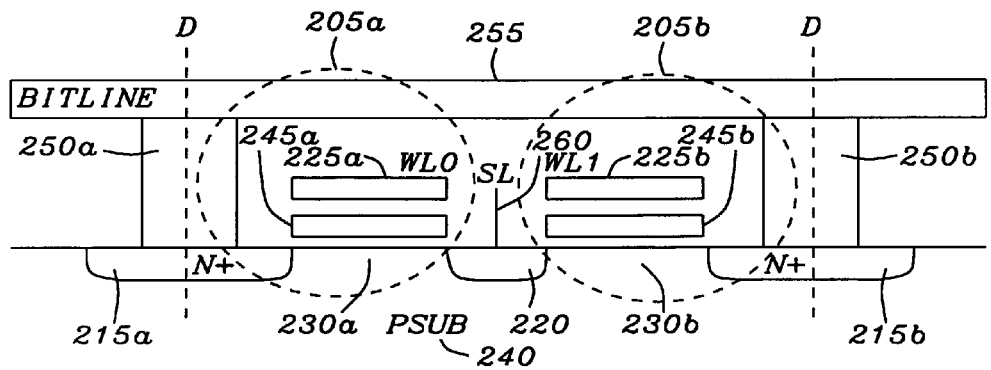
FIG. 3b — Prior Art
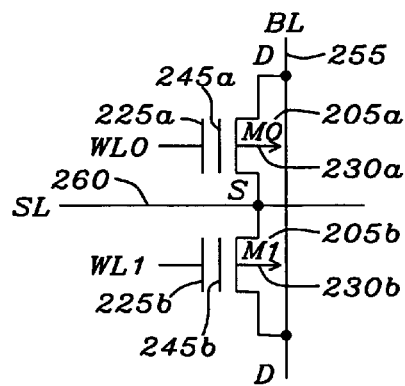
FIG. 3c — Prior Art

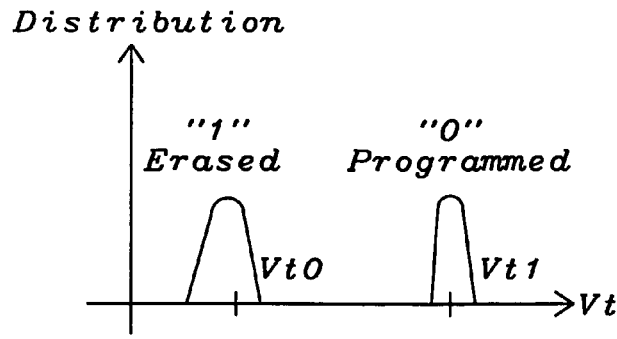
FIG. 3d – Prior Art
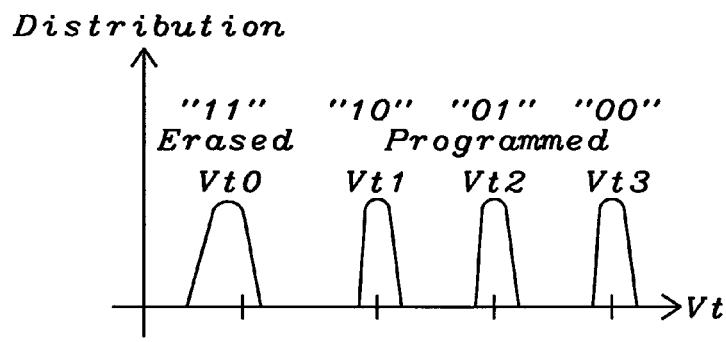
FIG. 3e – Prior Art
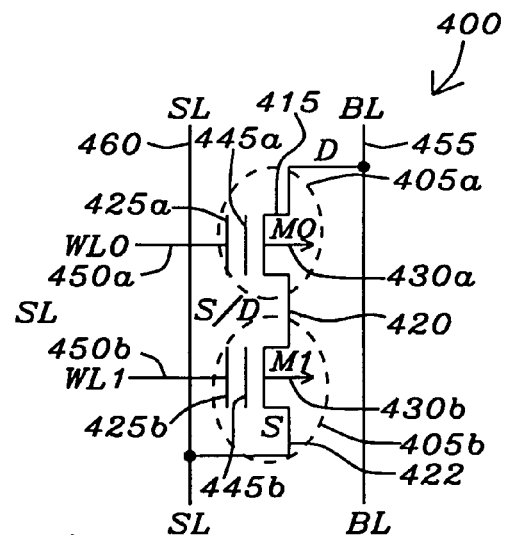
FIG. 4a

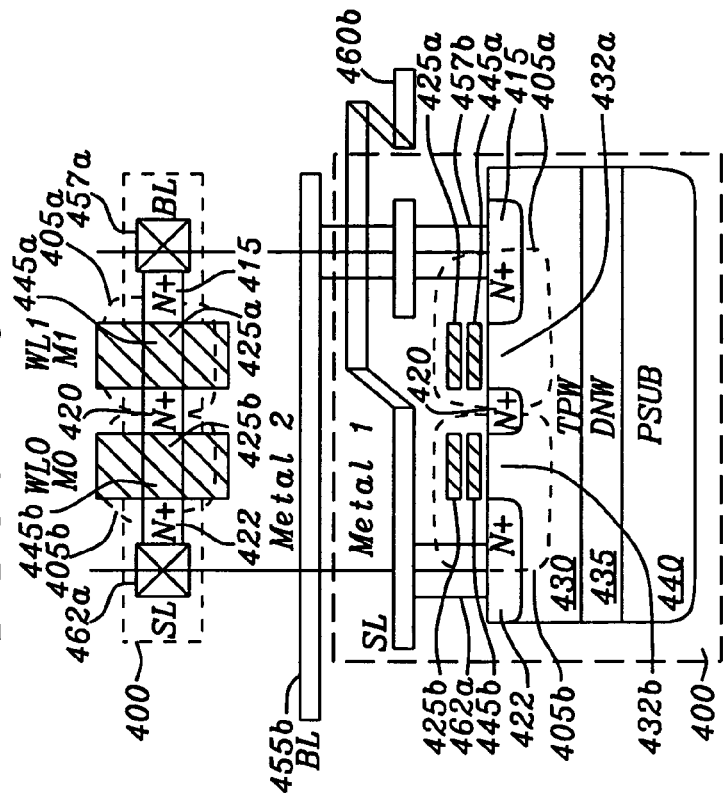
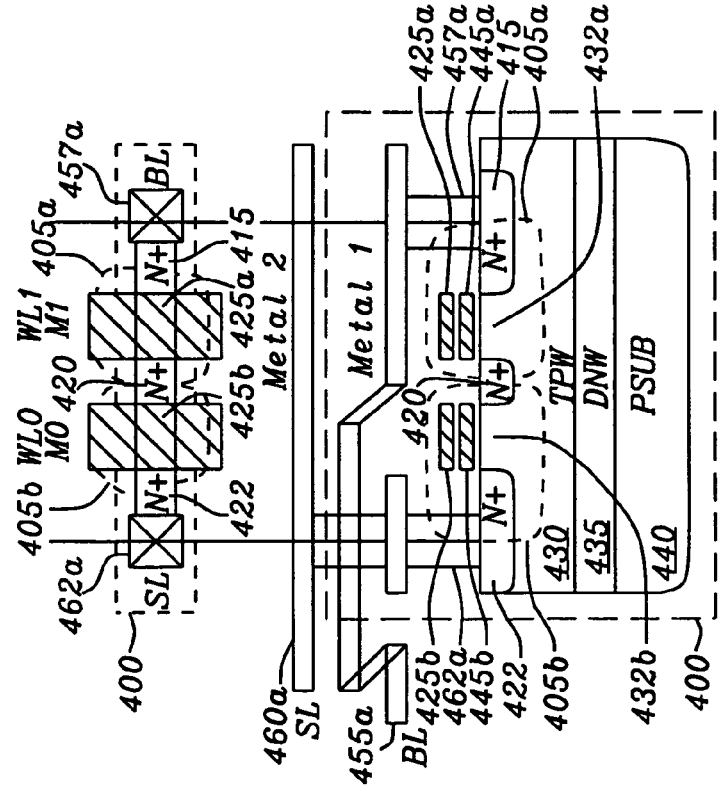

| 2b2T Cell | | WL0 (450a) | WL1 (450b) | D (415) | S (422) |
|---|---|---|---|---|---|
| Read M0 | Vt0 | VDD | VH | VDD | VS0 |
| | Vt1 | VDD | VH | VDD | VS1 |
| Read M1 | Vt0 | VH | VDD | VDD | VS0 |
| | Vt1 | VH | VDD | VDD | VS1 |

LEGEND
TPW=0V
DNW=VDD
Vt0= −0.75V ~ −0.25V
Vt1 > 3.0V
VDD=1.8V/3.0V
VH > 6.0V
VS0= ~ VDD
VS1=0V

| 2b2T Cell | | WL0 | WL1 | D | S |
|---|---|---|---|---|---|
| Read M0 | Vt0 | $V_{H0}$ | $V_{H1}$ | $V_{HD}$ | VS0 |
| | Vt1 | $V_{H0}$ | $V_{H1}$ | $V_{HD}$ | VS1 |
| | Vt2 | $V_{H0}$ | $V_{H1}$ | $V_{HD}$ | VS2 |
| | Vt3 | $V_{H0}$ | $V_{H1}$ | $V_{HD}$ | VS3 |
| Read M1 | Vt0 | $V_{H1}$ | $V_{H0}$ | $V_{HD}$ | VS0 |
| | Vt1 | $V_{H1}$ | $V_{H0}$ | $V_{HD}$ | VS1 |
| | Vt2 | $V_{H1}$ | $V_{H0}$ | $V_{HD}$ | VS2 |
| | Vt3 | $V_{H1}$ | $V_{H0}$ | $V_{HD}$ | VS3 |

| LEGEND | |
|---|---|
| TPW=0V<br>DNW=VDD<br>Vt0= −0.75V − −0.25V<br>Vt1=1V<br>Vt2=2V<br>Vt3=3V<br>VDD=1.8V/3.0V | $V_{H0}$ ~ 4.0V<br>$V_{H1}$ > 7.0V<br>$V_{HD}$ > 4.0V<br>VS0= ~4.0V<br>VS1= ~3V<br>VS2= ~2V<br>VS1= 0V |

| 2b2T Cell | | WL0 | WL1 | D | S | TPW | DNW |
|---|---|---|---|---|---|---|---|
| Erase | M0 | -10.0V | 10.0V | 10.0V | 10.0V | 10.0V | 10.0V |
| | M1 | 10.0V | -10.0V | 10.0V | 10.0V | 10.0V | 10.0V |
| | UNSEL | 10.0V | 10.0V | 10.0V | 10.0V | 10.0V | 10.0V |
| | | 0.0V | 0.0V | 0.0V | 0.0V | 0.0V | Vdd |

*FIG. 12a*

| 2b2T Cell | | WL0 | WL1 | D | S | TPW | DNW |
|---|---|---|---|---|---|---|---|
| Erase | M0 | -15.0V | 5.0V | 5.0V | 5.0V | 5.0V | 5.0V |
| | M1 | 5.0V | -15.0V | 5.0V | 5.0V | 5.0V | 5.0V |
| | UNSEL | 5.0V | 5.0V | 5.0V | 5.0V | 5.0V | 5.0V |
| | | 0.0V | 0.0V | 0.0V | 0.0V | 0.0V | Vdd |

*FIG. 12b*

| 2b2T Cell | | WL0 | WL1 | D | S | TPW | DNW |
|---|---|---|---|---|---|---|---|
| Erase | M0 | -20.0V | 0.0V | 0.0V | 0.0V | 0.0V | Vdd |
| | M1 | 0.0V | -20.0V | 0.0V | 0.0V | 0.0V | Vdd |
| | UNSEL | 0.0V | 0.0V | 0.0V | 0.0V | 0.0V | Vdd |

*FIG. 12c*

| 2b2T Cell | | WL0 | WL1 | D | S | TPW | DNW |
|---|---|---|---|---|---|---|---|
| Erase | M0 | 0.0V | 0.0V | +20.0V | +20.0V | +20.0V | +20.0V |
| | M1 | 0.0V | 0.0V | +20.0V | +20.0V | +20.0V | +20.0V |
| | UNSEL | 0.0V | 0.0V | 0.0V | 0.0V | 0.0V | +20.0V |
| | | 0.0V | 0.0V | 0.0V | 0.0V | 0.0V | 0.0V |

*FIG. 12d*

| 2b2T Cell | | WL0 | WL1 | D | S | TPW | DNW |
|---|---|---|---|---|---|---|---|
| Erase | M0 | +20.0V | 0.0V | 0.0V | 0.0V | 0.0V | Vdd |
| | M1 | 0.0V | +20.0V | 0.0V | 0.0V | 0.0V | Vdd |
| | UNSEL | 0.0V | 0.0V | 0.0V | 0.0V | 0.0V | Vdd |

FIG. 12e

| 2b2T Cell | | WL0 | WL1 | D | S | TPW | DNW |
|---|---|---|---|---|---|---|---|
| PGM | PGM M0 | +15-20V | +5.0V | 0.0V | 0.0V | 0.0V | Vdd |
| | PGM M1 | +5.0V | +15-20V | 0.0V | 0.0V | 0.0V | Vdd |
| | UNSEL | +15-20V | +5.0V | 7.0V-10.0V | 7.0V-10.0V | 0.0V | Vdd |
| | | <+5.0V | +15-20V | 7.0V-10.0V | 7.0V-10.0V | 0.0V | Vdd |
| | | <+5.0V | <+5.0V | 7.0V-10.0V | 7.0V-10.0V | 0.0V | Vdd |
| | | <+5.0V | <+5.0V | 0.0V | 0.0V | 0.0V | Vdd |
| | | <+5.0V | <+5.0V | 0.0V | 0.0V | 0.0V | Vdd |

FIG. 13a

| 2b2T Cell | | WL0 | WL1 | D | S | TPW | DNW |
|---|---|---|---|---|---|---|---|
| PGM | PGM M0 | -10.0V | 2.5V | 5.0V | FLTING | 0.0V | Vdd |
| | PGM M1 | 2.5V | -10.0V | 5.0V | FLTING | 0.0V | Vdd |
| | UNSEL | -10.0V | 2.5V | 0.0V | FLTING | 0.0V | Vdd |
| | | 2.5V | -10.0V | 0.0V | FLTING | 0.0V | Vdd |
| | | 2.5V | 2.5V | 0.0V | FLTING | 0.0V | Vdd |
| | | 2.5V | 2.5V | 0.0V | FLTING | 0.0V | Vdd |
| | | 0.0V | 0.0V | 0.0V | FLTING | 0.0V | Vdd |

FIG. 13b

| PLD Cell | | P[N] | SG | D | S | TPW | DNW |
|---|---|---|---|---|---|---|---|
| Program | PGM M0/M2 to Vt1 | 10V | 15-20V | 0V | 0V | 0V | Vdd |
| | PGM M1/M3 to Vt2 | 15-20V | 10V | 0V | 0V | 0V | Vdd |
| | Unselect | 15-20V | 10V | 10V | 10V | 0V | Vdd |
| | | 10V | 15-20V | 10V | 10V | 0V | Vdd |
| | | 10V | 10V | 10V | 10V | 0V | Vdd |
| | | 10V | 10V | 0V | 0V | 0V | Vdd |
| | | 0V | 0V | 0V | 0V | 0V | Vdd |

FIG. 17a

| PLD Cell | | P[N] | SG | D | S | TPW | DNW |
|---|---|---|---|---|---|---|---|
| Erase | ERS M0/M2 | 10V | -10V | 10V | 10V | 10V | 10V |
| | ERS M1/M3 | -10V | 10V | 10V | 10V | 10V | 10V |
| | Unselect | 10V | 10V | 10V | 10V | 10V | 10V |
| | | 0V | 0V | 0V | 0V | 0V | Vdd |

FIG. 17b

| PLD Cell | | P[N] | SG | D | S | TPW | DNW |
|---|---|---|---|---|---|---|---|
| Erase | ERS M0/M2 | 5V | -15V | 5V | 5V | 5V | 5V |
| | ERS M1/M3 | -15V | 5V | 5V | 5V | 5V | 5V |
| | Unselect | 5V | 5V | 5V | 5V | 5V | 5V |
| | | 0V | 0V | 0V | 0V | 0V | Vdd |

FIG. 17c

| PLD Cell | | P[N] | SC | D | S | TPW | DNW |
|---|---|---|---|---|---|---|---|
| Erase | ERS M0/M2 | 0V | -20V | 0V | 0V | 0V | Vdd |
| | ERS M1/M3 | -20V | 0V | 0V | 0V | 0V | Vdd |
| | Unselect | 0V | 0V | 0V | 0V | 0V | Vdd |

FIG. 17d

| PLD Cell | P[N] | SC | D | S | TPW | DNW | Vt0 | Vt1 | Vt2 |
|---|---|---|---|---|---|---|---|---|---|
| Read Vt0 cell | 1.8V | 1.8V | Vdd | Vs0* | 0V | Vdd | <-2V | 0V | >2V |
| Read Vt2 cell | 1.8V | 1.8V | Vdd | Vs1** | 0V | Vdd | <-2V | 0V | >2V |

| Mode | | D0 | D1 | D2 | D3 | WL0 | WL1 | TPW | SC |
|---|---|---|---|---|---|---|---|---|---|
| Erase M0, M1 M4 & M5 | Option 1 | 0V | 0V | 0V | 0V | -20V | -20V | 0V | 0V |
| | Option 1 | 5V | 5V | 5V | 5V | -15V | -15V | 5V | 0V |
| | Option 1 | 10V | 10V | 10V | 10V | -10V | -10V | 10V | 0V |
| | Option 1 | 5V | 5V | 5V | 5V | -10V | -10V | 0V | 0V |
| PGM M0 | PGM Inhibit M1, M4 & M5 | 0V | 0V | 10V | 10V | 15-20V | 5V | 0V | 0V |
| PGM M1 | PGM Inhibit M0, M4 & M5 | 0V | 0V | 10V | 10V | 5V | 15-20V | 0V | 0V |
| PGM M4 | PGM Inhibit M0, M1 & M5 | 10V | 10V | 0V | 0V | 15-20V | 5V | 0V | 0V |
| PGM M5 | PGM Inhibit M0, M1 & M4 | 10V | 10V | 0V | 0V | 5V | 15-20V | 0V | 0V |
| Operate | | 0V | Vdd+Vt | 0V | Vdd+Vt | Vdd | Vdd | 0V | >Vdd+2Vt |

FIG. 20b

| Switch M3 | Switch M7 | M0 | M1 | M4 | M5 |
|---|---|---|---|---|---|
| on | on | programmed* | erased** | programmed* | erased** |
| off | on | erased** | programmed* | programmed* | erased** |
| on | off | programmed* | erased** | erased** | programmed* |
| off | off | erased** | programmed* | erased** | programmed* | programmed*: Vt1 > Vdd
erased**: Vt0 < -2V

| Mode | | D0 | D1 | D2 | D3 | WL0 | WL1 | TPW | NW | SC |
|---|---|---|---|---|---|---|---|---|---|---|
| Erase | Option 1 | 0V | 0V | 0V | 0V | -20V | -20V | 0V | Vdd | Vdd |
| | Option 1 | 5V | 5V | 5V | 5V | -15V | -15V | 5V | 5V | 5V |
| | Option 1 | 10V | 10V | 10V | 10V | -10V | -10V | 10V | 10V | 10V |
| | Option 1 | 5V | 5V | 5V | 5V | -10V | -10V | 0V | Vdd | Vdd |
| PGM M0 | PGM Inhibit M1, M4 & M5 | 0V | 0V | 0V | 0V | 15-20V | 5V | 0V | 10V | 10V |
| P1M M1 | PGM Inhibit M0, M4 & M5 | 0V | 10V | 10V | 10V | 5V | 15-20V | 0V | 10V | 10V |
| P4M M4 | PGM Inhibit M0, M1 & M5 | 10V | 0V | 0V | 0V | 15-20V | 5V | 0V | 10V | 10V |
| P5M M5 | PGM Inhibit M0, M1 & M4 | 10V | Vdd | Vdd | Vdd | Vdd | Vdd | 0V | 10V | 10V |
| Operate | | -Vt | -Vt | 0V | 0V | | | 0V | Vdd | -2Vt |

FIG. 22a

| Switch M3 | Switch M7 | M0 | M1 | M4 | M5 |
|---|---|---|---|---|---|
| on | on | erased** | programmed* | erased** | programmed* |
| off | on | programmed* | erased** | erased** | programmed* |
| on | off | erased** | programmed* | programmed* | erased** |
| off | off | programmed* | erased** | programmed* | erased** | programmed*: Vt1 > Vdd
erased**: Vt0 < -2V

FIG. 22b

NAND BASED NMOS NOR FLASH MEMORY CELL, A NAND BASED NMOS NOR FLASH MEMORY ARRAY, AND A METHOD OF FORMING A NAND BASED NMOS NOR FLASH MEMORY ARRAY

This application claims benefit under 35 U.S.C. §120 and 37 CFR §1.78 as a continuation of application Ser. No. 12/387,771, filed on May 7, 2009, now U.S. Pat. No. 8,072,811, issued Dec. 6, 2011, which in turn claims benefit under 35 U.S.C. §119 to U.S. Provisional Patent Application Ser. No. 61/126,854, filed on May 7, 2008, U.S. Provisional Patent Application Ser. No. 61/130,381, filed on May 30, 2008, U.S. Provisional Patent Application Ser. No. 61/131,554, filed on Jun. 9, 2008, U.S. Provisional Patent Application Ser. No. 61/132,122, filed on Jun. 16, 2008, U.S. Provisional Patent Application Ser. No. 61/132,628, filed on Jun. 20, 2008, all assigned to the same assignee as the present invention, and incorporated herein by reference in its entirety.

RELATED PATENT APPLICATIONS

U.S. patent application Ser. No. 12/455,337, filed on Jun. 1, 2009 now U.S. Pat. No. 8,120,959, issued Feb. 1, 2012.

U.S. patent application Ser. No. 12/455,936, filed on Jun. 9, 2009 now U.S. Pat. No. 8,120,959, issued Feb. 1, 2012.

U.S. patent application Ser. No. 12/456,354, filed on Jun. 16, 2009.

U.S. patent application Ser. No. 12/456,744, filed on Jun. 22, 2009.

BACKGROUND OF THE INVENTION

Field of the Invention

This invention relates generally to reconfigurable logic circuits and devices incorporating nonvolatile memory structures. More particularly, this invention relates to a NAND-like NOR flash nonvolatile memory circuits as incorporated in reconfigurable logic circuits and devices.

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost and can be repeatedly programmed and erased with a single low-voltage power supply voltage source.

The Flash Memory structures known in the art employ a charge retaining mechanism such as a charge storage and a charge trapping. The charge storage mechanism, as with a floating gate nonvolatile memory, the charge representing digital data is stored on a floating gate of the device. The stored charge modifies the threshold voltage of the floating gate memory cell determine that digital data stored. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$).

A present day flash nonvolatile memory is divided into two major product categories such as the fast random-access, asynchronous NOR flash nonvolatile memory and the slower serial-access, synchronous NAND flash nonvolatile memory. NOR flash nonvolatile memory as presently designed is the high pin-count memory with multiple external address and data pins along with appropriate control signal pins. One disadvantage of NOR flash nonvolatile memory is as the density is doubled, the number of its required external pin count increases by one due to the adding of one more external address pin. In contrast, NAND flash nonvolatile memory has an advantage of having a smaller pin-count than NOR with no address input pins. As density increases, the NAND flash nonvolatile memory pin count is always kept constant. Both main-streamed NAND and NOR flash nonvolatile memory cell structures in production today use a one charge retaining (charge storage or charge trapping) transistor memory cell that stores one bit of data as charge or as it commonly referred to as a single-level program cell (SLC). They are respectively referred as one-bit/one transistor NAND cell or NOR cell, storing a single-level programmed data in the cell.

The NAND and NOR flash nonvolatile memory provide the advantage of in-system program and erase capabilities and have a specification for providing at least 100K endurance cycles. In addition, both single-chip NAND and NOR flash nonvolatile memory product can provide gigabyte density because their highly-scalable cell sizes. For instance, presently a one-bit/one transistor NAND cell size is kept at $\sim 4\lambda^2$ ($\lambda$ being a minimum feature size in a semiconductor process), while NOR cell size is $\sim 10\lambda^2$. Furthermore, in addition to storing data as a single-level program cell having two voltage thresholds ($Vt0$ and $Vt1$), both one transistor NAND and NOR flash nonvolatile memory cells are able to store at least two bits per cell or two bits/one transistor with four multi-level threshold voltages ($Vt0$, $Vt1$, $Vt2$ and $Vt03$) in one physical cell.

Currently, the highest-density of a single-chip double polycrystalline silicon gate NAND flash nonvolatile memory chip is 63 Gb. In contrast, a double polycrystalline silicon gate NOR flash nonvolatile memory chip has a density of 2 Gb. The big gap between NAND and NOR flash nonvolatile memory density is a result of the superior scalability of NAND flash nonvolatile memory cell over a NOR flash nonvolatile memory. A NOR flash nonvolatile memory cell requires 5.0V drain-to-source (Vds) to maintain a high-current Channel-Hot-Electron (CHE) programming process. Alternately, a NAND flash nonvolatile memory cell requires 0.0V between the drain to source for a low-current Fowler-Nordheim channel tunneling program process. The above results in the one-bit/one transistor NAND flash nonvolatile memory cell size being only one half that of a one-bit/one transistor NOR flash nonvolatile memory cell. This permits a NAND flash nonvolatile memory device to be used in applications that require huge data storage. A NOR flash nonvolatile memory device is extensively used as a program-code storage memory which requires less data storage and requires fast and asynchronous random access.

A two-transistor NOR flash nonvolatile memory cell is formed of two NMOS transistors that is structured as a single-level program cell. The top transistor of the two-transistor NOR cell is a floating-gate transistor and the bottom transistor is a regular NMOS select transistor. Only the top 1T NAND cell has the capability to store data. With only one transistor of the two-transistor NOR flash nonvolatile memory cell retaining data, the overhead of this NOR flash nonvolatile memory cell is one select transistor per NAND cell.

U.S. Pat. No. 7,263,003 (Edahiro, et al.) describes a two-transistor flash memory device using a replica cell array to control the precharge/discharge and sense amplifier circuits of the primary cell array.

U.S. Pat. No. 5,596,523 (Endoh, et al.) provides a NOR cell type EEPROM memory cell array section. Every two neighboring NOR cells are connected to a corresponding bit line at which the drain of one memory cell transistor and the source of the other cell transistor are connected together. The other source and drain of those cell transistors are coupled together to a source line. The Source line is provided with a select transistor.

U.S. Pat. No. 6,765,825 (Scott) describes a differential NOR memory cell having two floating gate transistors. Each of the drain terminals of the transistors is coupled to a corresponding differential bit line. The source terminals of both transistors are coupled to a common current source or sink. Each of the control gate terminals are coupled to a corresponding word line, which may be the same as or different than the corresponding word line that the other control terminal is connected to. The floating gate transistor may be five-terminal devices that include an additional well terminal. In that case, a different set of bit lines is used to program the EEPROM memory cell as are used to read the EEPROM memory cell. While the drain terminals are coupled to the differential read bit lines, each of the well terminals is coupled to a corresponding differential program bit line.

U.S. Patent Application 2006/0181925 (Specht, et al.) a nonvolatile memory cell arrangement where memory transistors are arranged in rows and columns. The source/drain terminals of the memory transistors of the first column are coupled to conductor tracks of a different metallization plane than the first source/drain terminals of the memory transistors of the second column. In this way, it is now possible to arrange the memory transistors of adjacent columns in a memory arrangement closer to one another.

SUMMARY OF THE INVENTION

An object of this invention is to provide a NOR flash nonvolatile memory device that provides the memory cells size and a low current program process of a NAND flash nonvolatile memory device and the fast, asynchronous random access of a NOR flash nonvolatile memory device.

To accomplish at least this object, one embodiment of a NOR flash nonvolatile memory circuit includes a plurality of charge retaining transistors serially connected in a NAND string. A drain of a topmost charge storage transistor is connected to a bit line associated with the plurality of serially connected charge retaining transistors and a source of a bottommost charge storage transistor is connected to a source line associated with the plurality of charge retaining transistors. Each control gate of the plurality of charge retaining transistors on each row is commonly connected to a word line. The plurality of serially charge retaining transistors is formed within a well of a first conductivity type (a triple P-type well). The well of the first conductivity type is formed within a deep well of a second conductivity type (Deep N-type well). The deep well of the second conductivity type is form in a substrate of the first conductivity type (a P-type substrate).

The plurality of charge retaining transistors are programmed and erased with a Fowler-Nordheim tunneling process. To program a selected charge storage transistor of the plurality of charge retaining transistors as single-level program cell, a very high voltage level of from approximately +15.0V to approximately +20.0V is applied in incrementally increasing steps between the control gate of the selected charge storage transistor and a bulk region of the charge storage transistor. Those of the plurality of charge retaining transistors that are not selected are inhibited by an intermediate voltage level of less than +10.0V is applied between the control gate of the non-selected charge storage transistor and a bulk region of the charge storage transistor. The layout of the NOR flash memory circuit is such that the size of the NOR flash memory circuit is approximately four times the minimum feature size of the process technology for fabricating the NOR flash memory circuit.

To erase the selected charge storage transistor a very high positive voltage level of from approximately +15.0V to approximately +20.0V is applied between the bulk region of the selected charge storage transistor and control gate of the charge storage transistor. Those of the plurality of charge retaining transistors that are not selected are inhibited by biasing the non-selected charge retaining transistors such that there is a approximately a 0.0V voltage level between the control gate and the bulk region of the non-selected storage transistors.

To read a selected charge storage transistor of the plurality of charge retaining transistors programmed as a single-level program cell, the source line is connected to a voltage follower sensing circuit. The gate and drain of the selected charge storage transistor is set to a voltage level of a power supply voltage source (VDD) that is approximately 1.8V or alternately approximately 3.0V. The gates of all non-selected charge retaining transistors within the plurality of charge retaining transistors is set to a first very high read voltage of greater than 6.0V. If the NOR flash memory circuit is not selected for reading, the control gates of the non-selected charge retaining transistors of the plurality of charge retaining transistors is set to the ground reference voltage to turn off the charge retaining transistors. The voltage follower sensing circuit is a comparator having a reference terminal connected to a reference voltage source. The reference voltage source is set to a voltage level of approximately 2.0V to distinguish between the threshold voltage level for a first logic level (0) and the threshold voltage levels of a second logic level (1).

To read a selected charge storage transistor of the plurality of charge retaining transistors programmed as a multi-level program cell, the source line is connected to a voltage follower sensing circuit. The gate and drain of the selected charge storage transistor is set to a moderately high voltage level that is approximately 4.0V. The gate of all non-selected charge retaining transistors within the plurality of charge retaining transistors is set to a second very high read voltage of greater than 7.0V. The voltage follower sensing circuit has a number of comparators equal to one less than the number of threshold voltage representing data stored within the charge storage transistor. Each of the comparators has a reference terminal connected to one of a group of reference voltage sources. The reference voltage sources is set to a voltage level between each of the voltage threshold to distinguish between the threshold voltage levels for each datum stored in the charge storage transistor.

In another embodiment, a NOR flash nonvolatile memory device includes an array of a plurality of NOR flash nonvolatile memory circuits arranged such that the charge retaining transistors of the NOR flash memory circuits are configured in rows and columns. Each NOR flash memory circuit includes a plurality of charge retaining transistors on a column connected serially in a NAND string. A drain of a topmost charge storage transistor of each NOR flash memory circuit is connected to a local bit line associated with the column on which each NOR flash memory circuit resides. A source of a bottommost charge storage transistor of each of the NOR flash memory circuits is connected to a local source line associated with the on which each NOR flash memory circuit. Each control gate of the charge retaining transistors on each row is commonly connected to a word line.

The NOR flash nonvolatile memory device includes a column voltage control circuit. The column voltage control circuit is connected to provide control signals to local bit lines and the source lines associated with each of the columns of charge retaining transistors. Each of the local bit lines is connected to one of a plurality of global bit lines through a bit line select transistor and each of the local source lines is connected to one of a plurality of global source lines through a source line select transistor. The global bit lines and the global source lines are connected to the column voltage control circuit to transfer the control signals to selected local bit lines and selected local source lines for reading, programming, and erasing selected charge retaining transistors within the NOR flash nonvolatile memory circuits.

The NOR flash nonvolatile memory device includes a row voltage control circuit. The row voltage control circuit is connected to provide control signals to word lines associated with each of the rows of charge retaining transistors and the gates of the local bit line select transistors and the source line select transistors connected to each of the local bit lines. The row control circuit transfers the control signals to word lines for reading, programming, and erasing selected charge retaining transistors within the NOR flash nonvolatile memory circuits. The row voltage control circuit also transfers the select control signals to the selected bit line select transistors and the selected source line transistors to transfer the bit line and source line control signals from the column voltage control circuit to the selected local bit lines and selected local source lines.

The plurality of charge retaining transistors are programmed and erased with a Fowler-Nordheim tunneling process. To program selected charge retaining transistors of the plurality of charge retaining transistors as single-level program cell, the row voltage control circuit provides a very high program voltage level of from approximately +15.0V to approximately +20.0V to the word lines to be applied between the control gate of the selected charge storage transistor and a bulk region of the charge storage transistor. The row voltage control circuit provides an intermediate voltage level of less than +10.0V to be applied between the control gate of the non-selected charge storage transistor and a bulk region of the charge storage transistor to inhibit those of the plurality of charge retaining transistors that are not selected. The layout of the NOR flash memory circuit is such that the size of each of the NOR flash memory circuits is approximately four times the minimum feature size of the process technology for fabricating the NOR flash memory circuit.

To program a selected charge retaining transistor of the plurality of charge retaining transistors as a multi-level program cell, the row voltage control circuit applies a very high program voltage level to the word line of the selected charge retaining transistors incrementally increasing from approximately +15.0V to approximately +20.0V between the control gate of the selected charge retaining transistors and a bulk region of the charge retaining transistors. The selected charge retaining transistors are read to verify the data between each incremental application of the very high voltage level until the correct voltage threshold is achieved. Those of the plurality of charge retaining transistors that are not selected are inhibited by an intermediate high voltage level of less than +10.0V is applied between the control gate of the non-selected charge storage transistor and a bulk region of the charge storage transistor.

To erase selected charge retaining transistors, the row voltage control circuit applies a very high positive erase voltage level of from approximately +15.0V to approximately +20.0V between the bulk region of the selected charge storage transistor and a control gate of the selected charge storage transistor. Those of the plurality of charge retaining transistors that are not selected are inhibited by the row voltage control circuit applying biasing voltage level to the non-selected charge retaining transistors such that there is a approximately a 0.0V voltage level between the control gate and the bulk region of the non-selected storage transistors.

To read selected charge retaining transistors of the plurality of charge retaining transistors of a selected NOR flash memory circuit programmed as a single-level program cell, the source line is connected to a voltage follower sensing circuit within the column voltage control circuit. The row voltage control circuit sets the word line of the selected charge retaining transistors and thus the control gate to the power supply voltage source (VDD) that is approximately 1.8V or alternately approximately 3.0V. The row voltage control activates the local bit line select transistor to connect the global bit line and the local bit line associated with the selected charge retaining transistors. The column voltage control circuit then sets the global bit line and thus the local bit connected to the drain of the selected charge storage transistor to a voltage level of a power supply voltage source (VDD) that is approximately 1.8V or alternately approximately 3.0V. The row voltage control circuit sets the word line and the control gate of all non-selected charge retaining transistors within the plurality of charge retaining transistors of the selected NOR flash memory circuit is set to a first very high read voltage of greater than 6.0V. The voltage follower sensing circuit is a comparator within the column voltage control circuit having a reference terminal connected to a reference voltage source. The reference voltage source is set to a voltage level of approximately 2.0V to distinguish between the threshold voltage level for a first logic level (0) and the threshold voltage levels of a second logic level (1). The row voltage control circuit sets the word lines and thus the control gates of the non-selected charge retaining transistors of the plurality of charge retaining transistors of non-selected NOR flash memory circuit to the ground reference voltage to turn off the charge retaining transistors.

To read a selected charge storage transistor of the plurality of charge retaining transistors programmed as a multi-level program cell, the source line is connected to a voltage follower sensing circuit. The gate and drain of the selected charge storage transistor is set to a moderately high voltage level that is approximately 4.0V. The gate of all non-selected charge retaining transistors within the plurality of charge retaining transistors is set to a second very high read voltage of greater than 7.0V. The voltage follower sensing circuit has a number of comparators equal to one less than the number of threshold voltage representing data stored within the charge storage transistor. Each of the comparators has a reference terminal connected to one of a group of reference voltage sources. The reference voltage sources are set to a voltage level between each of the voltage threshold to distinguish between the threshold voltage levels for each datum stored in the charge storage transistor.

Further, in another embodiment, a method for forming a NOR flash nonvolatile memory device begins by providing a substrate onto which an array of a plurality of NOR flash nonvolatile memory circuits arranged such that the charge retaining transistors of the NOR flash memory circuits are configured in rows and columns. Each NOR flash memory circuit is formed by connecting a plurality of charge retaining transistors on a column serially in a NAND string. A drain of a topmost charge storage transistor of each NOR flash memory circuit is connected to a local bit line associated with the column on which each NOR flash memory circuit resides. A source of a bottommost charge storage transistor of each of the NOR flash memory circuits is connected to a local source line associated with the on which each NOR flash memory circuit. Each control gate of the charge retaining transistors on each row is commonly connected to a word line.

The method for forming a NOR flash nonvolatile memory device includes forming a column voltage control circuit. The column voltage control circuit is connected to provide control signals to local bit lines and the source lines associated with each of the columns of charge retaining transistors. Each of the local bit lines is connected to one of a plurality of global bit lines through a bit line select transistor and each of the local source lines is connected to one of a plurality of global source lines through a source line select transistor. The global bit lines and the global source lines are connected to the column voltage control circuit to transfer the control signals to selected local bit lines and selected local source lines for reading, programming, and erasing selected charge retaining transistors within the NOR flash nonvolatile memory circuits.

The method for forming a NOR flash nonvolatile memory device includes forming a row voltage control circuit. The row voltage control circuit is connected to provide control signals to word lines associated with each of the rows of charge retaining transistors and the gates of the local bit line select transistors and the source line select transistors connected to each of the local bit lines. The row control circuit transfers the control signals to word lines for reading, programming, and erasing selected charge retaining transistors within the NOR flash nonvolatile memory circuits. The row voltage control circuit also transfers the select control signals to the selected bit line select transistors and the selected source line transistors to transfer the bit line and source line control signals from the column voltage control circuit to the selected local bit lines and selected local source lines.

The plurality of charge retaining transistors are programmed and erased with a Fowler-Nordheim tunneling process. To program selected charge retaining transistors of the plurality of charge retaining transistors as single-level program cell, the row voltage control circuit provides a very high voltage level of from approximately 15.0V to approximately 20.0V to the word lines to be applied between the control gate of the selected charge storage transistor and a bulk region of the charge storage transistor. The row voltage control circuit provides an intermediate voltage level of less than 10.0V to be applied between the control gate of the non-selected charge storage transistor and a bulk region of the charge storage transistor to inhibit those of the plurality of charge retaining transistors that are not selected. The layout of the NOR flash memory circuit is such that the size of each of the NOR flash memory circuits is approximately four times the minimum feature size of the process technology for fabricating the NOR flash memory circuit.

To program a selected charge retaining transistor of the plurality of charge retaining transistors as a multi-level program cell, the row voltage control circuit applies a very high voltage level to the word line of the selected charge retaining transistors incrementally from approximately 15.0V to approximately 20.0V between the control gate of the selected charge retaining transistors and a bulk region of the charge retaining transistors. The selected charge retaining transistors are read to verify the data between each incremental application of the very high voltage level until the correct voltage threshold is achieved. Those of the plurality of charge retaining transistors that are not selected are inhibited by an intermediate high voltage level of less than 10.0V is applied between the control gate of the non-selected charge storage transistor and a bulk region of the charge storage transistor.

To erase selected charge retaining transistors, the row voltage control circuit applies a very high positive erase voltage level of from approximately +15.0V to approximately +20.0V between the of the bulk region selected charge storage transistor and a control gate of the selected charge storage transistor. Those of the plurality of charge retaining transistors that are not selected are inhibited by the row voltage control circuit applying biasing voltage level to the non-selected charge retaining transistors such that there is a approximately a 0.0V voltage level between the control gate and the bulk region of the non-selected storage transistors.

To read selected charge retaining transistors of the plurality of charge retaining transistors of one selected NOR flash memory circuit programmed as a single-level program cell, the source line is connected to a voltage follower sensing circuit within the column voltage control circuit. The row voltage control circuit sets the word line of the selected charge retaining transistors and thus the control gate to the power supply voltage source (VDD) that is approximately 1.8V or alternately approximately 3.0V. The row voltage control activates the local bit line select transistor to connect the global bit line and the local bit line associated with the selected charge retaining transistors. The column voltage control circuit then sets the global bit line and thus the local bit line connected to the drain of the selected charge storage transistor to a voltage level of a power supply voltage source (VDD) that is approximately 1.8V or alternately approximately 3.0V. The row voltage control circuit sets the word line and the control gate of all non-selected charge retaining transistors within the plurality of charge retaining transistors of the selected NOR flash memory circuit is set to a first very high read voltage of greater than 6.0V. The row voltage control circuit sets the word lines and thus the control gates of the non-selected charge retaining transistors of the plurality of charge retaining transistors of non-selected NOR flash memory circuit to the ground reference voltage to turn off the charge retaining transistors. The voltage follower sensing circuit is a comparator within the column voltage control circuit having a reference terminal connected to a reference voltage source. The reference voltage source is set to a voltage level of approximately 2.0V to distinguish between the threshold voltage level for a first logic level (0) and the threshold voltage levels of a second logic level (1).

To read a selected charge storage transistor of the plurality of charge retaining transistors programmed as a multi-level program cell, the source line is connected to a voltage follower sensing circuit. The gate and drain of the selected charge storage transistor is set to a moderately high voltage level that is approximately 4.0V. The gate of all non-selected charge retaining transistors within the plurality of charge retaining transistors is set to a second very high read voltage of greater than 7.0V. The voltage follower sensing circuit has a number of comparators equal to one less than the number of threshold voltage representing data stored within the charge storage transistor. Each of the comparators has a reference terminal connected to one of a group of reference voltage sources. The reference voltage sources are set to a voltage level between each of the voltage threshold voltage levels to distinguish between the threshold voltage levels for each datum stored in the charge storage transistor.

BRIEF DESCRIPTION OF THE DRAWINGS

FIG. 1a is a top plan layout view of a single transistor floating-gate NMOS NAND flash cell.

FIG. 1b is a cross sectional view of a single transistor floating-gate NMOS NAND flash cell.

FIG. 1c is a schematic diagram of single transistor floating-gate NMOS NAND flash cell.

FIG. 1d is a graph of two threshold voltage distributions of a single transistor floating-gate NMOS NAND flash cell having a negative erase level and a single positive program level.

FIG. 1e is a graph of four threshold voltage distributions of a single transistor floating-gate NMOS NAND flash cell having a negative erase level and three positive program levels.

FIG. 2a is a top plan layout view of a single transistor floating-gate NMOS NOR flash cell.

FIG. 2b is a cross sectional view of a single transistor floating-gate NMOS NOR flash cell.

FIG. 2c is a schematic diagram of single transistor floating-gate NMOS NOR flash cell.

FIG. 2d is a graph of two threshold voltage distributions of a single transistor floating-gate NMOS NOR flash cell having a positive erase level and a single positive program level.

FIG. 2e is a graph of four threshold voltage distributions of a single transistor floating-gate NMOS NOR flash cell having a positive erase level and three positive program levels.

FIG. 3a is a top plan layout view of a two transistor floating-gate NMOS NOR flash cell with the drain contacts connected of the prior art.

FIG. 3b is a cross sectional view of a two transistor floating-gate NMOS NOR flash cell of the prior art of FIG. 3a.

FIG. 3c is a schematic diagram of two transistor floating-gate NMOS NOR flash cell of the prior art of FIG. 3a.

FIG. 3d is a graph of two threshold voltage distributions of a two transistor floating-gate NMOS NOR flash cell of the prior art having a positive erase level and a single positive program level.

FIG. 3e is a graph of four threshold voltage distributions of a two transistor floating-gate NMOS NOR flash cell of the prior art having a positive erase level and three positive program levels.

FIG. 4a is schematic diagram of an embodiment of two transistor floating-gate NMOS NOR flash cell embodying the principles of the present invention.

FIGS. 4b-1. 4b-2, 4c-1 and 4c-2 are top plan views and cross sectional cross sectional views of an embodiment of two transistor floating-gate NMOS NOR flash cell embodying the principles of the present invention.

FIGS. 12a-12e are tables of the erase biasing voltages for erasing various embodiments of the two transistor floating-gate NMOS NOR flash cell of the present invention.

FIGS. 13a-13b are tables of the program biasing voltages for programming various embodiments of the two transistor floating-gate NMOS NOR flash cell of the present invention.

FIGS. 17a-17e are tables of the operating conditions for the embodiment of the reconfigurable logic cell of FIGS. 16a and 16b embodying the principles of the present invention.

FIGS. 20a and 20b are tables of the operating conditions for the embodiment of the reconfigurable logic cell of FIG. 19 embodying the principles of the present invention.

FIGS. 22a and 22b are tables of the operating conditions for the embodiment of the reconfigurable logic cell of FIG. 21 embodying the principles of the present invention.

DETAILED DESCRIPTION OF THE INVENTION

Figure 5A:
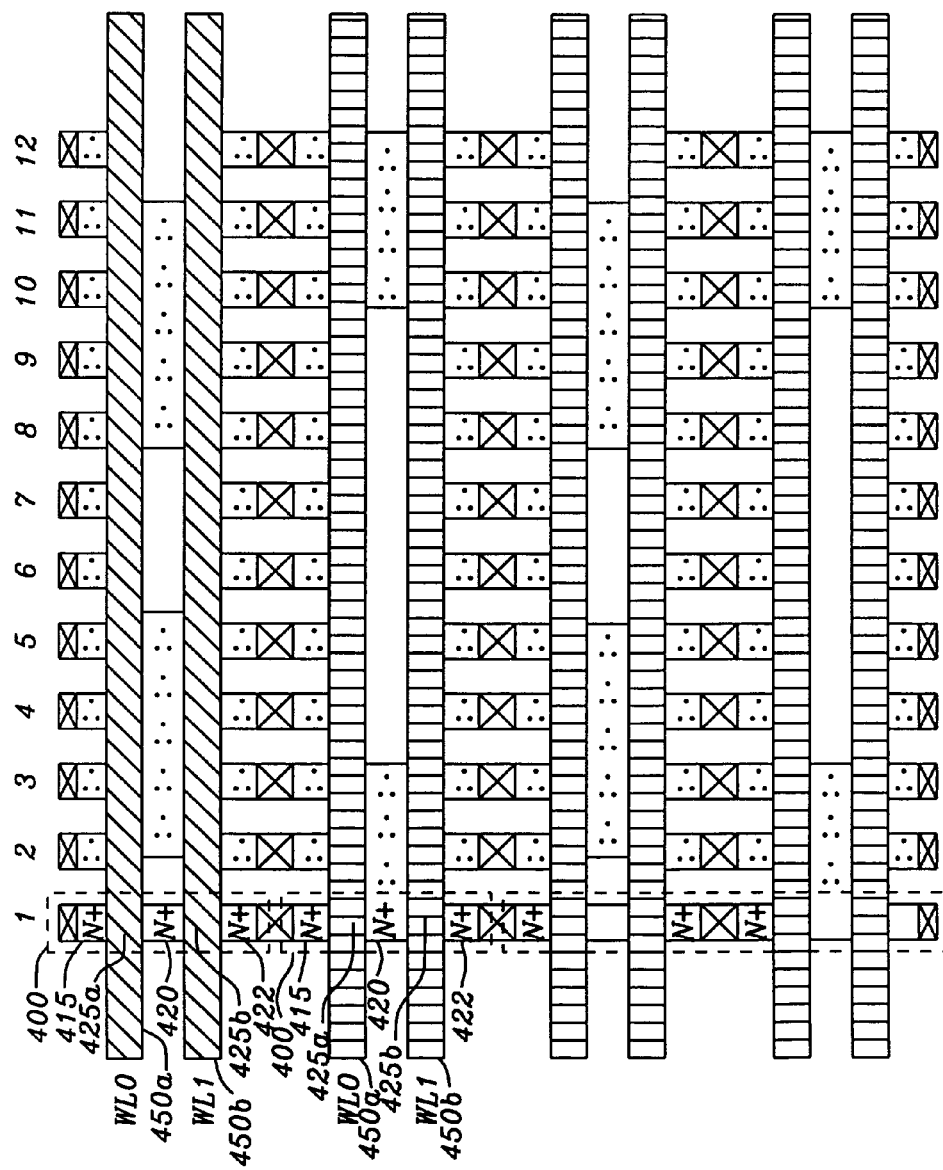
FIGS. 5a-5e are top plan layout views illustrating wiring interconnection of an embodiment of a section of an array of two transistor floating-gate NMOS NOR flash cells embodying the principles of the present invention.
Figure 5B:
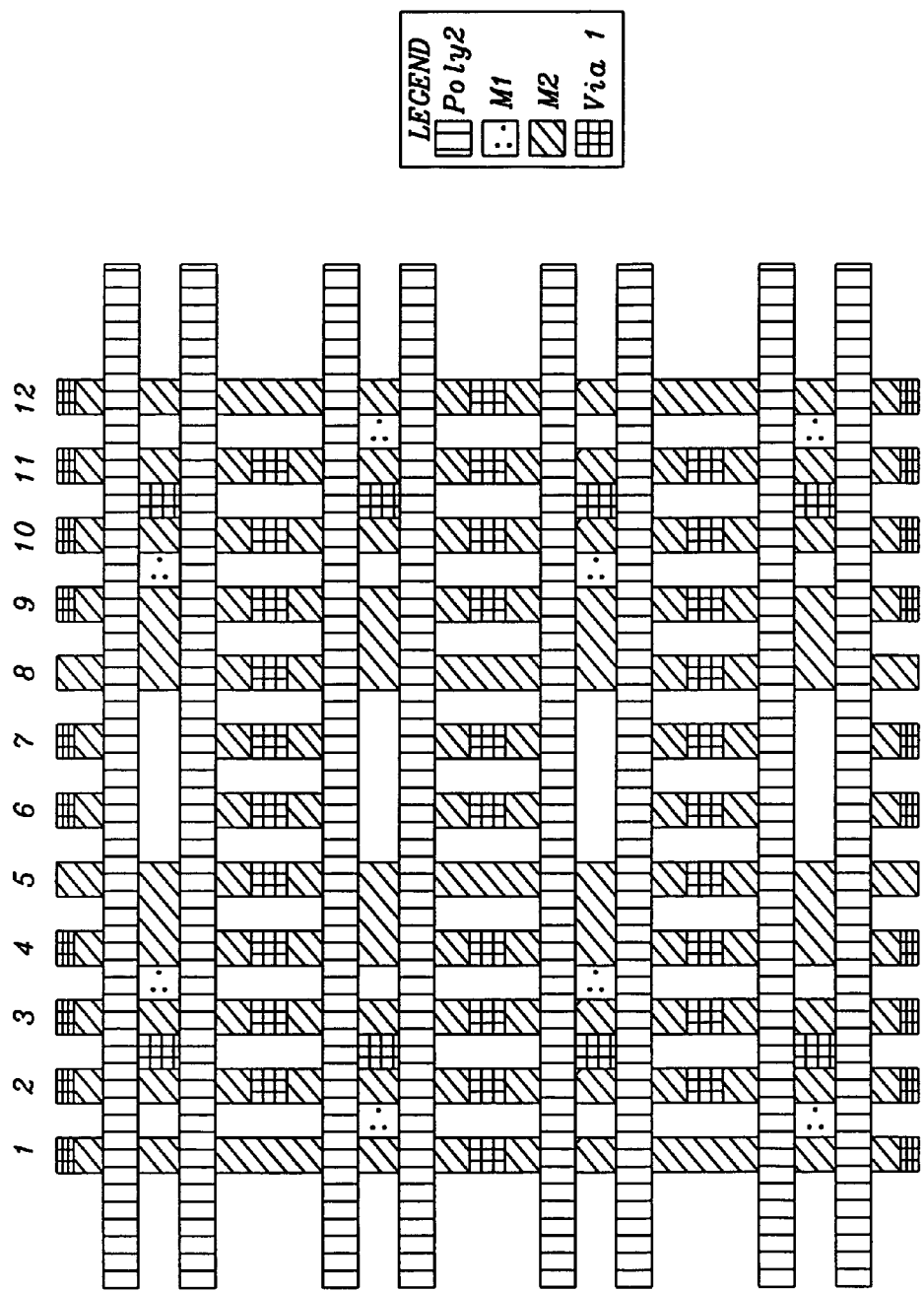

FIG. 1a is a top plan view of a NMOS NAND flash floating-gate transistor 10. FIG. 1b is a cross sectional view NMOS NAND flash floating-gate transistors 10. FIG. 1c is the schematic symbol NMOS NAND flash floating-gate transistors 10. In a common structure of a NAND cell string of the NMOS NAND flash floating-gate transistors 10, the NMOS NAND flash floating-gate transistors 10 do not require a contact at either the drain diffusion region 15 or source diffusion region 20 node. In conventional NAND cell strings have a top select transistor connected to the topmost transistor and a bottom select transistor connected to the bottommost transistor. The drain of the top select transistor and the source of the bottommost transistor have contacts for connected to bit lines and source lines. This structure for a conventional NAND string enables the size of the NMOS NAND flash floating-gate transistors 10 to be the smallest of the nonvolatile memory structures.

The floating-gate type NMOS NAND flash cell 10 is formed in the top surface of a P-type substrate 40. An N-type material is diffused into the surface of the P-type substrate 40 to form a deep N-well 35. A P-type material is then diffused into the surface of the deep N-well 35 to form a P-well 30 (commonly referred to as a triple P-well). The N-type material is then diffused into the surface of a P-type well 30 to form the drain (D) 15 and the source (S) 20. A first polycrystalline silicon layer is formed above the bulk region of the P-type well 30 between the drain region 15 and the source region 20 to form the floating gate 45. A second polycrystalline silicon layer is formed over the floating gate 45 to create a control gate (G) 25 of the NMOS NAND flash floating-gate transistors 10. The gate length of the NMOS NAND flash floating-gate transistors 10 is the channel region in the bulk region of P-type well 30 between drain region 15 and the source region 20. The NMOS NAND flash floating-gate transistor's 10 channel width is determined by the width of the N-diffusion of the drain 15 and the source 20. The typical unit size of the NMOS NAND flash floating-gate transistors 10 is about $4\lambda^2$ with $2\lambda$ in X-dimension and $2\lambda$ in Y-dimension. The dimension Lambda ($\lambda$) is the minimum size of feature geometry achievable within a manufacturing process.

The floating-gate layer 45 stores electron charges to modify the threshold voltage of the NMOS NAND flash floating-gate transistors 10. In operation, the P-type substrate 40 is connected to a ground reference voltage source (GND). The deep N-well 35 is connected to the power supply voltage source (VDD). In present designs of NMOS NAND flash floating-gate transistors 10, the power supply voltage source is either 1.3V or 3.0V. The triple P-type well 30 is connected to the ground reference voltage in normal read operation.

In an array of NMOS NAND flash floating-gate transistors 10, the NMOS NAND flash floating-gate transistors 10 are arranged in rows and columns. The second polycrystalline silicon layer 25 that is the control gate of the NMOS NAND flash floating-gate transistors 10 is extended to form a wordline that connects to each of the NMOS NAND flash floating-gate transistors 10 on a row of an array.

A tunnel oxide 50 is formed on top of the channel region 32 between the drain region 15 and the source region 20 and the floating-gate 45. The thickness of the tunnel oxide 50 typically 100 Å. The tunnel oxide 50 is the layer through which the electron charges tunnel during the Fowler-Nordheim channel programming and Fowler-Nordheim channel erasing. In a traditional NAND operation, Fowler-Nordheim channel erasing expels stored electrons from the floating-gate 45 through the tunnel oxide 50 to cell's channel region 32 into the triple P-well 30.

FIG. 1d is a graph of two threshold voltage distributions of a single transistor floating-gate NMOS NAND flash cell having a single program level and a erase level. After an erase operation, there are fewer electron charges in the floating-gate 45 that result in lowering the threshold voltage of the NMOS NAND flash floating-gate transistors 10. Normally, the erased NMOS NAND flash floating-gate transistor 10 has its threshold voltage set to approximately −2.0V. In contrast, in Fowler-Nordheim channel programming, electrons are attracted to the floating-gate 45 so that threshold voltage of the NMOS NAND flash floating-gate transistors 10 is increased to a voltage level of approximately +2.0V. By convention, the erased voltage threshold (Vt0) value of approximately −2.0V is designated as a logical data value of "1" and the programmed voltage threshold (Vt1) of +2.0V is designated as a logical data value of "0".

In an array, the Fowler-Nordheim channel erase process removes electron charges from the floating-gate and is generally performed collectively in unit of a page (512 B) or a sector (64 KB) and the erased voltage threshold (Vt0) has a wider distribution because the nature of the process makes it more difficult to control the removal of the electrons. Alternately, a programming operation injects electrons into the floating-gate in a more controllable way and can be performed on bit-by-bit basis (one NMOS NAND flash floating-gate transistor 10 at a time through the a bit line connected to a drain 15) so that the programmed voltage threshold (Vt1) distribution is much smaller than erased voltage threshold (Vt0) and is controlled within 0.5V. Since each NAND cell stores two distinctive voltage threshold states with the erase voltage threshold state (Vt0) having a wide distribution and the programmed voltage threshold (Vt1) having one narrow distribution, the NMOS NAND flash floating-gate transistors 10 stores only one bit of a binary data and is referred to as a single level programmed or SLC, which stands for Single-Level-Cell. The NMOS NAND flash floating-gate transistors 10 that stores a single bit of data is referred to as a single-bit-one-transistor NMOS NAND flash floating-gate cell (1 b1T).

FIG. 1e is a graph of four threshold voltage distributions of a single transistor floating-gate NMOS NAND flash cell having one erase level and three program levels. It is known in the art that by varying the program conditions more than two threshold voltage levels can be created based on the quantity of charge placed on the floating-gate 45 of the NMOS NAND flash floating-gate transistors 10. This is commonly referred to multiple level programming of a NMOS NAND flash floating-gate cell or MLC, which stands for multi-level cell. In this example, there are four threshold voltage levels that can be programmed to the NMOS NAND flash floating-gate transistors 10. The most negative threshold voltage level Vt0 is the erased voltage level with a nominal value of −2.0V for storing a logical data value of "11". The most negative threshold voltage level Vt0 has the widest distribution of the threshold voltage levels (Vt0, Vt1, Vt2 and Vt3) because it is the only one erase state, which is performed to remove the electron charges. The other three threshold voltage levels (Vt1, Vt2 and Vt3) have a more narrow distribution of the programmed states because they add the electrons onto the floating-gate in a more controlled fashion from the erase state. The three positive narrow programmed voltage threshold voltage levels are set to be sufficiently spaced apart to allow detection. In the present example, the first of the three voltage threshold levels Vt1 has a nominal value of approximately +1.0V for storing a logical data value "10". The second of the three voltage threshold levels Vt2 has a nominal value of approximately +2.0V for storing a logical data value "01". The third of the three voltage threshold level Vt3 has a nominal value of approximately +3.0V for storing a logical data value "00". Since each NMOS NAND flash floating-gate transistor 10 stores four distinctive threshold voltage states, each NMOS NAND flash floating-gate transistor 10 stores two bits binary data and is referred to as a two-bit-one-transistor NMOS NAND flash cell (2 b/1T).

The nominal values of threshold voltages (Vt0, Vt1, Vt2 and Vt3) of the NMOS NAND flash floating-gate transistors 10 may vary by more than 1.0V among different designs. The assignment of 2-bit data states for four threshold voltage states may also vary between NMOS NAND flash floating-gate cell designs. For example, some NMOS NAND flash floating-gate cell designs assign the logical data value "01" to the first positive threshold voltage Vt1 and the logical data value "10" for the second positive threshold voltage state Vt2. Or the negative erased threshold voltage Vt0 may be assigned to the logical data value "00" and the third positive threshold voltage Vt3 may be assigned to the logical data value "11".

FIG. 2a is a top plan view of a NMOS NOR flash floating-gate transistor 110. FIG. 2b is a cross sectional view NMOS NOR flash floating-gate transistors 110. FIG. 2c is the schematic symbol NMOS NOR flash floating-gate transistors 110. The floating-gate type NMOS NOR flash cell 110 is formed within a triple P-well structure that is constructed into the top surface of a triple P-type substrate 130. An N-type material is diffused into the surface of the P-type substrate 140 to form a deep N-well 135. A P-type material is then diffused into the surface of the deep N-well 135 to form a P-well 130 (commonly referred to as a triple P-well). The N-type material is then diffused into the surface of a P-type well 130 to form the drain (D) 115 and the self-aligned source (S) 120. A first polycrystalline silicon layer is formed above the bulk region of the P-type well 130 between the drain region 115 and the source region 120 to form the floating gate 145. A second polycrystalline silicon layer is formed over the floating gate 145 to create a control gate (G) 125 of the NMOS NOR flash floating-gate transistors 110. The self-aligned source 120 is formed self-aligned between two adjacent second polycrystalline silicon layers of two control gates 125 of a pair of NMOS NOR flash floating-gate transistors 110. The self-aligned source 120 is commonly used in NMOS NOR flash floating-gate transistors 110 to reduce the source line pitch.

The gate length of the NMOS NOR flash floating-gate transistors 110 is the channel region 132 in the bulk region of P-type well 130 between drain region 115 and the source region 120. The NMOS NOR flash floating-gate transistor's 110 channel width is determined by the width of the N-diffusion of the drain 115 and the source 120. The typical unit size of the NMOS NOR flash floating-gate transistor 110 is about $10\lambda^2$ with $2.5\lambda$ in the X-dimension and $4\lambda$ in the Y-dimension.

The floating-gate layer 145 stores electron charges to modify the threshold voltage of the NMOS NOR flash floating-gate transistors 110. In all operations, the P-type substrate 140 is connected to a ground reference voltage source (GND). The deep N-well 135 is connected to the power supply voltage source (VDD) in read and program operations but around +10V in the Fowler-Nordheim channel erase operation. In present designs of NMOS NOR flash floating-gate transistors 110, the power supply voltage source is either 1.3V or 3.0V. The triple P-type well 130 is connected to the ground reference voltage in normal read and program operation but to the +10V during erase operation. In other words, during the Fowler-Nordheim channel erase operation, both the deep N-well 135 and the triple P-well 130 are biased with the same voltage of approximately +10V to avoid forward leakage current through the P/N junction through the deep N-well 135 and the triple P-well 130.

In an array of NMOS NOR flash floating-gate transistors 110, the NMOS NOR flash floating-gate transistors 110 are arranged in rows and columns. The second polycrystalline silicon layer 125 that is the control gate of the NMOS NOR flash floating-gate transistors 110 is extended to form a word-line that connects to each of the NMOS NOR flash floating-gate transistors 110 on a row of the array.

A tunnel oxide 150 is formed on top of the channel region 132 between the drain region 115 and the source region 120 and the floating-gate 145. The thickness of the tunnel oxide 150 typically 100 Å. The tunnel oxide 150 is the layer through which the electron charges pass during the high current channel-hot-electron programming and low current Fowler-Nordheim channel erasing. In a traditional NOR operation, Fowler-Nordheim edge erasing expels stored electrons from the floating-gate 145 through the tunnel oxide 150 to cell's channel region 132 into the triple P-type well 130.

After an erase operation, fewer electron charges are stored in the floating-gate 145 that results in a decrease in the NMOS NOR flash floating-gate transistor's 110 first threshold voltage level (Vt0) of less than approximately 2.5V. In contrast, in a channel-hot-electron program operation, electrons are attracted into floating-gate 145 so that the NMOS NOR flash floating-gate transistor's 110 second threshold voltage level (Vt1) is set to the voltage greater than approximately 4.0V. The distributions of the first threshold voltage level (Vt0) for an erased state with a wide distribution and the second threshold voltage level (Vt1) for a programmed state with a narrow distribution are set to be positive to avoid any false reading induced by the NMOS NOR flash floating-gate transistors 110 having a negative threshold voltage level.

FIG. 2d is a graph of two threshold voltage distributions of a single transistor floating-gate NMOS NOR flash cell having a single program level. After an erase operation, there are fewer electron charges in the floating-gate 145 that result in lowering the threshold voltage of the NMOS NOR flash floating-gate transistors 10. Normally, the erased NMOS NOR flash floating-gate transistors 110 has a maximum value of its threshold voltage set to approximately +2.5V. In contrast, in channel-hot-electron-programming, electrons are attracted to the floating-gate 145 so that threshold voltage of the NMOS NOR flash floating-gate transistors 110 is increased to a minimum value voltage level of approximately +4.0V. By convention, the erased voltage threshold (Vt0) value of approximately +2.5V is designated as a logical data value of "1" and the programmed voltage threshold (Vt1) of +4.0V is designated as a logical data value of "0". As in the NMOS NAND flash floating-gate transistors, the NMOS NOR flash floating-gate transistors 110 that stores a single bit of data is referred to as a single-bit-one-transistor NMOS NOR flash floating-gate cell (1 b1T)

FIG. 2e is a graph of four threshold voltage distributions of a single transistor floating-gate NMOS NOR flash cell having one erase level and three program levels. It is known in the art that by varying the program conditions more than two threshold voltage levels can be created based on the quantity of charge placed on the floating-gate 145 of the NMOS NOR flash floating-gate transistors 110. This is commonly referred to multiple level programming of a NMOS NOR flash floating-gate cell or multi-level programmed cell. In this example, there are four threshold voltage levels that can be programmed to the NMOS NOR flash floating-gate transistors 110. The least positive wide-distribution threshold voltage level Vt0 is the erased voltage level with a maximum value of +2.5V for storing a logical data value of "11". The three positive narrow-distribution programmed voltage threshold voltage levels are set to be sufficiently spaced apart to allow accurate detection. In the present example, the first of the three voltage threshold levels Vt1 has a nominal value of approximately +3.5V for storing a logical data value "10". The second of the three voltage threshold levels Vt2 has a nominal value of approximately +4.5V for storing a logical data value "01". The third of the three voltage threshold level Vt3 has a nominal value of approximately +5.5V for storing a logical data value "00". Since each NMOS NOR flash floating-gate transistor 110 stores four distinctive positive threshold voltage states, each NMOS NOR flash floating-gate transistor 110 stores two bits binary data and is referred to as a two-bit-one-transistor NMOS NOR flash cell (2 b/1T).

The nominal values of threshold voltages Vt1 and Vt2 of the NMOS NOR flash floating-gate transistors 110 may vary by more than 1.0V among different designs. The nominal values of threshold voltages Vt0 and Vt3 can have a wider threshold voltage distribution. For example, the first threshold voltage Vt0 is may vary from approximately 1.0V to approximately 2.5V. The fourth threshold voltage Vt3 can have much wider distribution. It must have a voltage greater than approximately 4.5V to ensure that the NMOS NOR flash floating-gate transistors 110 is in a non-conduction state. The assigned designations of 2-bit data states for four threshold voltage states may also vary between NMOS NOR flash floating-gate cell designs as described above in the NMOS NAND flash floating-gate cell.

"Intel StrataFlash™ Memory Technology Overview", Atwood, et al., Intel Technology Journal, Vol. 1, Issue 2, Q4 1997, found www.intel.com, Apr. 23, 2007, "Intel StrataFlash™ Memory Technology Development and Implementation", Fazio, et al., Intel Technology Journal, Vol. 1, Issue 2, Q4 1997, found www.intel.com, Apr. 21, 2009, "ETOX™ Flash Memory Technology: Scaling and Integration Challenges", Fazio, et al., Intel Technology Journal, Vol. 6, Issue 2, May 2002, found www.intel.com, Apr. 21, 2009, discuss a floating-gate ETOX™ flash memory transistor that is structured to form an NMOS NOR flash cell as described in FIGS. 3a-3e. FIG. 3a is a top plan layout view of a two transistor floating-gate NMOS NOR flash cell. FIG. 3b is a cross sectional view of a two transistor floating-gate NMOS NOR flash cell. FIG. 3c is a schematic diagram of two transistor floating-gate NMOS NOR flash cell. The two-transistor floating-gate type NMOS NOR flash cell 210 is formed in the top surface of a P-type substrate 240. An N-type material is then diffused into the surface of the P-type substrate 240 to form the drains (D) 215a and 215b of the two floating gate transistors 205a and 205b and the self-aligned source (S) 220. The self-aligned source (S) 220 is shared by the two floating gate transistors 205a and 205b. A first polycrystalline silicon layer is formed over the bulk regions 230a and 230b between the drain regions 215a and 215b and the self-aligned source region 220 to form the floating gates 245a and 245b. A second polycrystalline silicon layer is formed over the floating gates 245a and 245b to create the control gates (G) 225a and 225b of the floating-gate transistors 210a and 210b. The self-aligned source 220 is formed self-aligned between two adjacent second polycrystalline silicon layers of two control gates 225a and 225b of a pair of two floating gate transistors 205a and 205b. The self-align source 220 is commonly used in NMOS NOR flash floating-gate transistors 210 to reduce the source line pitch.

The drain regions 215a and 215b each have a metal contact 250a and 250b. The two metal contacts 250a and 250b are connected to and shorted by a common metal bit line 255.

FIG. 3d is a graph of two threshold voltage distributions of a two transistor floating-gate NMOS NOR flash cell 210 having a single program level. After an erase operation, there are fewer electron charges in the floating-gate 245 that result in lowering the threshold voltage of the two floating gate transistors 205a and 205b. In contrast, in channel-hot-electron-programming, electrons are attracted to the floating gates 245a and 245b so that threshold voltage of the two floating gate transistors 205a and 205b are increased. By convention, the erased voltage threshold (Vt0) is designated as a logical data value of "1" and the programmed voltage threshold (Vt1) is designated as a logical data value of "0".

The two floating gate transistors 205a and 205b that store a two bits of data is referred to as a two-bit-two-transistor NMOS NOR flash floating-gate cell (2 b2T)

FIG. 3e is a graph of four threshold voltage distributions of a two transistor floating-gate NMOS NOR flash cell 210 having one erase level and three program levels. It is known in the art that by varying the program conditions more than two threshold voltage levels can be created based on the quantity of charge placed on the floating-gate 245 of the NMOS NOR flash floating-gate transistors 210. This is commonly referred to multiple level programming of a NMOS NOR flash floating-gate cell 210 or multi-level programmed cell. In this example, there are four threshold voltage levels that can be programmed to the two floating gate transistors 205a and 205b. The least positive threshold voltage level Vt0 is the erased voltage level for storing a logical data value of "11". The three positive programmed voltage threshold voltage levels are set to be sufficiently spaced apart to allow detection. In the present example, the first of the three voltage threshold levels Vt1 stores a logical data value "10". The second of the three voltage threshold levels Vt2 stores a logical data value "01". The third of the three voltage threshold level Vt3 stores a logical data value "00". Since each NMOS NOR flash floating-gate transistor 210 stores four distinctive threshold voltage states, each NMOS NOR flash floating-gate transistor 210 stores two bits binary data and is referred to as a two-bit-one-transistor NMOS NOR flash cell (2 b/1T).

The nominal values of threshold voltages Vt1 and Vt2 of the NMOS NOR flash floating-gate transistors 210 may vary among different designs. The nominal values of threshold voltages Vt0 and Vt3 can have a wider threshold voltage distribution. The assigned designations of 2-bit data states for four threshold voltage states may also vary between NMOS NOR flash floating-gate cell designs as described above in the NMOS NAND flash floating-gate cell.

FIG. 4a is the schematic symbol of a NMOS NOR flash memory cell 400 embodying the principles of the present invention. FIGS. 4b-1 and 4c-1 are top plan views of implementations of a NMOS NOR flash memory cell 400 embodying the principles of the present invention. FIGS. 4b-2 and 4c-2 are a cross sectional views of implementations of a NMOS NOR flash memory cell 400 embodying the principles of the present invention. The floating-gate type NMOS NOR flash cell 400 is formed in the top surface of a P-type substrate 440. An N-type material is diffused into the surface of the P-type substrate 440 to form a deep N-well 435. A P-type material is then diffused into the surface of the deep N-well 435 to form a P-well 430 (commonly referred to as a triple P-well). The N-type material is then diffused into the surface of a P-type well 430 to form the drain region (D) 415 of the NMOS NAND flash floating-gate transistor 405a, the source region of the NMOS NAND flash floating-gate transistor 405b and the self-aligned source/drain (S/D) 420. The source/drain 420 being the source region of the NMOS NAND flash floating-gate transistor 405a and the drain of the NMOS NAND flash floating-gate transistors 405b. A first polycrystalline silicon layer is formed above the bulk region of the P-type well 430 between the drain region 415 and the source region 420 NMOS NAND flash floating-gate transistor 405a and the drain region 420 and the source region 422 of the NMOS NAND flash floating-gate transistor 405b to form the floating gates 445a and 445b. A second polycrystalline silicon layer is formed over the floating gates 445a and 445b to create the control gates (G) 425a and 425b of the NMOS NAND flash floating-gate transistors 405a and 405b. The self-aligned source/drain region 420 is formed as self-aligned between the two adjacent second polycrystalline silicon layers of two control gates 425a and 425b of NMOS NAND flash floating-gate transistors 405a and 405b. The self-align source 420 is commonly used in the NMOS NAND flash floating-gate transistors 405a and 405b to reduce the source line pitch.

The gate length of the NMOS NAND flash floating-gate transistors 405a and 405b is the length of the channel regions 432a and 432b in the bulk region of P-type well 430 between drain region 415 and the source region 420 of the NMOS NAND flash floating-gate transistor 405a and the drain region 420 and the source region 422 of the NMOS NAND flash floating-gate transistors 405b. The NMOS NOR flash floating-gate transistors' 405a and 405b channel width is determined by the width of the N-diffusion of the drain region 415, the source region 422 and the source/drain region 420. The typical unit size of the two transistor NMOS NOR flash memory cell 400 is from approximately $12\lambda^2$ to approximately $14\lambda^2$. Therefore the effective size for a single bit NOR cell is approximately $6\lambda^2$. The effective size ($6\lambda^2$) of a single bit NOR cell is slightly larger than a NAND cell size of the prior art. However, the effective size of a single bit NOR cell is much smaller than the NOR cell size ($10\lambda^2$) of the prior art for a semiconductor manufacturing process above 50 nm. The NOR cell structure of the prior size is projected to increase to $15\lambda^2$ due to the scalability issues in semiconductor manufacturing process below 50 nm. The effective single bit/single transistor size of the NMOS NOR flash memory cell 400 remains constant an effective cell size of approximately $6\lambda^2$. The constant cell sized is a result of the scalability is identical to that of the NMOS NAND flash memory cell of the prior art.

The floating-gate layers 445a and 445b each respectively store electron charges to modify the threshold voltage of the NMOS NAND flash floating-gate transistors 405a and 405b. In all operations such as read, program and erase, the P-type substrate 440 is always connected to a ground reference voltage source (GND). The deep N-well 435 is connected to the power supply voltage source (VDD) in read and program operations but is connected to a voltage level of approximately +20V in a Fowler-Nordheim channel erase operation. In present designs of NMOS NOR flash memory cell 400, the power supply voltage source is either 1.8V or 3.0V. Like the deep N-well bias conditions, the triple P-type well 430 is connected to the ground reference voltage in normal read and program operations but is connected to around +20V in FN-channel erase operation.

In an array of NMOS NOR flash memory cell 400, the NMOS NAND flash floating-gate transistors 405a and 405b are arranged in rows and columns. The second polycrystalline silicon layer 425 that is the control gate of the NMOS NAND flash floating-gate transistors 410 is extended to form a word-line that connects to each of the NMOS NAND flash floating-gate transistors 410 on a row of the array.

A tunnel oxide is formed on top of the channel region 432a and 432b between the drain region 415 and the source region 420 of the NMOS NAND flash floating-gate transistor 405a and the drain region 420 and the source region 422 of the NMOS NAND flash floating-gate transistor 405b and beneath the floating-gates 445a and 445b. The thickness of the tunnel oxide typically 100 Å. The tunnel oxide is the layer through which the electron charges pass during the Fowler-Nordheim channel tunneling programming and erasing. In a traditional NOR operation, Fowler-Nordheim tunnel erasing expels stored electrons from the floating-gates 445a and 445b through the tunnel oxide to cell's channel regions 432a and 432b into the triple P-type substrate 430.

After an erase operation, fewer electron charges are stored in the floating-gates 445a and 445b that results in a decrease in a first threshold voltage level (Vt0) of the NMOS NAND flash floating-gate transistors 405a and 405b. In contrast, in a Fowler-Nordheim program operation, electrons are attracted into floating-gates 445a and 445b so that a second threshold voltage level (Vt1) of the NMOS NAND flash floating-gate transistors 405a and 405b is set to the relatively high voltage.

Figure 5C:
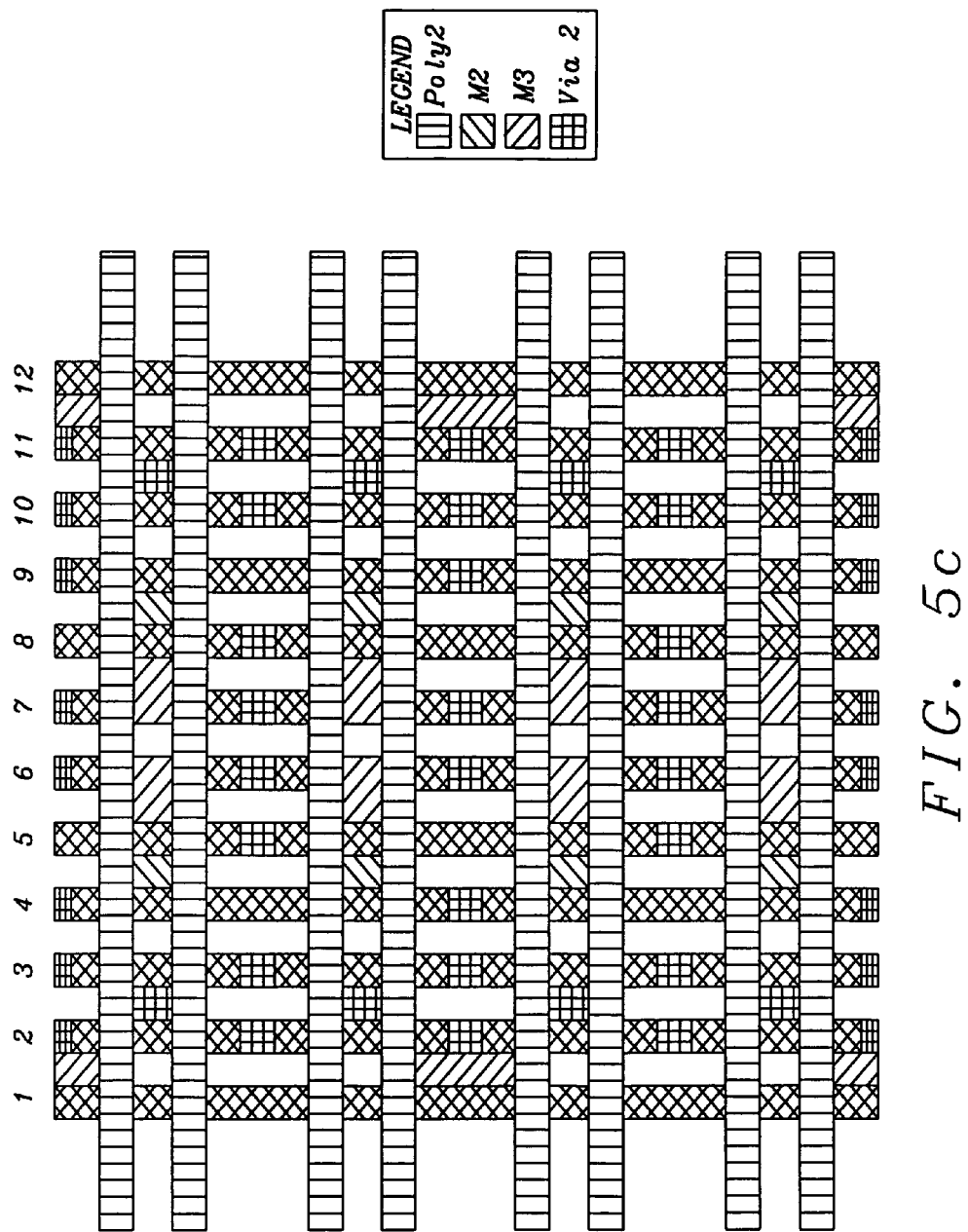
Figure 5D:
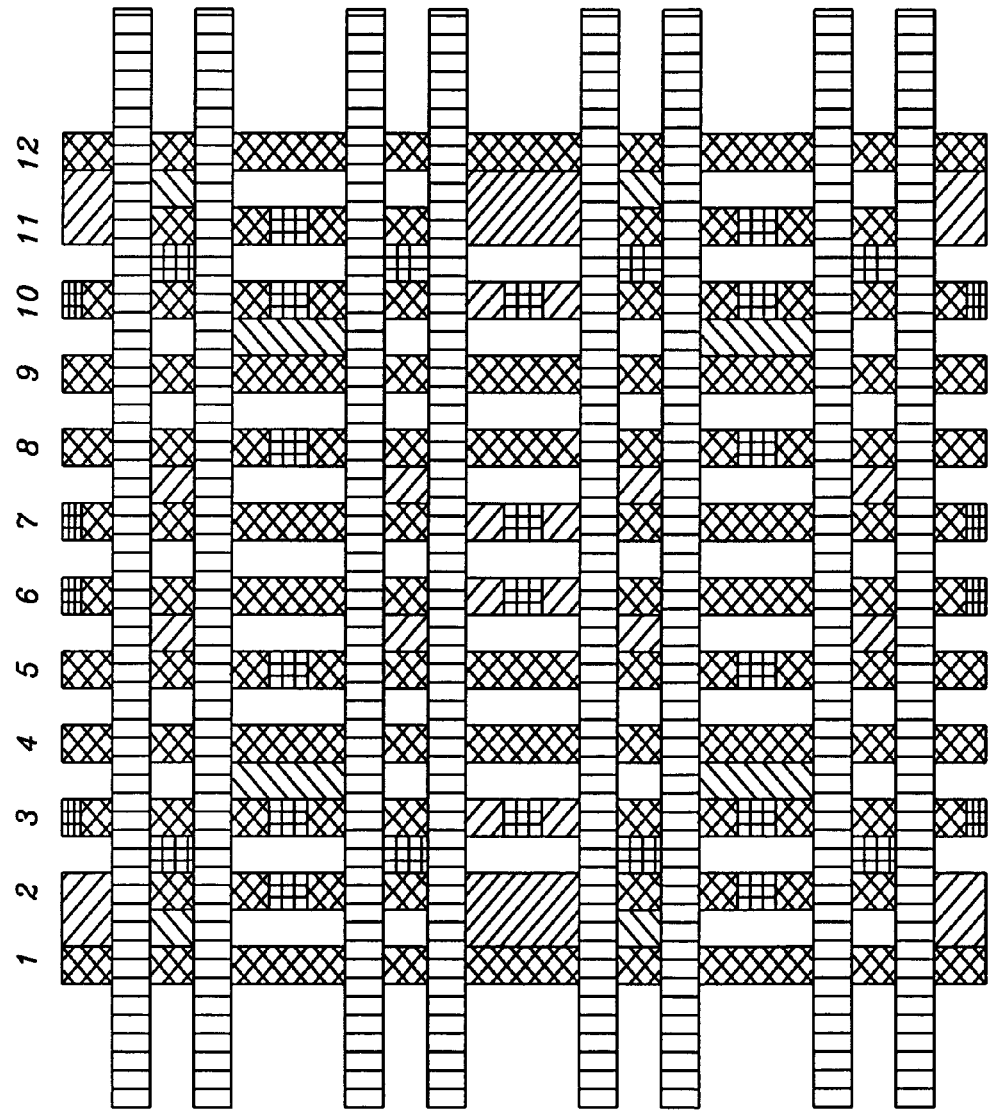
Figure 5E:
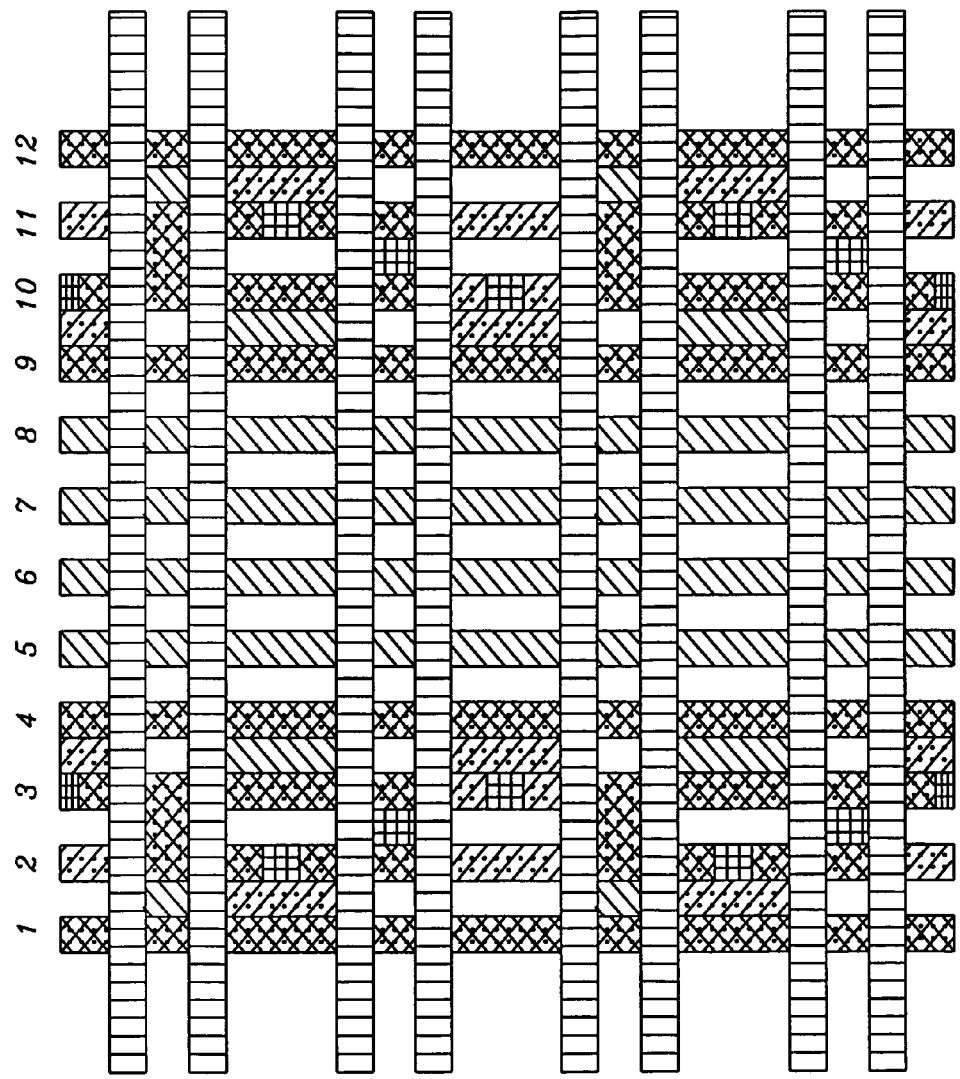

FIGS. 5a-5e are top plan layout views illustrating wiring interconnection of a section of an embodiment of an array of two transistor floating-gate NMOS NOR flash cells connected in series embodying the principles of the present invention. This section incorporates a matrix of four rows of the two transistor NMOS NOR flash memory cells 400 and twelve columns of the two transistor NMOS NOR flash memory cells 400 or eight rows of the NMOS NAND floating gate transistors 405a and 405b. Each of the NMOS NOR flash memory cells 400 have the N+ diffusions of the drain region 415, the source/drain region 420, and the source region 422 as described above in FIGS. 4a, 4b-1, 4b-2, 4c-1, and 4c-2. The control gates 425a and 425b are incorporated within the word lines WL0 450a and WL1 450b. The bit lines 455a and 455b and the source lines 460a and 460b are formed as either first level metal (455a and 460b) or second level metal (455b and 460a) of FIGS. 4b-2 and 4c-2. The bit lines 455a and 455b are connected respectively through the vias 457a and 457b to the drain 415 of the NMOS NAND flash floating-gate transistors 405a. The source lines 460a and 460b are connected respectively through the 462a and 462b to the source 422 of the NMOS NAND flash floating-gate transistor 405b In FIG. 5b the connections of a local Metal1 bit lines to a local Metal2 bit lines and a Metal1 local source line to a local Metal2 source lines are connected through vias (Via1). FIG. 5c shows the next layer of connections having Metal2 local bit lines connected to a local Metal3 bit lines and a Metal2 local source lines connected to a Metal3 local source lines through vias (VIA2). FIG. 5d shows the next succeeding layer connections having Metal3 local bit lines connected to a Metal4 local bit lines and Metal3 local source lines connected to Metal4 local source lines through vias (VIA3). FIG. 5e shows the next succeeding layer connections having Metal4 local bit lines connected to Metal5 local bit lines and Metal4 local source lines connected to Metal5 local source lines through vias (VIA4). The matrix of NMOS NOR flash memory cells 400 of the 12 local bit lines 455a and 455b and the 12 local source lines 460a and 460b are successfully connected by using five metal layers only with an effective cell size of approximately $6\lambda^2$. Each global bit line and each global source line is shared by two local bit lines 455a and 455b and local source lines 460a and 460b respectively.

The structure illustrated in FIGS. 5a-5e has 5 layers of metal wiring to produce a cell structure such that the effective size of a single bit transistor NOR cell size is approximately $6\lambda^2$. The wiring pitch may be larger in the horizontal or x-direction or the NAND string may include three or more floating gate transistors to reduce the number of metal layers below five. This shows that there is a tradeoff between number of metal layer vs. number of NAND string versus the wiring pitch in the horizontal or x-direction. More number of NAND string and relax in x-direction would end up less metal layers.

Figure 6A:
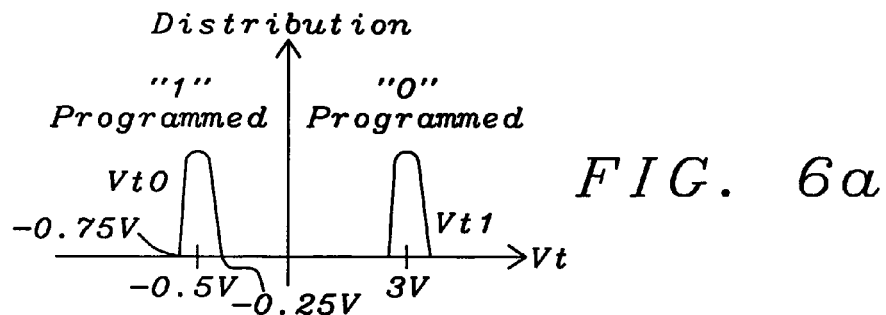
FIGS. 6a-6d are graphs of threshold voltage levels for a variety of various embodiments of the single transistor floating-gate NMOS NOR flash cell embodying the principles of the present invention.

FIGS. 6a-6d are graphs of threshold voltage levels of a variety of implementations of various embodiments of a single transistor of the two transistor floating-gate NMOS NAND flash cell of the present invention. FIG. 6a illustrates the voltage thresholds levels for one implementation of programming and erasing of the NMOS NAND flash floating-gate transistors 405a and 405b of FIGS. 4a, 4b-1, 4b-2, 4c-1, and 4c-2. In this implementation there is one programmed positive threshold voltage level (Vt1) with a narrow distribution representing a logical "0" datum and one programmed negative threshold voltage level (Vt0) also with a narrow distribution representing a logical "1" datum. Both Vt0 and Vt1 are programmed states, having preferable threshold voltage levels with narrow distributions. In the erasing of NMOS NAND flash floating-gate transistors 405a and 405b, a +20V is applied to the triple P-well 430 into which the NMOS NAND flash floating-gate transistors 405a and 405b are formed and a ground reference voltage level (0V) is applied to the selected control gate 425a and 425b on the selected NMOS NAND flash floating-gate transistors 405a and 405b to establish a 20V voltage drop between the selected control gate 425a and 425b and bulk 432a and 432b of the selected NMOS NAND flash floating-gate transistors 405a and 405b to establish a negative Fowler-Nordheim channel tunneling effect. Since the erase operation in an NOR flash nonvolatile memory array is conventionally performed in units of 64 KB on the selected NOR flash nonvolatile memory array block typically, the negative threshold voltage level (Vt0) is considered to be the collective erase state.

In a NAND flash nonvolatile memory array of the prior art, the threshold voltage level (Vt0) has a wide voltage distribution. Conventionally, the negative threshold voltage level (Vt0) has a range of approximately 2.0V, varying from −2.0V to about 0.0V. The threshold voltage level (Vt1) has a programmed voltage level of approximately +2.5V, varying from +2.0 to about +3.0V. The positive threshold voltage level (Vt1) does not need a narrow 0.5V distribution in circuit operation as long as the positive threshold voltage level (Vt1) is kept less than the pass voltage of 6.0V for the unselected word lines in the selected NAND flash nonvolatile memory array block during a page program operation.

Unlike the slow, synchronous, serial-read specification for a 512-bit page of the NAND flash nonvolatile memory array is about 20 μs, the targeted fast random, asynchronous read speed of NOR flash nonvolatile memory device is less than 100 ns. In view of the above speed requirements for a two-bit/two transistor of a NMOS NOR flash memory cell 400. With NMOS NAND flash floating-gate transistors 405a and 405b connected in series, the most preferred threshold voltage level distribution for both the negative threshold voltage level (Vt0) and the positive threshold voltage level (Vt1) is within approximately 0.5V. The negative threshold voltage level (Vt0) having a nominal voltage level of approximately −0.5V and the positive threshold voltage level (Vt1) having a nominal voltage level of approximately +3.0V. In order to achieve a narrow threshold voltage level distribution for the negative threshold voltage level (Vt0) and positive threshold voltage level (Vt1), the negative threshold voltage level (Vt0) and positive threshold voltage level (Vt1) are achieved by using a bit-by-bit positive Fowler-Nordheim channel program process. The negative threshold voltage level (Vt0) state for the NMOS NAND flash floating-gate transistors 405a and 405b is performed in two step. The first step is performed by a negative Fowler-Nordheim channel collective erase in a page or a block with a wider negative threshold voltage level (Vt0) distribution and the second step positive bit-by-bit Fowler-Nordheim channel program to obtain a narrow negative threshold voltage level (Vt0). The positive threshold voltage level (Vt1) of the selected NMOS NAND flash floating-gate transistors 405a and 405b can be narrowed down in a single step by gradually increasing the program voltage at the selected control gate 425a and 425b incrementally from approximately +15.0V to approximately +20V or greater depending on the manufacturing integrated circuit process. Both negative threshold voltage level (Vt0) and positive threshold voltage level (Vt1) are the narrow programmed state having a distribution of approximately 0.5V for the NMOS NAND flash floating-gate transistors 405a and 405b.

Figure 6B:
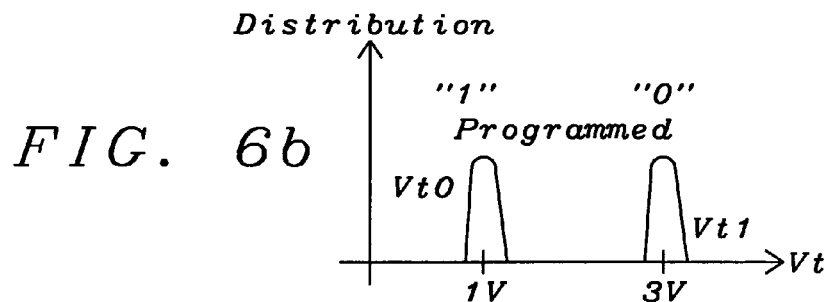

FIG. 6b illustrates the voltage thresholds levels for a second implementation of programming and erasing of NMOS NAND flash floating-gate transistors 405a and 405b of FIGS. 4a, 4b-1, 4b-2, 4c-1, and 4c-2. In this single level cell (SLC) implementation, the first threshold voltage level (Vt0) and second threshold voltage level (Vt1) are all set to be positive with threshold voltage level distribution of approximately 0.5V. The positive first threshold voltage level (Vt0) is also done in 2-step with a first step of negative Fowler-Nordheim channel collective page-erase and followed by a second step of a positive Fowler-Nordheim channel bit-by-bit program as explained above for FIG. 6a. The first threshold voltage level (Vt0) and second threshold voltage level (Vt1) are both programmed states as opposed to being an erased and program state.

The first threshold voltage level (Vt0) is set to be positive with a nominal value of 0.5V with narrow distribution of 0.5V or from approximately +0.75V to approximately +1.25V for storing a logical "1" datum. The second threshold voltage level (Vt1) is a positive state with a nominal value of 3.0V having the narrow distribution of from approximately +2.75V to approximately +3.25V for storing a logical "0" datum. In some embodiments of the NOR flash nonvolatile memory device a wider threshold voltage level distribution from +2.5V to +3.5V in some applications where a speed tradeoff is required.

Figure 6C:
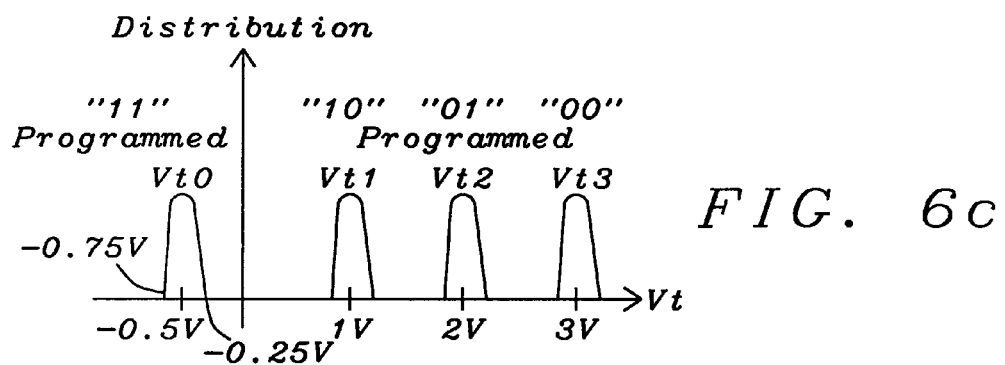

FIG. 6c illustrates the voltage thresholds levels for still another implementation of programming and erasing of NMOS NAND flash floating-gate transistors 405a and 405b of FIGS. 4a, 4b-1, 4b-2, 4c-1, and 4c-2. This implementation is for a multi-level cell (MLC) where all four threshold voltage levels (Vt0, Vt1, Vt2 and Vt3), regardless positive or negative, have a narrow distribution of approximately 0.5V. In this implementation the first threshold voltage level (VT0) is negative and is also a programmed state by using the two step write method as explained above. That means the first threshold voltage level (VT0) has a nominal threshold voltage level of approximately −0.5V and distribution varying from approximately −0.25V to approximately −0.75V for storing a logical "11" data. The second threshold voltage level (VT1) is the second data state stored in the NMOS NAND flash floating-gate transistors 405a and 405b and has a nominal voltage level of approximately +1.0 v. The second threshold voltage level (VT1) has a distribution that varies from approximately +0.75V to approximately +1.25V to store a logical "10" data. The third threshold voltage level (Vt2) is the third data state of the NMOS NAND flash floating-gate transistors 405a and 405b with a nominal voltage level of approximately +2.0V. The third threshold voltage level (Vt2) has a distribution that varies from approximately +1.75V to approximately +2.25V to store a logical "01" data. The fourth threshold voltage level (Vt3) is the fourth data state of the NMOS NAND flash floating-gate transistors 405a and 405b and has nominal voltage level of approximately +3.0V. The fourth threshold voltage level (Vt3) has a distribution that varies from approximately +2.75V to approximately +3.25V to store a logical "00" data.

Figure 6D:
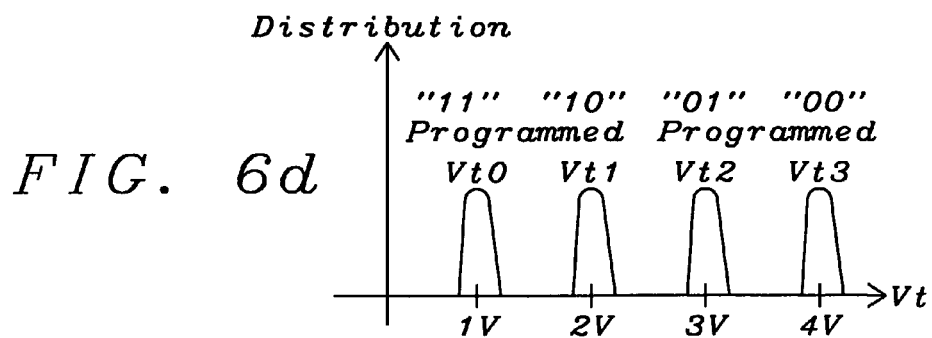

Further, FIG. 6d illustrates the voltage thresholds levels for another implementation of programming and erasing of NMOS flash floating-gate transistors 405a and 405b of FIGS. 4a, 4b-1, 4b-2, 4c-1, and 4c-2. The first threshold voltage level (VT0), second threshold voltage level (VT1), third threshold voltage level (Vt2), and fourth threshold voltage level (Vt3) have relatively narrow distributions of the threshold voltage levels that are all positive. In this implementation, the first threshold voltage level (VT0) has a median voltage level of approximately +1.0V for storing "11". The voltage distribution of the first threshold voltage level (VT0) is from +0.75V-+1.25V. The second threshold voltage level (VT1) has a median voltage level of approximately +2.0V to store a logical "10" data. The second threshold voltage level (VT1) has a distribution that varies from approximately +1.75V to approximately +2.25V. The third threshold voltage level (Vt2) has a median voltage level of approximately +3.0V to store a logical "01" data. The third threshold voltage level (Vt2) has a distribution that varies from approximately +2.75V to approximately +3.25V. The fourth threshold voltage level (Vt3) has a median voltage level of approximately 3.0V to store a logical "00" data. The fourth threshold voltage level (Vt3) has a distribution that varies from approximately +3.75V to approximately +4.25V.

Figure 7A:
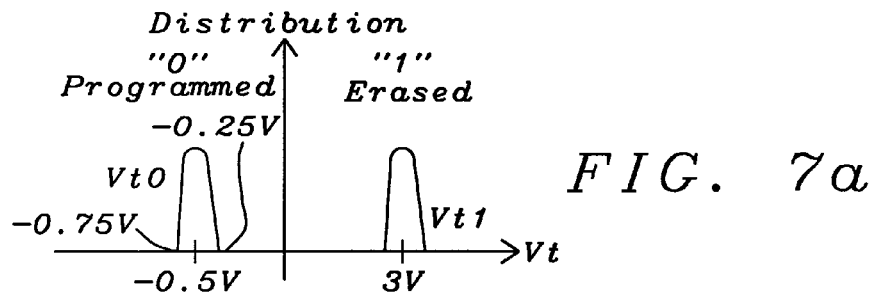
FIGS. 7a-7d are graphs of threshold voltage levels of other implementations various embodiments of the two transistor floating-gate NMOS NOR flash cell embodying the principles of the present invention.
Figure 7B:
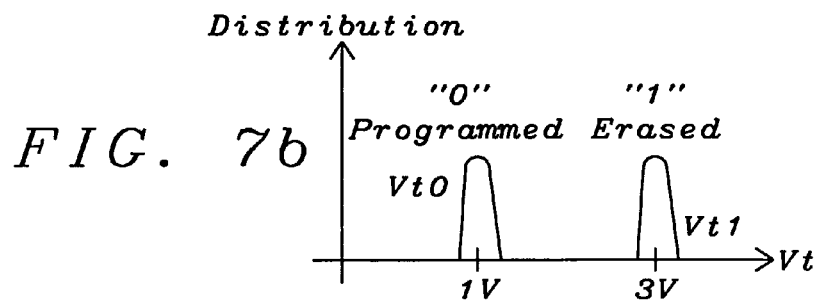
Figure 7C:
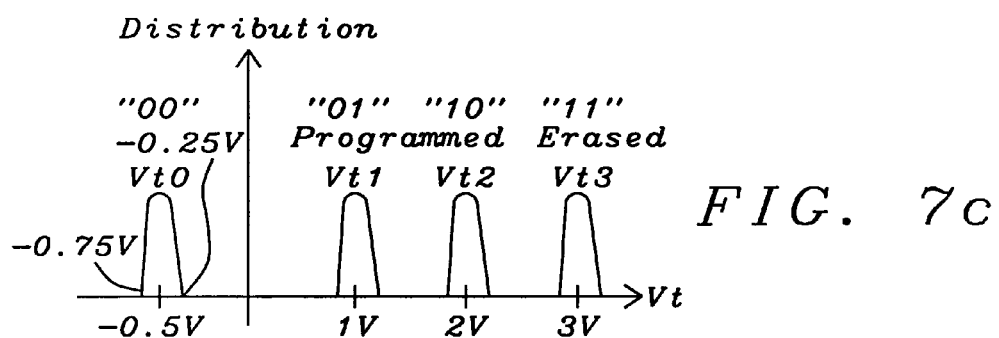
Figure 7D:
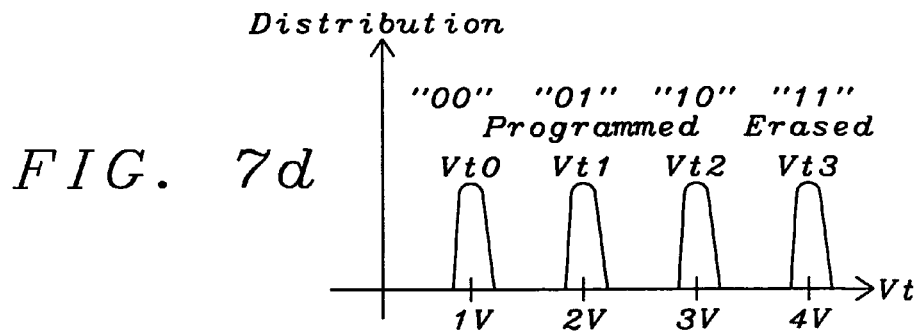

FIGS. 7a-7d are graphs of threshold voltage levels of other implementations of various embodiments of the two transistor floating-gate NMOS NOR flash cell of the present invention. FIGS. 6a-6d illustrate the conventional designations for programming and erasing the NMOS NAND flash floating-gate transistors 405a and 405b of FIGS. 4a, 4b-1, 4b-2, 4c-1, and 4c-2. In FIGS. 7a-7d illustrate an alternate process where the erase and program threshold voltage levels are reversed from those of FIGS. 6a-6d. In FIG. 7a, the first threshold voltage levels (VT0) designating the logical "0" and the second threshold voltage level (VT1) logical "1" respectively now have nominal values of approximately −0.5V and approximately +3.0V. Similarly, in FIG. 7b, the first threshold voltage level (VT0) designating the logical "0" and the second threshold voltage level (VT1) designating the logical "1" respectively now have nominal values of approximately +1.0V and approximately +3.0V. In FIG. 7c, the first threshold voltage level (VT0) has a nominal threshold voltage level of approximately −0.5V to store the logical "00" data, the second threshold voltage level (VT1) has a nominal voltage level of approximately +1.0V to store a logical "10" data, the third threshold voltage level (Vt2) has a nominal voltage level of approximately +2.0V to store a logical "01" data, and the fourth threshold voltage level (Vt3) has nominal voltage level of approximately +3.0V to store a logical "00" data. In FIG. 7d, the first threshold voltage level (VT0) has a nominal threshold voltage level of approximately +1.0V to store the logical "00" data, the second threshold voltage level (VT1) has a nominal voltage level of approximately +2.0V to store a logical "10" data, the third threshold voltage level (Vt2) has a nominal voltage level of approximately +3.0V to store a logical "01" data, and the fourth threshold voltage level (Vt3) has nominal voltage level of approximately +4.0V to store a logical "00" data.

The highest threshold voltage level or the fourth threshold voltage level (Vt3) of the multi-level cell state or second threshold voltage level (Vt1) of the single-level cell state is designated as the erased state. The first threshold voltage level (Vt0) in the single level cell and the first threshold voltage level (Vt0), second threshold voltage level (Vt1), and third threshold voltage level (Vt2) are the programmed states. The erased threshold voltage level (Vt3 for a multi-level cell or Vt1 for single-level cell) is obtained by using the positive Fowler-Nordheim channel tunneling of a page in a NOR flash nonvolatile memory device that applies approximately +20.0V on the selected control gate 425a and 425b along with the ground reference voltage level (0.0V) in selected bulk regions of the selected NMOS NAND flash floating-gate transistors 405a and 405b of FIGS. 4a, 4b-1, 4b-2, 4c-1, and 4c-2. It should be noted that the erased state of the fourth threshold voltage level (Vt3) of the multi-level cells of FIGS. 7c and 7d and the second threshold voltage level (VT1) of the single-level cell of FIGS. 7a and 7d are set to the voltage level for the Fowler-Nordheim tunneling collectively. Thus, the variation of the distribution of the threshold voltage levels is greater, since the erased state threshold voltage levels are verified to pass the minimum acceptable erased state threshold voltage level and the maximum erased state voltage level is a "don't-care" condition and does not need verification.

After an erase operation, those cells that are to be programmed to other logical data states are programmed by a bit-by-bit Fowler-Nordheim edge program process by applying a negative voltage of approximately −10.0V to the selected word lines of page of NOR flash nonvolatile memory device and applying approximately +5V to approximately +10V to the drains of the selected NMOS NAND flash floating-gate transistors 405a and 405b. The Sources of the selected NMOS NAND flash floating-gate transistors 405a and 405b are then disconnected to float. As described, the programming of the NMOS NAND flash floating-gate transistors 405a and 405b is a two step process, where the first step is erasing the selected segments of the NOR flash nonvolatile memory device positive Fowler-Nordheim channel operation. The second step is a bit-by-bit Fowler-Nordheim edge tunneling program process to trim the maximum threshold voltage levels to the desired voltage levels.

Figure 8:
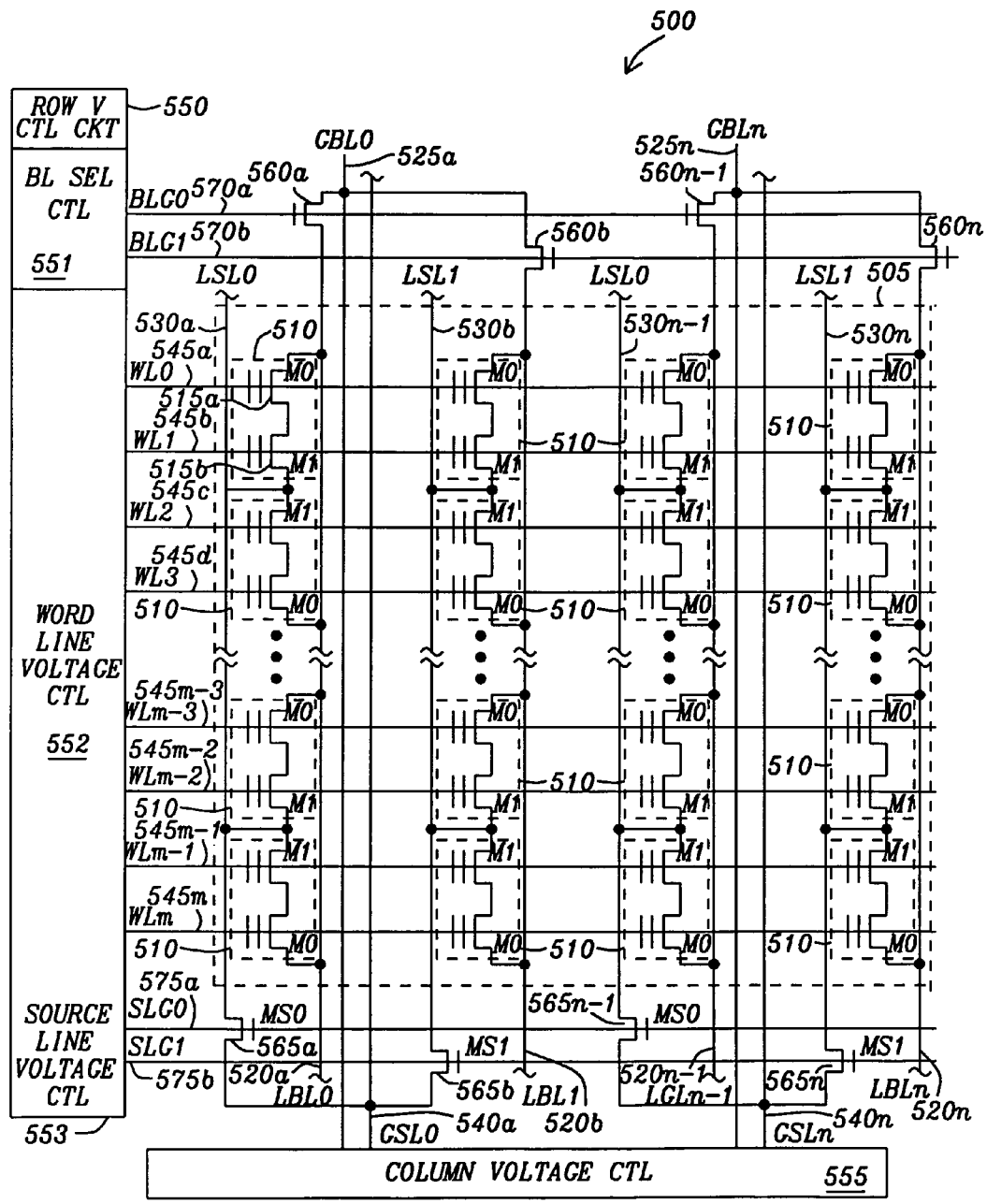
FIG. 8 is a schematic diagram of a NOR flash nonvolatile memory device incorporating various embodiments of the two transistor floating-gate NMOS NOR flash cell of the present invention.

FIG. 8 is a schematic diagram of a NOR flash nonvolatile memory device 500 incorporating the various embodiments of the two transistor floating-gate NMOS NAND flash cell 510 of the present invention. The NOR flash nonvolatile memory device 500 includes an array 505 of two transistor floating-gate NMOS NOR flash cells 510 arranged in a matrix of rows and columns. Each of the two transistor floating-gate NMOS NOR flash cells 510 includes two NMOS NAND flash floating-gate transistors 515a and 515b. The two NMOS NAND flash floating-gate transistors 515a and 515b are structured and operate as the NMOS NAND flash floating-gate transistors 405a and 405b of FIGS. 4a, 4b-1, 4b-2, 4c-1, and 4c-2. The drain of the floating-gate transistor 515a is connected to one of the local bit lines 520a, 520b, . . . , 520n−1, and 520n. The source of the floating-gate transistor 515b is connected of one of the local source lines 530a, 530b, . . . , 530n−1, and 530n. The source of the NMOS NAND flash floating-gate transistor 515a is connected to the drain of the NMOS NOR flash floating-gate transistor 515b.

The local bit lines 520a, 520b, . . . , 520n−1, and 520n associated with adjacent columns of the two transistor floating-gate NMOS NOR flash cells 510 are connected through the bit lines select transistors 560a, . . . , 560n to the global bit lines 525a, . . . , 525n. The local source lines 530a, 530b, . . . , 530n−1, and 530n associated with adjacent columns of the two transistor floating-gate NMOS NOR flash cells 510 are connected through the source lines select transistors 565a, . . . , 565n to the global source lines 540a, . . . , 540n. The global bit lines 525a, . . . , 525n and the global source lines 540a, . . . , 540n are connected to the column voltage control circuit 555. The column voltage control circuit 555 generates the appropriate voltage levels for selectively reading, programming, and erasing the two transistor floating-gate NMOS NOR flash cells 510.

Each of the control gates of the NMOS NAND flash floating-gate transistors 515a and 515b of the two transistor floating-gate NMOS NOR flash cells 510 on each row of the array 505 is connected to one of the word lines 545a, 545b, . . . , 545m. The word lines 545a, 545b, 545m are connected to the word line voltage control sub-circuit 552 in the row voltage control circuit 550.

Each of the gates of the bit lines select transistors 560a, ..., 560n are connected to the bit line select control sub-circuit 551 within the row voltage control circuit 550 to provide the select signals for activation of the bit lines select transistors 560a, ..., 560n to connect a selected local bit lines 520a, 520b, ..., 520n-1, and 520n to its associated global bit line 525a, ..., 525n. Each of the gates of the source lines select transistors 565a, ..., 565n are connected to the source line select control circuit 553 within the row voltage control circuit 550 to connect the local source lines 530a, 530b, ..., 530n-1, and 530n to their associated global source lines 540a, ..., 540n.

Each of the gates of the source lines select transistors 565a, ..., 565n are connected to the source line select control sub-circuit 553 within the row voltage control circuit 550 to provide the select signals for activation of the source lines select transistors 565a, ..., 565n to connect a selected local source lines 530a, 530b, ..., 530n-1, and 530n to its associated global source line 540a, ..., 540n. Each of the gates of the source lines select transistors 565a, ..., 565n are connected to the source line select control circuit 553 within the row voltage control circuit 550 to connect the local source lines 530a, 530b, ..., 530n-1, and 530n to their associated global source lines 540a, ..., 540n.

Figure 9:
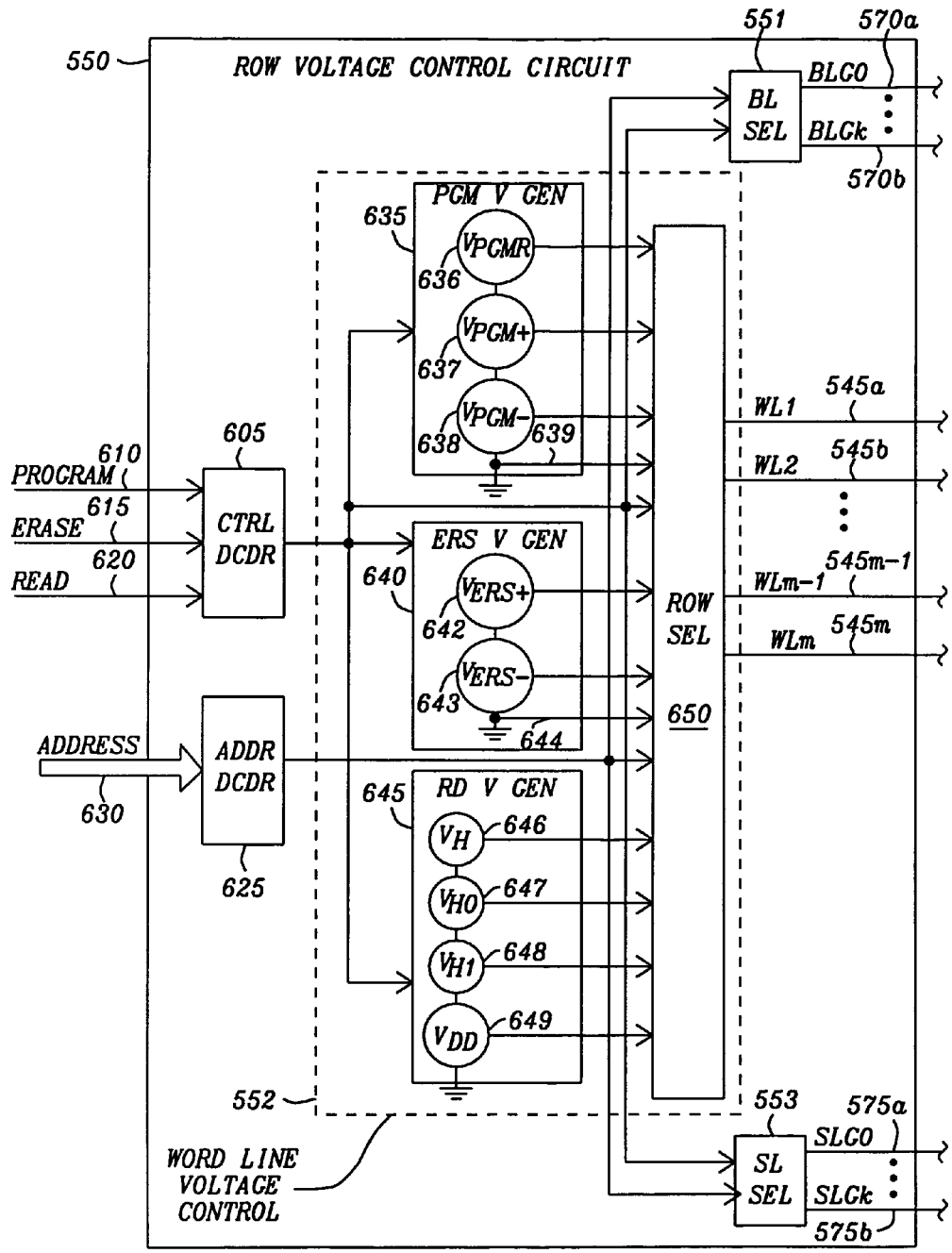
FIG. 9 is a schematic diagram of row voltage control circuit of the NOR flash nonvolatile memory device of FIG. 8 embodying the principals of the present invention.

Refer now to FIG. 9 for a description of the row voltage control circuit 550. The row voltage control circuit 550 has a control decoder 605 that receives program timing and control signals 610, erase timing and control signals 615, and read timing and control signals 620. The control decoder 605 decodes the program timing and control signals 610, erase timing and control signals 615, and read timing and control signals 620 to establish the operation of the NOR flash nonvolatile memory device 500. The row voltage control circuit 550 has an address decoder 625 that receives and decodes an address signal 630 that provides the location of the selected floating-gate NMOS NOR flash cells 510 that are to be programmed, erased, or read.

The bit line select control sub-circuit 551 receives the decoded program, erase, and read timing and control signals from the control decoder 605 and the decoded addresses from the address decoder 625. The bit line select control sub-circuit 551 selects which of the bit line select signals 570a, ..., 570b that activates the bit lines select transistors 560a, ..., 560n that connects the local bit line 520a, 520b, ..., 520n-1, and 520n to which the selected NOR flash nonvolatile memory devices 500 are connected to the associated global bit lines 525a, ..., 525n.

The source line select control sub-circuit 553 receives the decoded program, erase, and read timing and control signals from the control decoder 605 and the decoded addresses from the address decoder 625. The source line select control sub-circuit 553 selects which of the source line select signals 575a, ..., 575b that activates the source lines select transistors 565a, ..., 565n that connects the local source lines 530a, 530b, ..., 530n-1, and 530n to which the selected NOR flash nonvolatile memory device 500 is connected to the associated global source lines 540a, ..., 540n.

The word line voltage control circuit 552 includes a program voltage generator 635, an erase voltage generator 640, a read voltage generator 645, and a row selector 650. The program voltage generator 635 has a pulsed incremental voltage generator 636 that provides a pulsed voltage that incrementally increases from approximately 15.0V to approximately +20.0V for more precisely setting the voltage threshold of the NMOS NAND flash floating-gate transistors 515a and 515b of FIG. 8. A positive program voltage generator 637 provides a voltage level of approximately +5.0V in one embodiment and approximately +2.5V in a second embodiment for inhibiting a disturb programming of the non-selected NMOS NAND flash floating-gate transistors 515a and 515b of FIG. 8. In the second embodiment the erased and programmed conditions are reversed as described in FIGS. 7a-7d. The negative program voltage generator 638 provides the necessary negative voltage level of approximately -10.0V for programming the NMOS NAND flash floating-gate transistors 515a and 515b of FIG. 8 according to the voltage distributions of FIGS. 7a-7d. The ground reference voltage source 639 is provided for isolating all the two NMOS NAND flash floating-gate transistors 515a and 515b of arrays within a NOR flash nonvolatile memory device 500 of FIG. 8 to prevent disturbing of the established programming of those NMOS NAND flash floating-gate transistors 515a and 515b of FIG. 8.

The erase voltage generator 640 has a positive erase voltage generator 642 to provide the necessary positive voltage for the erase of the first embodiment the NOR flash nonvolatile memory device 500 for the non-selected word lines to prevent disturbing the programming of the non-selected NMOS NAND flash floating-gate transistors 515a and 515b of FIG. 8. In the second embodiment, the positive erase voltage generator 642 provides the voltage level necessary for erasing the NMOS NAND flash floating-gate transistors 515a and 515b of FIG. 8. The erase voltage generator 640 has a negative erase voltage generator 643 for erasing the NMOS NAND flash floating-gate transistors 515a and 515b of FIG. 8 in the first embodiment. In the second embodiment the non-selected word lines are set to the ground reference voltage level 644.

The read voltage generator 645 has a first high read voltage generator 646 to provide the necessary read voltage VH to the control gates of the selected word line of the NMOS NAND flash floating-gate transistors 515a and 515b of FIG. 8 for reading single level cell data. The read voltage generator 645 has a second and a third high read voltage generator 647 and 648 to provide the read voltages VH1 and VH2 to the selected control gates of the NMOS NAND flash floating-gate transistors 515a and 515b of FIG. 8 for reading the multi-level cell data. The read voltage generator 645 provides a power supply voltage source generator 649 to the control gates of the NMOS NAND flash floating-gate transistors 515a and 515b of FIG. 8 for the single level cell data.

The row voltage control circuit 550 has a row selector 650 for transferring the program, erase, and read voltages from the program voltage generator 635, the erase voltage generator 640, and the read voltage generator 645 to the selected word lines 545a, 545b, ..., 545m.

Figure 10:
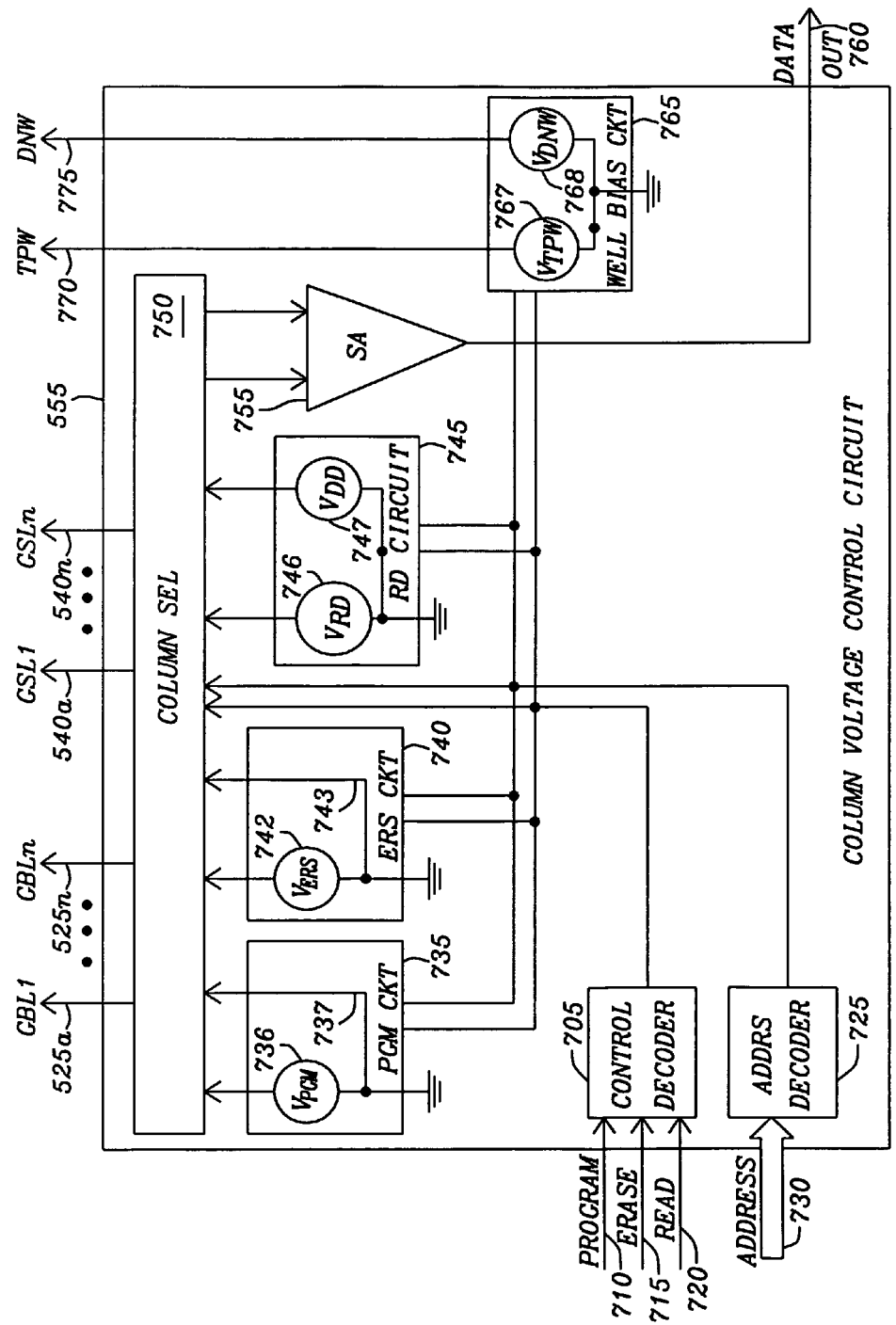
FIG. 10 is a schematic diagram of column voltage control circuit of the NOR flash nonvolatile memory device of FIG. 8 embodying the principals of the present invention.

Refer now to FIG. 10 for a description of the column voltage control circuit 555. The column voltage control circuit 555 has a control decoder 705 that receives program timing and control signals 710, erase timing and control signals 715, and read timing and control signals 720. The control decoder 705 decodes the program timing and control signals 710, erase timing and control signals 715, and read timing and control signals 720 to establish the operation of the NOR flash nonvolatile memory device 500. The column voltage control circuit 555 has an address decoder 725 that receives and decodes an address signal 730 that provides the locations of the selected floating-gate NMOS NAND flash cell 510 that are to be programmed, erased, or read.

The column voltage control circuit 555 includes a program voltage generator 735, an erase voltage generator 740, a read voltage generator 745, and a column selector 750. The program voltage generator 735 has a program voltage source 736 that provides a program inhibit voltage of approximately +10.0V to the drains and sources of the non-selected NMOS NAND flash floating-gate transistors 515a and 515b of FIG. 8 for the first embodiment to inhibit programming of the non-selected NMOS NAND flash floating-gate transistors 515a and 515b. The program voltage source 736 provides a voltage level of approximately +5.0V to the drain of the selected NMOS NAND flash floating-gate transistors 515a and 515b of FIG. 8 for the second embodiment during the program operation. A ground reference voltage level 737 is provided to drain and source of the selected NMOS NAND flash floating-gate transistors 515a and 515b of FIG. 8 during the program operation of the first embodiment. In certain of the non-selected NMOS NAND flash floating-gate transistors 515a and 515b of FIG. 8, the ground reference voltage level 737 is provided to further inhibit the programming of the non-selected NMOS NAND flash floating-gate transistors 515a and 515b.

The erase voltage generator 740 has a erase voltage source 742 to provide the necessary positive voltage for the erase of the first embodiment the NOR flash nonvolatile memory device 500. The sources and drains of the non-selected NMOS NAND flash floating-gate transistors 515a and 515b of FIG. 8 are set to the ground reference voltage level 743.

The read voltage generator 745 has a moderately high read voltage source 747 to provide the necessary read voltage VHD to the drains of the selected of the NMOS NAND flash floating-gate transistors 515a and 515b of FIG. 8 for reading multi-level cell data. The read voltage generator 745 provides a power supply voltage source generator 747 to the drain of the NMOS NAND flash floating-gate transistors 515a and 515b of FIG. 8 for the single level cell data.

The column voltage control circuit 550 has a column selector 750 for transferring the program, erase, and read voltages from the program voltage generator 735, the erase voltage generator 740, and the read voltage generator 745 to the selected bit lines 525a, 525b, . . . , 525m and source bit lines 540a, 540b, . . . , 540m.

Figures 11A, 11B:
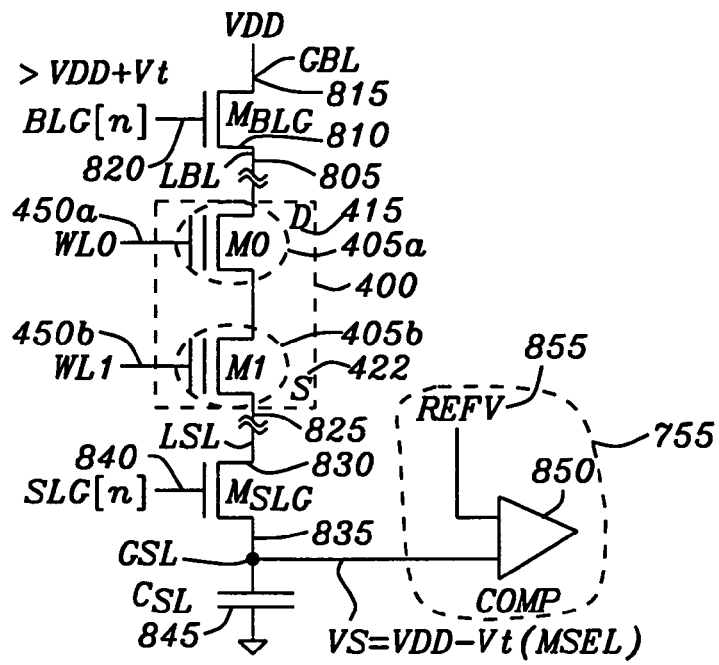
FIG. 11a is a schematic diagram of a voltage follower sensing circuit for a single level programming of various embodiments of the two transistor floating-gate NMOS NOR flash cell of the present invention.
FIG. 11b is a table for the biasing voltages for reading the single level programming of various embodiments of the two transistor floating-gate NMOS NOR flash cell of the present invention.

FIG. 11a is a schematic diagram of a voltage follower sensing circuit for a single level programming of various embodiments of the NMOS NOR flash memory cell 400 of FIG. 4a. The schematic diagram illustrates the two NMOS NAND flash floating-gate transistors 405a and 405b of a column of NMOS NAND flash floating-gate transistors. The drain 415 of the topmost of the NAND flash floating-gate transistors 405a and 405b is connected to the local bit line 805 that is then connected through the bit line select transistor 810 to the global bit line 815. The global bit line is connected to the column voltage control circuit 550 of FIG. 8. The gate of the bit line select transistor 810 is connected to the bit line select control sub-circuit 551 of FIG. 8 to receive the activation signal to activate the bit line select transistor 810 to connect the drain 415 of the topmost flash floating-gate transistor 405a to the power supply voltage source VDD.

The source 422 of the bottommost flash floating-gate transistor 405b is connected to the local source line 825. The local source line 825 is connected through the source line select transistor 830 to the global bit line 835. The global bit line 835 is connected to the sense amplifier 755 of the column voltage control circuit 550 of FIG. 10. The sense amplifier has a comparator 850 with one terminal connected to the global bit line 835 and a second terminal is connected to a reference voltage source 855. The reference voltage source 855 has a voltage level that placed between the voltage levels of the threshold voltage level representing the logical "1" data and the logical "0" data. The gate of the source line select transistor 830 is connected to the source line voltage control sub-circuit 553 of the row voltage control circuit 550 of FIG. 8. The source line voltage control sub-circuit 553 provides the voltage level necessary to activate the source line select transistor 830 to connect the local source line 825 and thus the source 422 of the NMOS NOR flash memory cell 400 to the global source line 835. When the floating-gate transistors 405a and 405b are activated, they act as a voltage follower with the voltage developed at the source line capacitance 845 being equal to the power supply voltage source less the programmed threshold voltage ($Vs=VDD-Vt_{MSEL}$) of the selected floating-gate transistor 405a or 405b. The non-selected floating-gate transistor 405a or 405b is driven such that it has a minimal voltage drop. Dependent upon the programmed threshold voltage level of the selected floating-gate transistor 405a or 405b, the output voltage of the comparator 850 will represent the logical "1" or logical "0" represented by the programmed threshold voltage.

Refer now to FIG. 11b for a discussion of the biasing voltages for reading the single level programming of NMOS NOR flash memory cell 400. To read the SLC-storage of the topmost transistor of the flash floating-gate transistors 405a and 405b, the first word line WL0 450a is set to the voltage level of the power supply voltage source VDD. Currently, the power supply voltage source VDD is either approximately +1.8V or approximately +3.0V. The second word line WL1 450b is set to a relatively high read voltage level of greater than +6.0V to turn on the second floating-gate transistor 405b. The drain of the topmost floating-gate transistor 405a is set to the power supply voltage source VDD through the local bit line 805 and the global bit line 815. If the floating-gate transistor 405a is programmed to have the first threshold voltage level Vt0 (from approximately −0.75V to approximately −0.25V), the voltage level VS0 at the source 422 of the bottommost floating-gate transistor 405b and thus the first input of the comparator 850 is approximately the voltage level of the power supply voltage source VDD. If the floating-gate transistor 405a is programmed to have the second threshold voltage level Vt1 (greater than +3.0V), the voltage level VS1 at the source 422 of the bottommost floating-gate transistor 405b and thus the first input of the comparator 850 is approximately the voltage level of the ground reference voltage (0.0V). The output of the comparator 850 then assumes the logic state indicated by the threshold voltage programmed to the topmost floating-gate transistor 405a.

To read the SLC-storage of the bottommost transistor of the flash floating-gate transistors 405a and 405b, the second word line WL1 450b is set to the voltage level of the power supply voltage source VDD. The first word line WL0 450a is set to a relatively high read voltage level of greater than +6.0V to turn on the first floating-gate transistor 405a. The drain of the bottommost floating-gate transistor 405b is set to the power supply voltage source VDD through the topmost floating-gate transistor 405a, the local bit line 805, and the global bit line 815. If the bottommost floating-gate transistor 405b is programmed to have the first threshold voltage level Vt0 (from approximately −0.75V to approximately −0.25V), the voltage level VS0 at the source 422 of the bottommost floating-gate transistor 405b and thus the first input of the comparator 850 is approximately the voltage level of the power supply voltage source VDD. If the floating-gate transistor 405b is programmed to have the second threshold voltage level Vt1 (greater than +3.0V), the voltage level VS1 at the source 422 of the bottommost floating-gate transistor 405b and thus the first input of the comparator 850 is approximately is approximately the voltage level of the ground reference voltage (0.0V) because the gate voltage of VDD of the floating-gate transistor 405b is less than Vt1. As a result, bottommost floating-gate transistor 405b is in a non-conductive state so that no voltage from the local bit line 805 would be passed to the local source line 830, thus the voltage level VS1=0V. The output of the comparator 850 then assumes the logic state indicated by the threshold voltage programmed to the bottommost floating-gate transistor 405*b*.

If the NMOS NOR flash memory cell 400 is not selected for reading when another NMOS NOR flash memory cell 400 is selected in an array of NMOS NOR flash memory cells 400, the control gates of the non-selected flash floating-gate transistors 405*a* and 405*b* of non-selected NMOS NOR flash memory cells 400 are set to the ground reference voltage to turn off the charge retaining transistors.

Figures 11C, 11D:
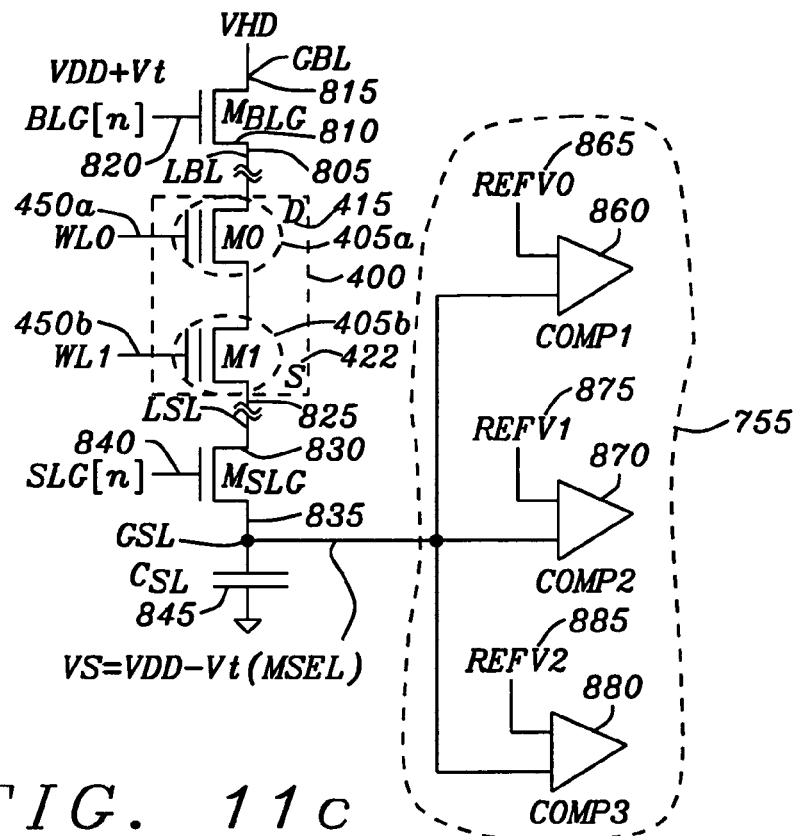
FIG. 11c is a schematic diagram of a voltage follower sensing circuit for multiple level programming of various embodiments of the two transistor floating-gate NMOS NOR flash cell of the present invention.
FIG. 11d is a table for the biasing voltages for reading multiple level programming of various embodiments of the two transistor floating-gate NMOS NOR flash cell of the present invention.

FIG. 11*c* is a schematic diagram of a voltage follower sensing circuit for a multi-level programming of various embodiments of the NMOS NOR flash memory cell 400 of FIG. 4*a*. The schematic diagram illustrates the two NMOS NAND flash floating-gate transistors 405*a* and 405*b* of a column of NMOS NAND flash floating-gate transistors as described in FIG. 11*a* with the exception that the global bit line is now set to a voltage level of first higher read voltage source $V_{HD}$.

The global source line 835 in this embodiment is connected to the sense amplifier 755 of the column voltage control circuit 550 of FIG. 10. The sense amplifier 755 in this instance has three comparators 860, 870, and 880. Each of the three comparators 860, 870, and 880 has a first terminal connected to the global source line 835 and a second terminal is connected to a reference voltage source. The second terminal of the first comparator 860 is connected to the first reference voltage source 865, REFV0. The second terminal of the second comparator 870 is connected to the second reference voltage source 875, REFV1. The second terminal of the third comparator 880 is connected to the third reference voltage source 885, REFV2. The three reference voltage sources 865, 875, and 885 have a voltage level that placed between the voltage levels of the threshold voltages representing the logical values ("00", "01", "10", "11") of the data. The gate of the source line select transistor 830 is connected to the source line voltage control sub-circuit 553 of the row voltage control circuit 550 of FIG. 8. The source line voltage control sub-circuit 553 provides the voltage level necessary to activate the source line select transistor 830 to connect the local source line 825 and thus the source 422 of the NMOS NOR flash memory cell 400 to the global source line 835. When the floating-gate transistors 405*a* and 405*b* are activated, they act as a voltage follower with the voltage developed at the source line capacitance 845 being equal to the power supply voltage source less the programmed threshold voltage (Vs=VDD−VtMSEL) of the selected floating-gate transistor 405*a* or 405*b*. The non-selected floating-gate transistor 405*a* or 405*b* is driven such that it has a minimal voltage drop. Dependent upon the programmed threshold voltage level of the selected floating-gate transistor 405*a* or 405*b*, the output voltage of the comparator 850 will represent the logical values ("00", "01", "10", "11") of the data represented by the programmed threshold voltage. It should be noted that the structure as described is for a two bit multi-level cell. It is keeping with the intent of this invention that any number of logical values for the data may be retained by the floating-gate transistors 405*a* and 405*b*.

Refer now to FIG. 11*d* for a discussion of the biasing voltages for reading the multi-level programming of NMOS NOR flash memory cell 400. To read the topmost transistor of the flash floating-gate transistors 405*a* and 405*b*, the first word line WL0 450*a* is set to the voltage level of a first higher read voltage source VH0. The first higher read voltage source VH0 is set to a voltage level of approximately 4.0V. The second word line WL1 450*b* is set to a second higher read voltage level VH1 of greater than +7.0V to turn on the second floating-gate transistor 405*b*. The drain of the topmost floating-gate transistor 405*a* is set to third relatively higher voltage source VHD (>4.0V) through the local bit line 805 and the global bit line 815.

If the floating-gate transistor 405*a* is programmed to have the first threshold voltage level Vt0 (from approximately −0.75 to approximately −0.25V), the voltage level VS0 at the source 422 of the bottommost floating-gate transistor 405*b* and thus the first input of the comparator 850 is approximately the voltage level of the third higher read voltage source VHD. If the floating-gate transistor 405*a* is programmed to have the second threshold voltage level Vt1 (approximately +1.0V), the voltage level VS1 at the source 422 of the bottommost floating-gate transistor 405*b* and thus the first input of the comparator 850 is approximately the voltage level approximately 3.0V. If the floating-gate transistor 405*a* is programmed to have the third threshold voltage level Vt2 (approximately 2.0V), the voltage level VS2 at the source 422 of the bottommost floating-gate transistor 405*b* and thus the first input of the comparator 850 is approximately the voltage level of approximately 2.0V. If the floating-gate transistor 405*a* is programmed to have the second threshold voltage level Vt3 (approximately +3.0V), the voltage level VS3 at the source 422 of the bottommost floating-gate transistor 405*b* and thus the first input of the comparator 850 is approximately the ground reference voltage (1.0V). The output of the comparator 850 then assumes the logic state indicated by the threshold voltage programmed to the topmost floating-gate transistor 405*a*.

To read the multi-level programming of the bottommost transistor of the flash floating-gate transistors 405*a* and 405*b*, the second word line WL1 450*b* is set to the voltage level of the VHD. The first word line WL0 450*a* is set to a relatively high read voltage level of greater than +6.0V to turn on the first floating-gate transistor 405*a*. The voltage level of the global source line, GSL, of the bottommost select transistor gated by SLG[n], is set through the bottommost floating-gate transistor 405*b*, the topmost floating-gate transistor 405*a*, the local bit line 805, the top select transistor, Msel, gated by BLG[n], and the global bit line 815. The gate voltage of the top and bottom select transistors have to be coupled to the high read voltage level plus the threshold level (VHD+Vt) to fully pass the full VHD voltage from GBL to GSL.

If the floating-gate transistor 405*b* is programmed to have the first threshold voltage level Vt0 (from approximately −0.75 to approximately −0.25V), the voltage level VS0 at the source 422 of the bottommost floating-gate transistor 405*b* and thus the first input of the comparator 850 is approximately the voltage level of the third higher read voltage source VHD. If the floating-gate transistor 405*b* is programmed to have the second threshold voltage level Vt1 (approximately +1.0V), the voltage level VS1 at the source 422 of the bottommost floating-gate transistor 405*b* and thus the first input of the comparator 850 is approximately the voltage level approximately 3.0V if VHD is 4.0V. If the floating-gate transistor 405*b* is programmed to have the third threshold voltage level Vt2 (approximately 2.0V), the voltage level VS2 at the source 422 of the bottommost floating-gate transistor 405*b* and thus the first input of the comparator 850 is approximately the voltage level of approximately 2.0V. If the floating-gate transistor 405*b* is programmed to have the second threshold voltage level Vt3 (approximately +3.0V), the voltage level VS3 at the source 422 of the bottommost floating-gate transistor 405*b* and thus the first input of the comparator 850 is approximately 1.0V. The output of the comparator 850 then assumes the logic state indicated by the threshold voltage programmed to the bottommost floating-gate transistor 405b.

In both embodiments of the read operation of the NMOS NOR flash memory cell 400 of FIGS. 11a and 11c, the triple P-well diffusion 430 of FIGS. 4b-2 and 4c-2 is connected to the ground reference voltage level (0.0V). The deep n-well diffusion 435 of FIGS. 4b-2 and 4c-2 is connected to the power supply voltage source VDD.

If the NMOS NOR flash memory cell 400 is not selected for reading when another NMOS NOR flash memory cell 400 is selected in an array of NMOS NOR flash memory cells 400, the control gates of the non-selected flash floating-gate transistors 405a and 405b of non-selected NMOS NOR flash memory cells 400 are set to the ground reference voltage to turn off the charge retaining transistors.

FIGS. 12a-12e are tables of the erase biasing voltages for erasing the two transistor floating-gate NMOS NOR flash cell of FIGS. 4a, 4b-1, 4b-2, 4c-1, and 4c-2. Referring now to FIGS. 12b-12e, the erase bias conditions in the four tables provide the erase conditions are to make the voltage drop between the bulk channel node 432a and 432b between the drains 415 and 420 and sources 420 and 422 and the control gate 425a or 425b of FIGS. 4a, 4b-1, 4b-2, 4c-1 and 4c-2 is set to a voltage level of approximately +20.0V during the Fowler-Nordheim channel erase. In FIG. 12a the selected word line 450a or 450b and thus the control gate 425a or 425b is set to a negative erase voltage level of approximately −10.0V and the drains 415 and 420, sources 420 and 422, the triple P-well diffusion 430, and the deep N-well diffusion 435 is set to a positive erase voltage level of approximately +10.0V. The unselected word lines 450a or 450b and thus the unselected control gates 425a or 425b are set to an inhibit erase voltage level of approximately +10.0V.

In FIG. 12b, the negative erase voltage level is approximately −15.0V, the positive erase voltage level is approximately +5.0V, and the positive inhibit voltage level is approximately +5.0V. In FIG. 12c the negative erase voltage level is −20.0V, the positive erase voltage level is approximately 0.0V and the positive inhibit voltage level is approximately 0.0V. In FIG. 12d, the voltage levels are reverse and the negative erase voltage level is approximately 0.0V and the positive erase voltage is approximately +20.0V. Each of the voltage level as shown in FIGS. 12a-12d employ a Fowler-Nordheim channel tunneling phenomena to decrease the voltage threshold hold of the selected NMOS NAND flash floating-gate transistor 405a or 405b For the non-selected two transistor floating-gate NMOS NAND flash cells of FIGS. 4a, 4b-1, 4b-2, 4c-1, and 4c-2 not sharing the same triple P-well diffusion 430 and deep N-well diffusion 435, the unselected word line 450a or 450b and thus the control gate 425a or 425b, the drains 415 and 420, sources 420 and 422, and the triple P-well diffusion 430 are set to the voltage level of approximately the ground reference voltage level. The deep N-well diffusion 435 is set to the voltage level of the power supply voltage source VDD.

For the sub-arrays (often blocks of 512 Kb or 4 Kb) of an array of the floating-gate NMOS NAND flash cells, those sub-arrays that are not selected for erasing and have their deep N-well set to the positive erase voltage of +20V have their word lines, drains, sources, and triple P-well diffusion set to the ground reference voltage level. Those sub-arrays that are in different deep N-well diffusion that are not selected have their word lines, drains, sources, triple P-well, and the deep N-well diffusion set to the ground reference voltage level.

Refer now to FIG. 12e for a discussion of the alternate erasing process where the erase and program threshold voltage levels are reversed. In this case, the selected word line 450a or 450b and thus the control gate 425a or 425b are set to a positive programming voltage level of approximately +20.0V. The control gate 425a or 425b, the drains 415 and 420, sources 420 and 422, and the triple P-well diffusion 430 are set to the ground reference voltage level (0.0V). The deep N-well 435 is set to the voltage level of the power supply N-well. The sets the erased threshold voltage condition to the positive voltage level and the programmed threshold voltage condition to the more negative voltage level as shown in FIGS. 7a-7d.

FIGS. 13a and 13b are tables of the program biasing voltages for programming the two transistor floating-gate NMOS NAND flash cell of FIGS. 4a, 4b-1, 4b-2, 4c-1, and 4c-2. Prior to programming selected NMOS NAND flash floating-gate transistor 405a or 405b of two transistor floating-gate NMOS NAND flash cell of FIGS. 4a, 4b-1, 4b-2, 4c-1, and 4c-2, the cells must be erased as described above. In an array of the two transistor floating-gate NMOS NAND flash cells as shown in FIG. 8 the erase operation is performed for a page or block of the cells.

For the programming of the selected NMOS NAND flash floating-gate transistor 405a or 405b of FIGS. 4a, 4b-1, 4b-2, 4c-1, and 4c-2, the word line selected word line 450a or 450b and thus the control gate 425a or 425b are set to a positive program voltage level of from approximately +15.0V to approximately +20.0V. The drains 415 and 420 and sources 420 and 422 and the bulk 432a and 432b through the triple P-well 430 are set to the ground reference voltage level (0.0V). The non-selected NMOS NAND flash floating-gate transistor 405a or 405b have the word line 450a or 450b connected to their control gate 425a or 425b set to an intermediate inhibit program voltage level of less than approximately +5.0V. In the non-selected floating-gate NMOS NAND flash cells within an array as shown in FIG. 8 that are on the selected word line 450a or 450b have their drains and source set to a positive program inhibit voltage level of from approximately +7.0V to approximately +10.0V. Those non-selected floating-gate NMOS NAND flash cells within an array as shown in FIG. 8 that share the bit lines 455a and 455b and source lines 460a and 460b with those that have the positive inhibit voltage level, have their word lines 450a and 450b set to the intermediate inhibit program voltage of +5.0V. Those non-selected floating-gate NMOS NOR flash cells that do not have their word lines 450a and 450b or bit lines 455a and 455b or source lines 460a and 460b connected to the positive program voltage or the positive program inhibit voltage are set to the ground reference voltage level (0.0V). As it is well known that the higher the positive program voltage applied to the control gate 425a or 425b, the higher the threshold voltage Vt after programming. In order to maintain an accurate threshold voltage control over the NMOS NAND flash cell during the program operation, the gate voltage is applied with an initial positive program voltage level of approximately +15.0V to approximately +16.0V. The positive program voltage level is then iteratively increased in small increments with each pulse of the iteration programming process. The above programming voltage levels apply for programming either the single-level cell or the multi-level cell with the threshold voltage levels shown in FIGS. 6a-6d.

Gradually increasing the negative gate voltage in small increments along with the preferable fixed optimized drain voltage and the floating source of the selected program cells in the selected block. This is the iterative program and program verification steps. For example, the drain (local BL) voltage is coupled to a fixed +5V along with the local SL in floating. The preferable biased conditions are shown in the table of FIG. 8f to program the selected cell of M0. The gate voltage of −10V is applied to WL0 of the selected cell of M0. It may start from −5V and is then gradually ramped to −10V. Thus In other words, the cell's Vt can be accurately controlled the value that falls within the desired value.

Refer now to FIG. 13b for a description of the programming voltage levels of the reversed program and erase conditions as shown in FIGS. 7a-7b. In this example the selected NMOS NAND flash floating-gate transistor 405a or 405b has the selected word lines 450a or 450b set to a negative program voltage level of approximately −10.0V. The drain 415 and 420 is gradually ramped to an intermediate positive drain voltage level of approximately +5.0V. The sources 420 is disconnected to be floating. The selected NMOS NOR flash cell is iteratively programmed and the verified to achieve the accurate cell threshold voltage after the program operation. In this case the program condition is based the Fowler-Nordheim edge tunneling program process. The popular FN-edge program is used to reduce the selected cells' Vt after program. But the final Vt after FN-edge program of the selected program cells has to be maintained in positive value to avoid the false read due to the BL leakage through the unselected cells in the selected block. The FN-edge happens to those edges between Drain node and Gate node of the selected NAND cells of the selected block of the present invention.

Alternately, the negative program voltage level may be gradually incremented from approximately −7.0V to approximately −10.0 v. The intermediate positive drain voltage is now fixed at approximately +5.0V. In this case the incremental increase in the negative program voltage level is approximately 0.3V in each iteration step.

The non-selected NMOS NAND flash floating-gate transistor 405a or 405b are inhibited from being programmed by setting the non-selected word lines 450a or 450b to a positive inhibit voltage level of approximately +2.5V. The drains 415 of the non-selected NMOS NAND flash floating-gate transistor 405a or 405b and the triple P-well diffusion 430 are set to ground reference voltage level (0.0V) and the deep N-well diffusion 435 is set to the voltage level of the power supply voltage source VDD.

The electrons in the floating gate of the selected floating-gate NMOS NOR flash cell are expelled from the floating gates 445a or 445b. As a result, the threshold voltage level of the selected floating-gate NMOS NOR flash cell can be well controlled very accurately for the threshold voltage levels for the single-level cell and the multi-level cell.

Figure 14:
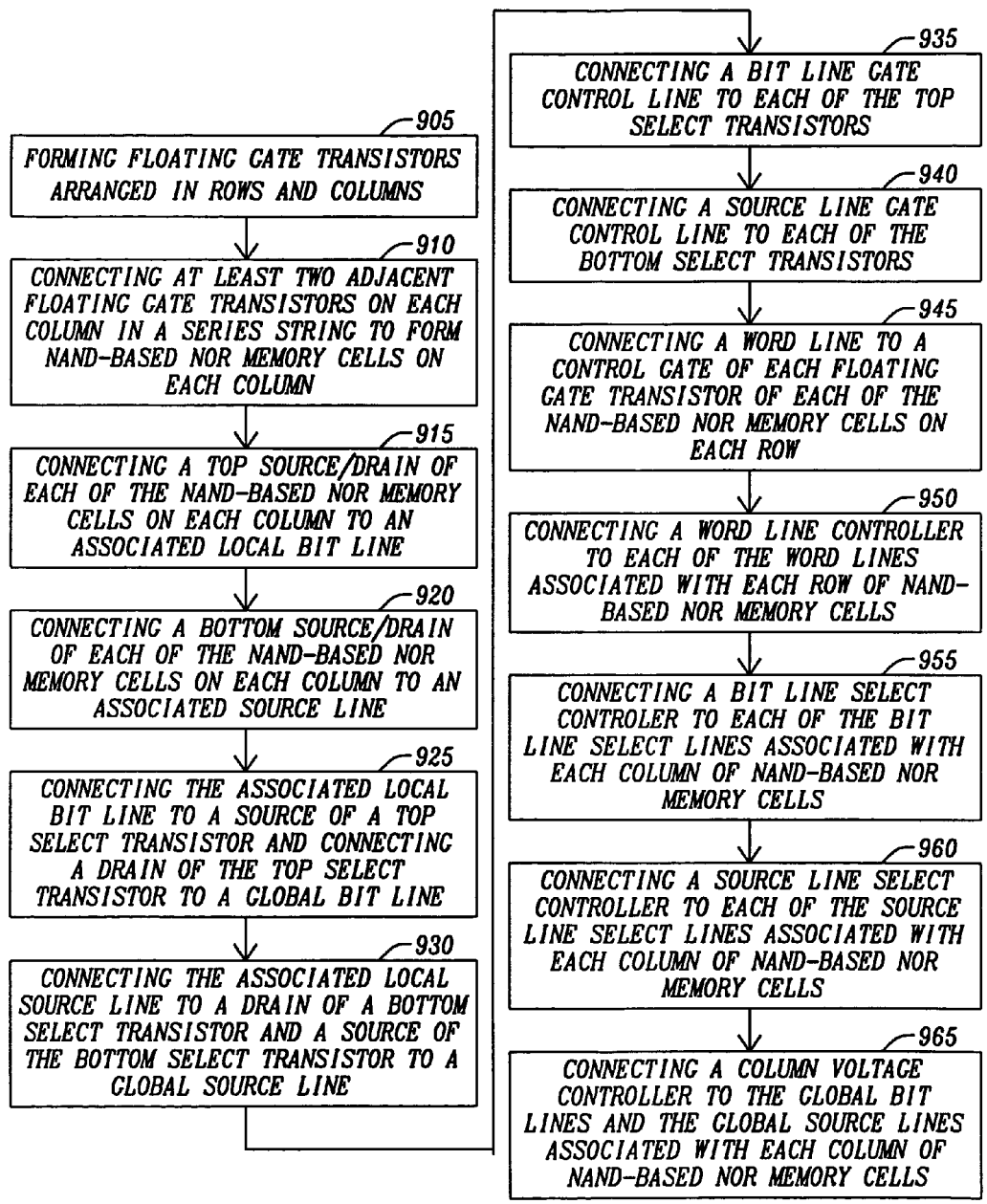
FIG. 14 is flow chart for forming a NOR flash nonvolatile memory device embodying the principals of the present invention.

FIG. 14 is flow chart for forming a NOR flash nonvolatile memory device embodying the principals of the present invention. An array of floating gate transistors are formed (Box 905) on a substrate. The floating gate transistors are arranged in a matrix of rows and columns. At least two of the column adjacent floating gate transistors are connected (Box 910) in series to form a NAND series string of NOR memory cells. The drain of the topmost floating gate transistor of the NAND based NOR flash memory cells on each column is connected (Box 915) to an associated bit line. The source of the bottommost floating gate transistor of the NAND based NOR flash memory cells on each column is connected (Box 920) to an associated source line.

The local bit line is connected (Box 925) through a top bit line select transistor to an associated global bit line. The source of the top bit line select transistor is connected to the local bit line and the drain of the top bit line select transistor is connected to the global bit line. The local source line is connected (Box 930) through a bottom source line select transistor to an associated global source line. The source of the bottom source line select transistor is connected to the local source line and the drain of the bottom source line select transistor is connected to the global source line.

A bit line gate select control line is connected (Box 935) to the gate of the top bit line select transistor and a source line gate select control line is connected (Box 940) to the gate of the bottom source line select transistor. On each row of the array of NAND based NOR flash memory cells, the control gate of each floating gate transistor is connected (Box 945) to an associated word line. Each of the word lines for each of the rows of floating gate transistors is connected (Box 950) to a word line voltage controller to provide the necessary biasing voltages for the program, erase, and read operations of the array of NAND based NOR flash memory cells. Each of the bit line select control lines is connected (Box 955) to a bit line select controller for controlling the activation of the bit line select transistors to selectively connect a selected local bit line to a global bit line. Similarly, each of the source line select control lines is connected (Box 960) to a source line select controller for controlling the activation of the source line select transistors to selectively connect a selected local source line to a global source line.

Each of the global bit lines and the column bit lines is connected (Box 965) to a column voltage controller. The word line voltage controller and the column voltage controller provide the appropriate voltages to NAND based NOR flash memory cells as described above for programming, erasing, and reading of the NAND based NOR flash memory cells.

Figure 15:
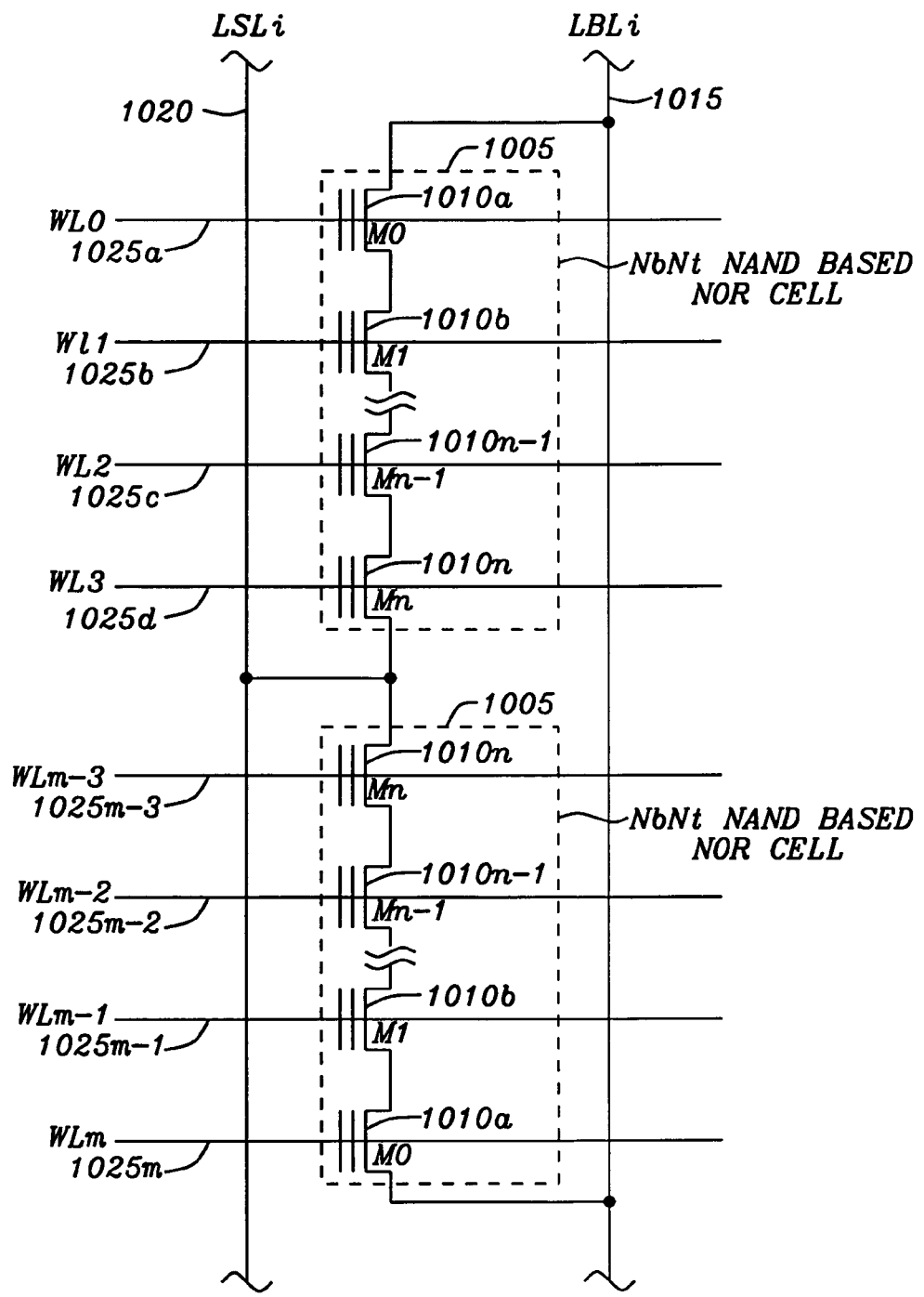
FIG. 15 is schematic diagram of an embodiment of a multiple transistor floating-gate NMOS NOR flash cell of the present invention.

FIG. 15 is schematic diagram of an embodiment of a NAND based multiple transistor floating-gate NMOS NOR flash memory array. In the NAND based NMOS NOR flash memory array of FIG. 8 each of the floating-gate NMOS NOR flash cells has two floating gate transistors. In FIG. 15, each of the floating-gate NMOS NOR flash cells 1005 has at least two of the floating gate transistors 1010a, 1010b, . . . , 1010n serially connected as described in FIG. 8 for the embodiment of two serial transistors. The drain of the topmost floating gate transistor 1010a is connected to the local bit line 1015 and the source of the bottommost floating gate transistor 1010n is connected to the local source line 1020. Each of the word lines 1025a, 1025b, . . . , 1025n is connected to the control gate of the floating gate transistors 1010a, 1010b, . . . , 1010n on the associated row of the NAND based NMOS NOR flash memory array. The number of bits stored in the floating-gate NMOS NOR flash cell for a single-level cell is one bit per one transistor so that the floating-gate NMOS NOR flash cell becomes designated as an n-bit/n transistor cell. In the multi-level cell the number bit is dependent on the number of threshold voltage levels being stored in each of the floating gate transistors 1010a, 1010b, . . . , 1010n.

The current market requirements for the present technology of a NOR Flash memory device is that the read access time is between approximately 100 nS to approximately 20 μS. The number of transistors in the NAND based NOR flash memory cells determines the performance of the cell. For instance the two transistor floating-gate NMOS NOR flash cell in the embodiment of FIGS. 4a, 4b-1, 4b-2, 4c-1, and 4c-2, the read access time is approximately 100 nS for NAND based NMOS NOR flash memory array having a capacity of from 1 Gb to 4 Gb. Alternately, a NAND based NMOS NOR flash memory array having a capacity of from 1 Mb to 4 Mb will have a read access time of from 20 ns to 50 ns. In the array, the read is a random access in the units of a Byte (8-bit), a Word (16-bit), or double-word (32-bit). The program unit is of a full page of 512 bytes or ½ page of 256-bytes. The erase unit size is performed in units of sectors (4K bytes for a small sector or 64K bytes for big sectors).

In other embodiments, the NAND based NMOS NOR flash memory cell has a serial string of 16 transistors or 32 transistors. With the longer strings the read access time decreases to approximately 20 μs for an array capacity from 1 Gb to 32 Gb. In this embodiment the read is a serial access in units of ½-page (256-bytes) or a full-page (512-bytes). Similarly, the program operation has a unit size of a full page of 512 bytes or ½ page of 256-bytes. The erase unit size is in the size of a sector 512 bytes×16 (8K bytes) or 512 bytes×32 (16K bytes).

In various embodiments, the NAND based floating-gate NMOS NOR flash memory cell may contain any number of transistors as described. However, to insure that the performance is adequate to meet the current requirements floating-gate NMOS NOR flash memory cell, a preferential design employs up to 15 serial transistors in the string of the NAND based floating-gate NMOS NOR flash memory cell.

In the embodiments as described above, the NAND based NMOS NOR flash memory cell contains floating gate transistors for charge storage. It is in keeping with the intent of this invention that the NAND based floating-gate NMOS NOR flash memory cell have SONOS charge trapping NAND transistors in each of the NAND strings of the NOR flash memory cell.

An integrated circuit device that includes arrays of NAND based flash memory cells may be constructed to have an array of NAND flash nonvolatile memory circuits and arrays of NAND based NMOS NOR flash memory cell that embody the concepts of the present invention. The arrays of the NAND based NMOS NOR flash memory cell may further be incorporated with volatile memory to form combinations of memory functions on a single integrated circuit die. Further, the NAND based NMOS NOR flash memory cell may have peripheral circuitry to enable the NAND based NMOS NOR flash memory cell to be used in reconfigurable logic applications such as programmed logic devices (PLD) or field programmable gate arrays (FPGA). An input address becomes the input logic variables that are decoded and inputs to the word line voltage control circuit of the NAND-like NOR flash memory device as shown in FIG. 8. The output signals from the column voltage control provide the product terms for further processing.

Figure 16A:
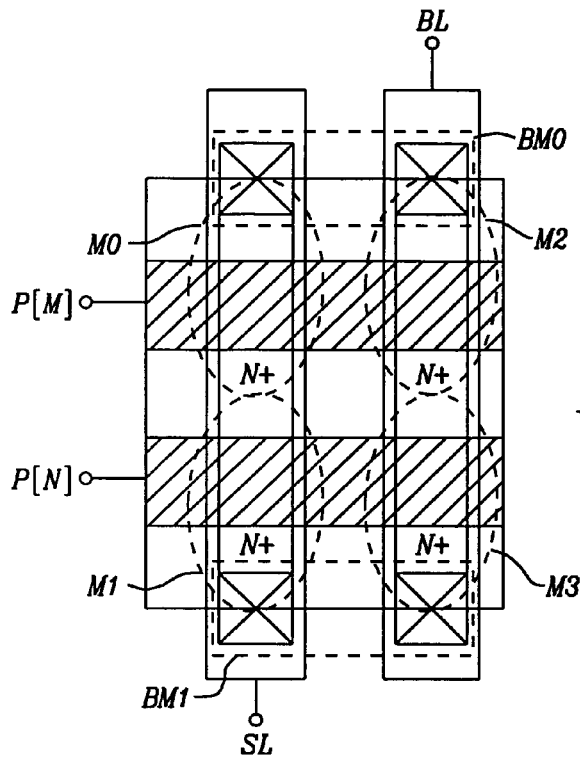
FIGS. 16a and 16b are a top plan view and schematic of an embodiment of a reconfigurable logic cell incorporating two two-transistor floating-gate NOR flash memory cells embodying the principles of the present invention.
Figure 16B:
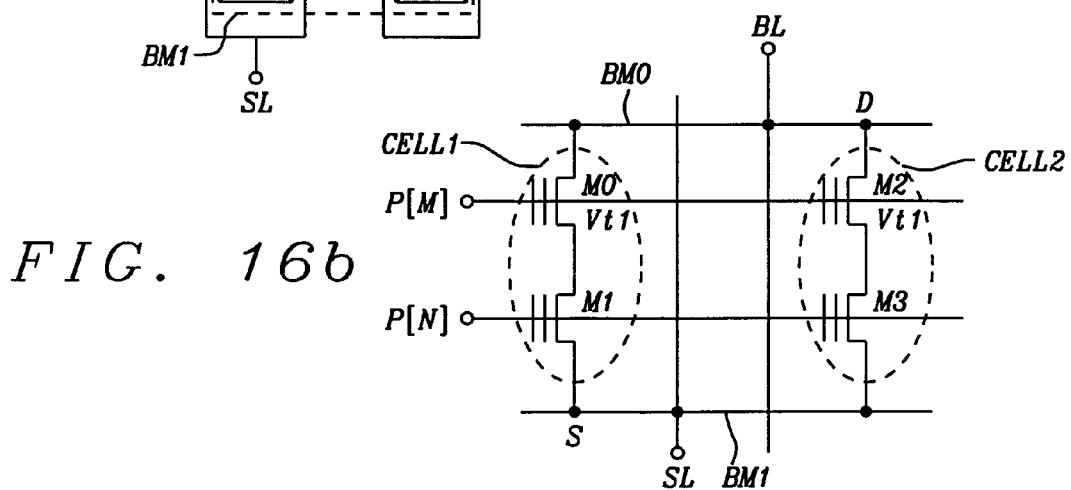

FIGS. 16a and 16b are a top plan view and schematic of an embodiment of a reconfigurable logic cell or programmable logic unit incorporating two two-transistor floating-gate NOR flash memory cells CELL1 and CELL2. The two-transistor floating-gate NOR flash memory cells CELL1 and CELL2 each include the floating gate transistors M0 and M1 and are structured as described in FIGS. 4a, 4b-1, 4b-2, 4c-1, and 4c-2. The drains of the floating gate transistors M0 are bridged with the first level metal connector BM0 and the sources of the floating gate transistors M1 are bridged with the first level metal connector BM1. The logic input line P[M] are applied to the control gates of the floating gate transistors M0 and logic input line P[N] is applied to the control gates of the floating gate transistors M1. The two-transistor floating-gate NOR flash memory cells CELL1 and CELL2 are connected in parallel to double an effective channel width of the floating gate transistors M0, M1, M2, and M3 without degrading a coupling ratio from the control gate to the floating gate of the floating gate transistors M0, M1, M2, and M3. As structured, one of the floating gate transistors M0 or M1 and M2 or M3 of each of the two-transistor floating-gate NOR flash memory cells CELL1 and CELL2 are activated as a select gate transistor and may be programmed with a select gating threshold voltage.

Figure 16C:
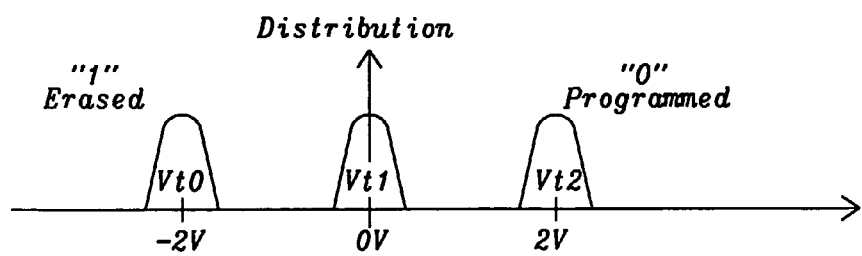
FIG. 16c is a plot of the threshold voltage levels of the embodiment of a reconfigurable logic cell incorporating two two-transistor floating-gate NOR flash memory cells embodying the principles of the present invention.

FIG. 16c is a plot of the threshold voltage levels of the embodiment of a reconfigurable logic cell incorporating two two-transistor floating-gate NOR flash memory cells CELL1 and CELL2 embodying the principles of the present invention. The programmed voltage is designated as −2.0V and the erased voltage is designated as +2.0V. The select gating threshold voltage is designated as approximately the ground reference voltage level (0.0V). In those embodiments where both of the floating gate transistors M0, M1, M2, and M3 are programmed to function as reconfigurable logic devices, one parallel pair M0 and M2 or M1 and M3 will act as a select gating transistor during a logic determination operation. In other embodiments, the floating gate transistors M0 and M2 are programmed to the select gating threshold voltage level.

FIGS. 17a-17e are tables of the operating conditions for the embodiment of the reconfigurable logic cell of FIGS. 16a and 16b embodying the principles of the present invention. In FIG. 17a, the programming operation is accomplished with a very large programming voltage level of from approximately 15.0V to approximately 20.0V is applied selectively between the control gates of the parallel pairs of the floating gate transistors M0 and M2 and M1 and M3 and the bulk of the floating gate transistors M0, M1, M2, and M3. If the floating gate transistors M0, M1, M2, and M3 are to be inhibited from programming, a program inhibit voltage level of approximately 10.0V is applied to the control gates, drains and sources of the inhibited floating gate transistors M0, M1, M2, and M3.

In FIGS. 17b-17e, the erasing operation is accomplish with a very large erase voltage level of from approximately −15.0V to approximately −20.0V is applied selectively between the control gates of the parallel pairs of the floating gate transistors M0 and M2 and M1 and M3 and the bulk of the floating gate transistors M0, M1, M2, and M3. If the floating gate transistors M0, M1, M2, and M3 are to be inhibited from erasing, an erase inhibit voltage level is applied to the control gates, drains, and sources of the inhibited floating gate transistors M0, M1, M2, and M3. FIGS. 17b-17c show various implementations to provide the very large erase voltage level between the control gates and the bulk of the floating gate transistors M0, M1, M2, and M3. The inhibit voltage levels will be modified as shown according to the implementation.

FIG. 17e illustrates a read operation to determine a logic state of the floating gate transistors M0, M1, M2, and M3. If the input voltage of the logic input line connected to a selected floating gate transistors M0 and M2 or M1 and M3 indicates a logic "0", the logic input line is set to the voltage level of the ground reference voltage level (0.0V). The selected floating gate transistor M0 and M2 or M1 and M3 being read is not activated sufficiently to generate a large current through the selected floating gate transistors M0 and M2 or M1 and M3. Alternately, if the logic input line connected to the selected floating gate transistors M0 and M2 or M1 and M3 indicates a logic "1", the voltage level of the logic input line is the voltage level of the power supply voltage source (Vdd). The selected floating gate transistors M0 and M2 or M1 and M3 is turned on and a larger current may be passed through the floating gate transistors M0 and M2 and M1 and M3 dependent on the threshold voltage level Vt0 or Vt2 of the selected parallel pair floating gate transistors M0 and M2 or M1 and M3. The output voltage level present at the source line is from greater than 10.0V to approximately 1.8V for a logic "0" state Vs0 and is approximately the voltage level of the ground reference voltage level (0.0V) for a logic "1" state Vs1.

Figure 18A:
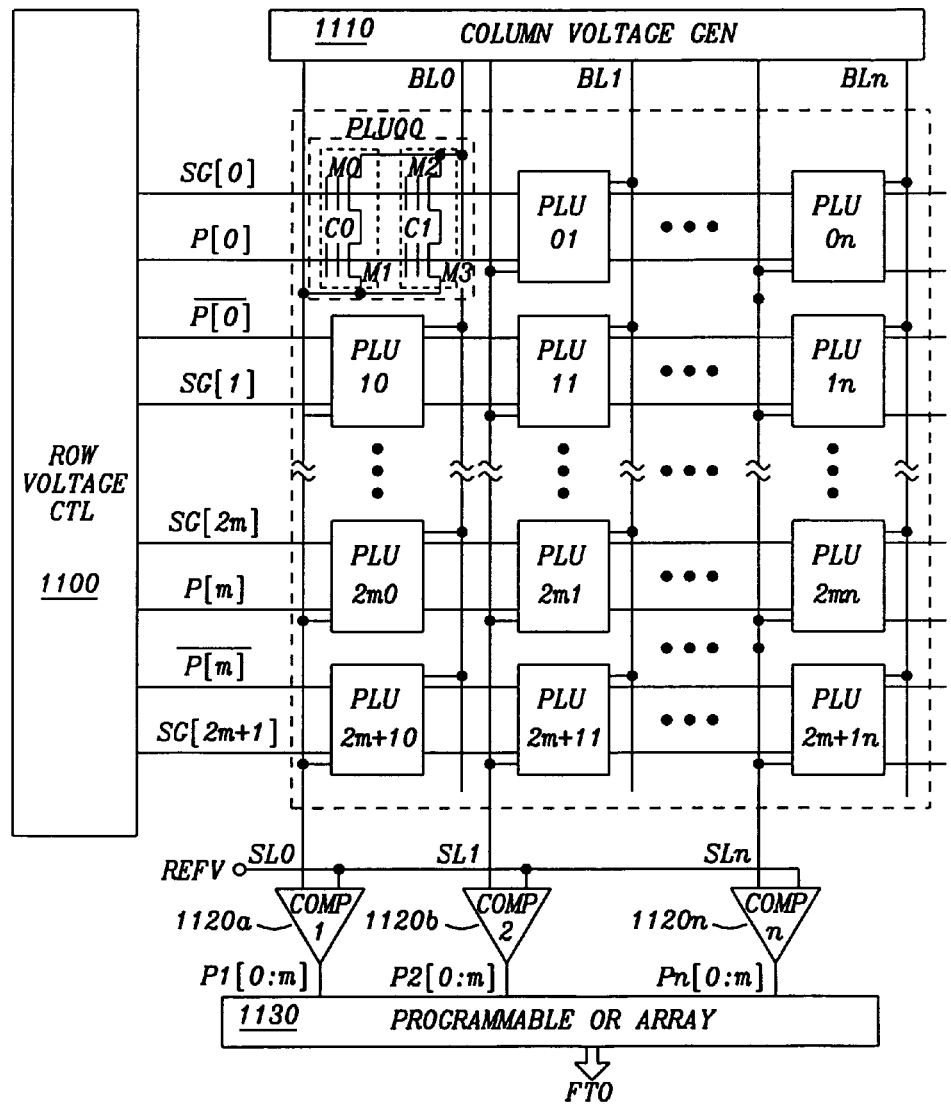
FIGS. 18a-18b are schematic diagrams of a NOR flash nonvolatile reconfigurable logic device embodying the principles of the present invention.
Figure 18B:
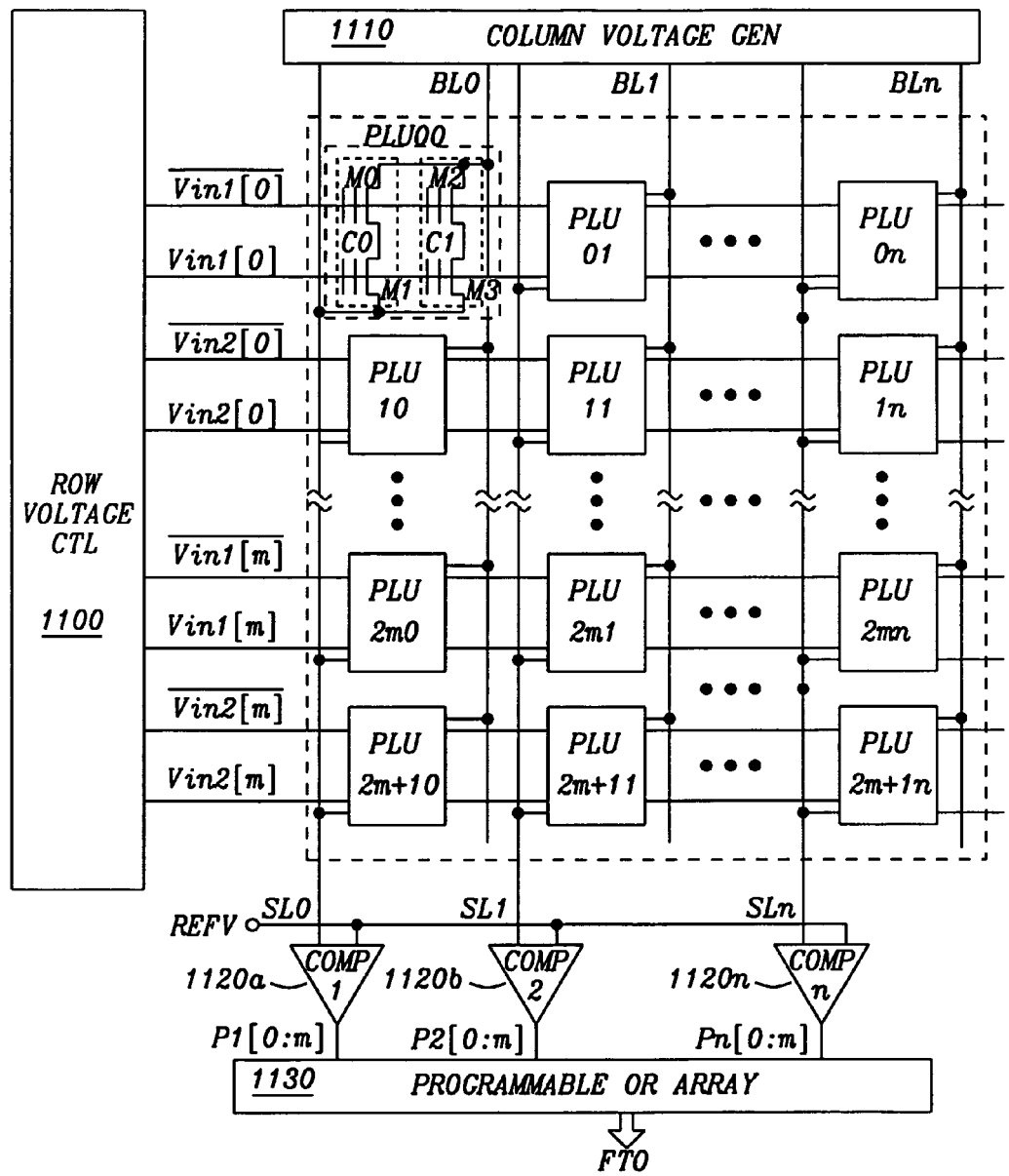

FIGS. 18a-18b are schematic diagrams of a NOR flash nonvolatile reconfigurable logic device embodying the principles of the present invention. In each embodiment of the NOR flash nonvolatile reconfigurable logic device, the programmable logic units PLU00, . . . , PLU2m+1n are arranged in rows and columns. Each of the programmable logic units PLU00, ..., PLU2m+1n are the reconfigurable logic units of FIGS. 16a and 16b. As described above, the programmable logic units PLU00, ..., PLU2m+1n incorporate the two-transistor floating-gate NOR flash memory cells CELL1 and CELL2 that each include the floating gate transistors M0, M1, M2, and M3. The row voltage control circuit 1100 is connected to the logic input lines. In FIG. 18a, each of the select gating lines SG[0], ..., SG[2m+1] are connected to each of the rows of the floating gate transistors M0 and M2 of each of the programmable logic units PLU00, ..., PLU2m+1n. Each of the logic input state lines provide the logic input state PM[0], $\overline{PM[0]}$ ..., PM[m], $\overline{PM[m]}$ to each of the rows of the programmable logic units PLU00, ..., PLU2m+1n. In FIG. 18b, the logic input states Vin1[0], $\overline{Vin1[0]}$, Vin2[0], $\overline{Vin2[0]}$ ..., Vin1[m], $\overline{Vin1[m]}$, Vin2[m], $\overline{Vin2[m]}$ may be the normal logic input signals or may be set to a very large select signal greater than the erase threshold voltage level of the floating gate transistors M0, M1, M2, and M3. Further, the row voltage control circuit 1100 provides the necessary voltage levels for erasing and programming selected floating gate transistors M0, M1, M2, and M3 of each of the programmable logic units PLU00, ..., PLU2m+1n of the array of programmable logic units PLU00, ..., PLU2m+1n.

A column voltage control circuit 1110 provides the necessary biasing voltage levels for erasing, programming, and reading for logic determination. Each of the source lines SL0, ..., SLn connected to the sources of the floating gate transistors M1 and M3 for each column of the array of programmable logic units PLU00, ..., PLU2m+1n is connected to a comparator sense circuit 1120a, ..., 1120n. The logic states as determined by the programmed threshold values Vt0 or Vt2 provide the voltage level present at the input of comparator sense circuits 1120a, ..., 1120n. The voltage level present at the source lines SL0, ..., SLn is compared to a reference voltage level REFV that is between the logic "0" state Vs0 and the logic "1" state Vs1 or between approximately 1.8V and the ground reference voltage level (0V) to distinguish between a threshold voltage level for the first logic state and a threshold voltage level of the second logic state. The output P1[0:M], ..., Pn[0:M] of the comparator sense circuits COMP1, ..., COMPn are the product terms as determined by the logic state of the input signals. The product terms P1[0:M], ..., Pn[0:M] are the input to an programmable OR array 1130 that determines the output FIO functions of the NOR flash nonvolatile reconfigurable logic device of FIG. 18a or 18b.

Figure 19:
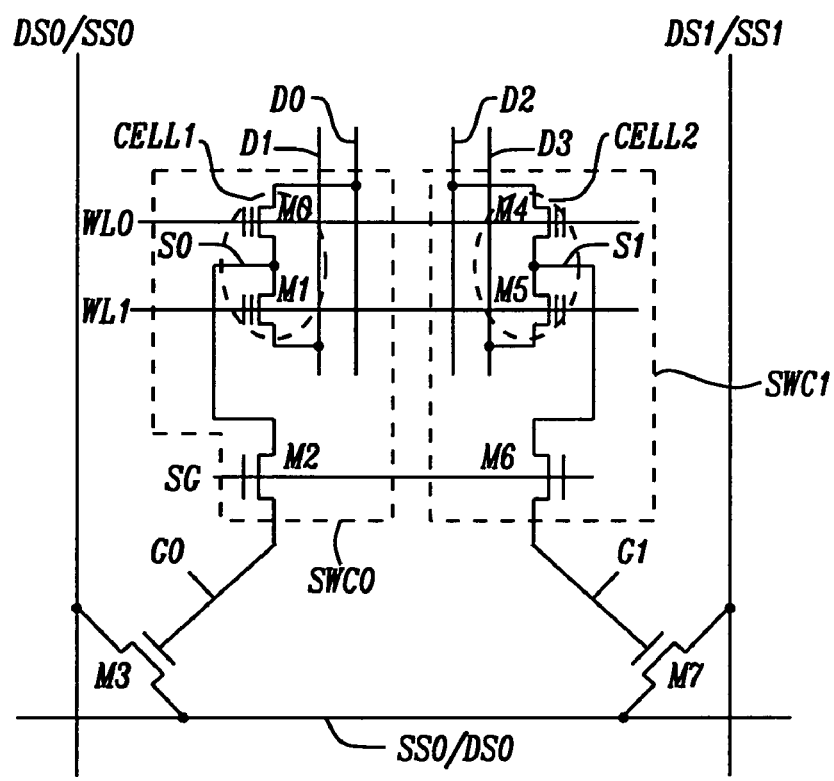
FIG. 19 is a schematic diagram of a NOR flash nonvolatile reconfigurable logic cell embodying the principles of the present invention.

FIG. 19 is a schematic diagram of a NOR flash nonvolatile reconfigurable logic cell embodying the principles of the present invention. The NOR flash nonvolatile reconfigurable logic circuit has a first switching transistor M3 having a source connected to a first interconnect conductor SS0/DS0 and a drain connected to a second interconnect conductor DS0/SS0 to selectively connect the logic the first interconnect conductor SS0/DS0 to the second interconnect conductor DS0/SS0 for transferring a logic value signal between the first interconnect conductor SS0/DS0 to the second interconnect conductor DS0/SS0. A switch control circuit SWC0 connected to a gate of the first switching transistor M3 turns on or turns off the first switching transistor M3 to selectively connect the first interconnect conductor SS0/DS0 to the second interconnect conductor DS0/SS0 based on a program state of the switch control circuit. If the switching transistor M3 is activated, a first logic value signal from the second interconnect conductor DS0/SS0 is connected to the logic function circuit connected to the first interconnect conductor SS0/DS0. Alternately, if the switching transistor M3 is deactivated, the first logic value signal from the second interconnect conductor DS0/SS0 is not connected to the logic function circuit connected to the first interconnect conductor SS0/DS0. It should be noted that the first logic value signal may in fact be transferred from the first interconnect conductor SS0/DS0 to the second interconnect conductor DS0/SS0 and still be in keeping with the principles of this invention.

The switch control circuit SWC0 is formed of a first NAND-like NOR flash memory cell CELL1 having a first pair of serially connected floating gate transistors M0 and M1 connected such that a drain a first floating gate transistor M1 is connected to a first drain line D0. A drain of a second floating gate transistor M1 is connected to a second drain line D1, and sources S0 of the first and second floating gate transistors floating gate transistors M0 and M1 are merged together. A first select gating transistor M2 has a drain connected to the merged sources S0 of the first and second floating gate transistors M0 and M1. A source of the first select gating transistor M2 is connected G0 to a gate of the switching transistor MC. A gate of the first select gating transistor M2 is connected to a select gating terminal SG. The first select gating transistor M2 first select gating transistor M2 is used to prevent damage from high voltage applied to the first switching transistor M3 during program/erase operations. The high speed requirement in the read mode forces the first switching transistor M3 to be made of the low voltage device with thinner oxide thickness. A gate of the first floating gate transistor M1 is connected to a first word line WL0 and the gate of the second floating gate transistor M1 is connected to a second word line WL0.

The NOR flash nonvolatile reconfigurable logic circuit has a second switching transistor M7 having a source connected to a first interconnect conductor SS0/DS0 and a drain connected to a third interconnect conductor DS1/SS1 to selectively connect the logic the first interconnect conductor SS0/DS0 to the third interconnect conductor DS1/SS1 for transferring a complement logic value signal between the first interconnect conductor SS0/DS0 to the third interconnect conductor DS1/SS1. A second switch control circuit SWC1 connected to a gate of the first switching transistor M7 turns on or turns off the second switching transistor M7 to selectively connect the first interconnect conductor SS0/DS0 to the third interconnect conductor DS1/SS1 based on a program state of the switch control circuit. If the switching transistor M7 is activated, the second logic value signal from the third interconnect conductor DS1/SS1 is connected to the logic function connected to the first interconnect conductor SS0/DS0. Alternately, if the switching transistor M7 is deactivated, the second logic value signal from the third interconnect conductor DS1/SS1 is not connected to the logic function connected to the first interconnect conductor SS0/DS0. It should be noted that the first logic value signal or second logic value signal may in fact be transferred from the first interconnect conductor SS0/DS0 to the third interconnect conductor DS1/SS1 and still be in keeping with the principles of this invention.

The switch control circuit SWC1 is formed of a second NAND-like NOR flash memory cell CELL2 having a second pair of serially connected floating gate transistors M4 and M5 connected such that a drain a first floating gate transistor M4 of the second pair of serially connected floating gate transistors M4 and M5 is connected to a third drain line D2. A drain of a second floating gate transistor M5 of the second pair of serially connected floating gate transistors M4 and M5 is connected to a fourth drain line D3, and sources S1 of the first and second floating gate transistors M4 and M5 are merged together. A second select gating transistor M6 has a drain connected to the merged sources S1 of the first and second floating gate transistors M4 and M5. A source of the second select gating transistor M6 is connected G0 to a gate of the switching transistor M7. A gate of the of the second select gating transistor M6 is connected to a select gating terminal SG. The second select gating transistor M6 is used to prevent damage from high voltage applied to the second switching transistor M7 during program/erase operations. The high speed requirement in the read mode forces the second switching transistor M7 to be made of the low voltage device with thinner oxide thickness. A gate of the first floating gate transistor M4 of the second pair of serially connected floating gate transistors M4 and M5 is connected to a first word line WL1 and the gate of the second floating gate transistor M5 of the second pair of serially connected floating gate transistors M4 and M5 is connected to a second word line WL1.

FIGS. 20a and 20b are tables of the operating conditions for the embodiment of the reconfigurable logic cell of FIG. 19 embodying the principles of the present invention. The erasing procedure shown in FIG. 20a for the two pair of serially connected floating gate transistors M0, M1, M4, and M5 is accomplished by placing a very large negative erasing voltage of from approximately −15.0V to approximately −20.0V between the control gates and the bulk of the two pair of serially connected floating gate transistors M0 and M0, M1, M4, and M5. The bulk of the two pair of serially connected floating gate transistors M0, M1, M4, and M5 is the triple P-type well TPW into which the switch control circuit is formed. The table of FIG. 20a shows the various options for providing the very large negative erasing voltage level between the control gates and the bulk of the two pair of serially connected floating gate transistors M0, M1, M4, and M5. The drains of the floating gate transistors M0, M1, M4, and M5 have a positive erasing voltage level applied through the drain lines D0, D1, D2, and/or D3. The positive erasing voltage level is also applied to the triple P-type well TPW. As shown in the table of FIG. 20a, the positive erasing voltage level is from approximately the voltage level of the ground reference voltage to approximately 10.0V dependent on the magnitude of the very large erasing voltage level as shown. The erased threshold voltage level is less than approximately −2.0V.

The programming procedure for the two pair of pair of serially connected floating gate transistors M0, M1, M4, and M5 is accomplished by placing a very large positive programming voltage of from approximately 15.0V to approximately 20.0V between the control gates and the bulk of the selected floating gate transistors M0, M1, M4, and M5. As described previously, the bulk of the two pair of serially connected floating gate transistors M0, M1, M4, and M5 is the triple P-type well TPW into which the switch control circuit is formed. The table shows the connections for programming each of the floating gate transistors M0, M1, M4, and M5 for providing the very large positive voltage level between the control gates and the bulk of the selected floating gate transistors M0, M1, M4, and M5. The drains of the selected floating gate transistors M0, M1, M4, or M5 are set to the voltage level of the ground reference voltage level. Those of the floating gate transistors M0, M1, M4, and M5 that are to be inhibited from programming have a large positive inhibiting voltage level of approximately 10.0V applied to their drain lines D0, D1, D2, and/or D3. The word line WL0 or WL1 connected to the unselected floating gate transistors M0, M1, M4, or M5 is set to a moderate positive inhibiting voltage level of approximately 5.0V. The programmed threshold voltage level is greater than the voltage level of the power supply voltage source Vdd.

In operation for the determination of the logic state of the floating gate transistors M0, M1, M4, and M5, The drain lines D0 and D2 and thus the drains of the floating gate transistors M0 and M4 are set to the voltage level of the ground reference voltage source. The drain lines D1 and D3 and thus the drains of the floating gate transistors M1 and M5 are set that is the voltage level of the power supply voltage source plus a threshold voltage level of a transistor (Vdd+Vt). The word lines WL0 and WL1 are set to a read select voltage level that is approximately the voltage level of the power supply voltage source Vdd. The select gating signal is applied to select gate line and thus the gates of the select gate transistors M2 and M6. The select gating signal is greater than the voltage level of the power supply voltage source plus twice the threshold voltage level of a transistor.

The floating gate transistors M0 and/or M4 that are programmed to the erase threshold voltage level Vt0 of −2.0V. When activated, the allow the full voltage level of the power supply voltage source Vdd to pass to the gates of first switching transistor M3 or second switching transistor M7 to connect the first interconnect conductor SS0/DS0 to the second interconnect conductor DS0/SS0 and/or second interconnect conductor DS0/SS0. When the floating gate transistors M0 and M4 are programmed to the programmed threshold voltage level Vt1 the floating gate transistors are not turned on when the word line WL0 is set to a read select voltage level. However, the floating gate transistors M1 and/or M3 are programmed to the erase threshold voltage level Vt0 of −2.0V. When activated, floating gate transistors M1 and/or M3 pass ground reference voltage level to the gates of first switching transistor M3 or second switching transistor M7 to disconnect the first interconnect conductor SS0/DS0 from the second interconnect conductor DS0/SS0 and/or second interconnect conductor DS0/SS0. When the floating gate transistors M0 and M4 are programmed to the programmed threshold voltage level Vt1 the floating gate transistors are not turned on when the word line WL0 is set to a read select voltage level, but the floating gate transistors M0 and/or M4 are programmed to the erase threshold voltage level Vt0 of −2.0V, as described above.

Table 20b shows the connectivity of the first interconnect conductor SS0/DS0 to the second interconnect conductor DS0/SS0 and/or third interconnect conductor DS1/SS1 based on the programmed threshold voltage levels of the floating gate transistors M0, M1, M4, and M5 and whether the first switching transistor M3 and/or the second switching transistor M7 are turned on or turned off.

Figure 21:
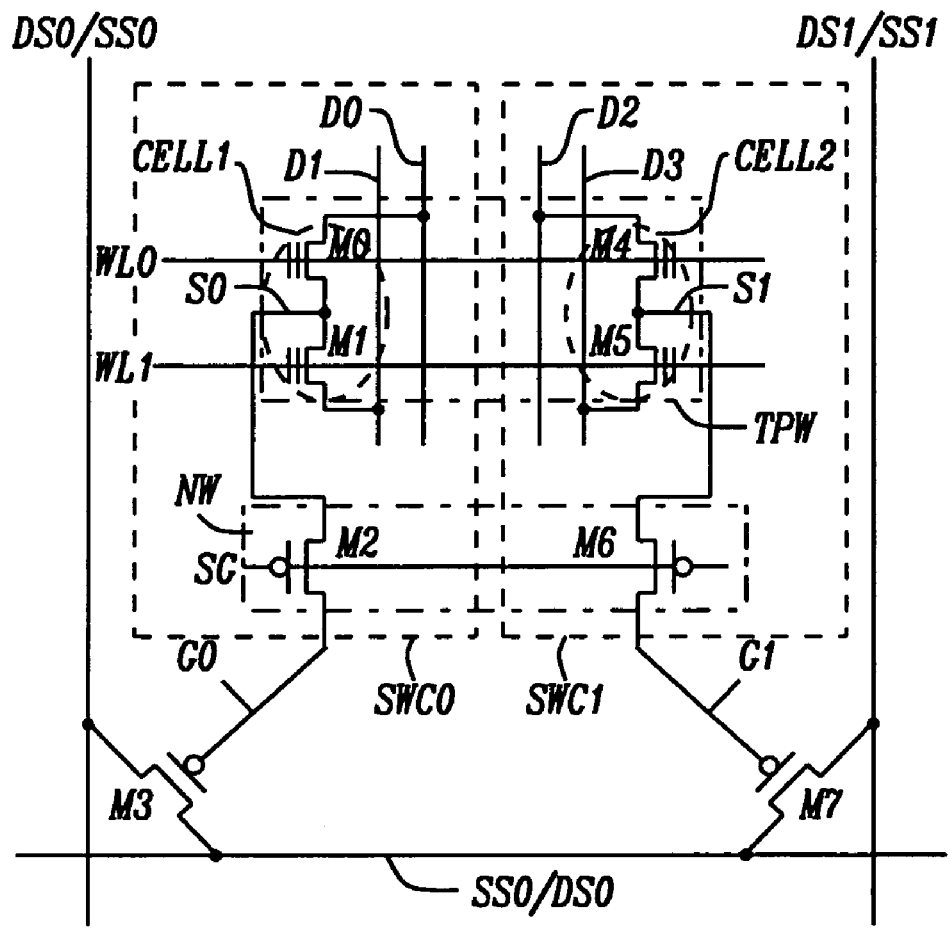
FIG. 21 is a schematic diagram of a NOR flash nonvolatile reconfigurable logic cell embodying the principles of the present invention.

FIG. 21 is a schematic diagram of a NOR flash nonvolatile reconfigurable logic cell embodying the principles of the present invention. The embodiment of FIG. 21 is essentially identical to structure of the NOR flash nonvolatile reconfigurable logic circuit of FIG. 19 except the first select gating transistor M2 and second select gating transistor M6 are PMOS transistors formed in an n-type well NW. The floating gate transistors M0, M1, M4, and M5 are separately formed in a triple P-type well TPW and are interconnected as described in FIG. 19. The first switching transistor M3 and the second switching transistor M7 are also PMOS transistors formed in the n-type well NW.

FIGS. 22a and 22b are tables of the operating conditions for the embodiment of the reconfigurable logic cell of FIG. 21 embodying the principles of the present invention. The functioning of the switch control circuit SWC0 and SWC1 are essentially as described above except during operation, the drain lines D0 and D2 and thus the drains of the floating gate transistors M0 and M4 are set to the voltage level of a negative threshold voltage level of a transistor (−Vt). The drain lines D1 and D3 and thus the drains of the floating gate transistors M1 and M5 are set that is the voltage level of the power supply voltage source plus a threshold voltage level of a transistor (Vdd+Vt). The programming of the floating gate transistors M0, M1, M4, and M5 are reversed as shown in FIG. 22b. The word lines WL0 or WL1 are set to the voltage level of the power supply voltage source to turn on or leave turned off the floating gate transistors M0, M1, M4, or M5 depending on the threshold voltage levels programmed to which the floating gate transistors M0, M1, M4, and M5 are programmed. FIG. 22b illustrates which of the second interconnect conductor DS0/SS0 and/or third interconnect conductor DS1/SS1 is connected to the first interconnect conductor SS0/DS0 based on the programming of the floating gate transistors M0, M1, M4, and M5.

Each switch control circuit SWC0 or SWC1 of FIGS. 19 and 21 may be used for selectively connecting wiring within a programmable logic unit of a field programmable gate array (FPGA) such as a VersaTile as shown on page 15 in the *Igloo User's Guide* from Microsemi Corporation, Irvine Calif. The one switch control circuit SWC0 or SWC1 is used for connecting individual wires of logic unit interconnections. The both switch control circuits SWC0 and SWC1 would be used for connecting pairs of wires for transferring signals such as in-phase and out-of-phase signals (clocks, etc.) to programmable logic units through out a programmable logic device. Various NOR flash nonvolatile reconfigurable logic devices such as PLA's, PLD, or FPGA's that employ the switching control circuits of FIGS. 19 and 21 with the first, second, and third interconnect conductors are in keeping with principles of the present invention.

While this invention has been particularly shown and described with reference to the preferred embodiments thereof, it will be understood by those skilled in the art that various changes in form and details may be made without departing from the spirit and scope of the invention.

The invention claimed is:

1. A reconfigurable integrated logic device comprising:
an array of NAND-like NOR flash nonvolatile memory cells, each of the NAND-like NOR flash nonvolatile memory cell comprising:
a plurality of charge retaining transistors arranged in rows and columns wherein said charge retaining transistors on each column form at least one pair of charge retaining transistors that is arranged in a series string such that one of the charge retaining transistors functions as a select gate transistor to prevent leakage current through the plurality of charge retaining transistors when the plurality of charge retaining transistors is not selected for determining a logic state of the reconfigurable integrated logic device;
wherein a drain of a topmost charge retaining transistor of each NAND-like NOR flash nonvolatile memory cells is connected to a local bit line associated with and parallel to the column on which each NOR flash memory circuit resides;
wherein a source of a bottommost charge retaining transistor of each of the NAND-like NOR flash nonvolatile memory cells is connected to a local source line associated with the associated NOR flash memory circuit and parallel with the associated bit line; and
wherein each control gate of the charge retaining transistors on each row is commonly connected to a word line.

2. The reconfigurable integrated logic device of claim 1 further comprising a column voltage control circuit connected to provide control signals to local bit lines and the source lines associated with each of the columns of charge retaining transistors.

3. The reconfigurable integrated logic device of claim 1 wherein each of the local bit lines is connected to one of a plurality of global bit lines through a bit line select transistor.

4. The reconfigurable integrated logic device of claim 3 wherein each of the local source lines is connected to one of a plurality of global source lines through a source line select transistor.

5. The reconfigurable integrated logic device of claim 4 wherein the global bit lines and the global source lines are connected to the column voltage control circuit to transfer the control signals to selected local-bit lines and selected local source lines for erasing, programming, and determining a logic state of a selected charge retaining transistors array of NAND-like NOR flash nonvolatile memory cells.

6. The reconfigurable integrated logic device of claim 3 further comprising a row voltage control circuit connected to provide control signals to word lines associated with each of the rows of charge retaining transistors of the array of array of NAND-like NOR flash nonvolatile memory cells.

7. The reconfigurable integrated logic device of claim 6 wherein the row control circuit transfers the control signals to word lines for erasing, programming, and determining a logic state of a selected charge retaining transistors array of NAND-like NOR flash nonvolatile memory cells.

8. The reconfigurable integrated logic device of claim 7 wherein the row control circuit further comprises a bit line select control circuit connected the gates of the local bit line select transistors and a source line select control circuit connected to the gates of the source line select transistors connected to each of the local source lines.

9. The reconfigurable integrated logic device of claim 6 wherein the row control circuit transfers word line control signals to word lines for erasing, programming, and determining a logic state of a selected charge retaining transistors array of NAND-like NOR flash nonvolatile memory cells and bit line select signals to the selected bit line select transistors and source line select signals to the selected source line transistors to transfer the bit line and source line control signals from the column voltage control circuit to the selected local bit lines and selected local source lines.

10. The reconfigurable integrated logic device of claim 1 wherein in each of the NAND-like NOR flash nonvolatile memory cells, the charge retaining transistors are programmed and erased with a Fowler-Nordheim tunneling process.

11. The reconfigurable integrated logic device of claim 1 wherein in selected charge retaining transistors are programmed with a first logic state by applying a very high program voltage level of from approximately +15.0V to approximately +20.0V in incrementally increasing steps between the control gate of the selected charge retaining transistor and a bulk region of the charge retaining transistor.

12. The reconfigurable integrated logic device of claim 11 wherein non-selected charge retaining transistors are inhibited by applying an intermediate program inhibit voltage level of less than +10.0V between the control gate of the non-selected charge retaining transistors and a bulk region of the non-selected charge retaining transistors.

13. The reconfigurable integrated logic device of claim 1 wherein the selected charge retaining transistors are erased to a second logic state by applying a very high negative erase voltage level of from approximately +15.0V to approximately +20.0V between bulk region of the selected charge retaining transistor and control gate of the selected charge retaining transistor.

14. The reconfigurable integrated logic device of claim 1 wherein non-selected charge retaining transistors of the plurality of charge retaining transistors are inhibited from erasing by biasing the non-selected charge retaining transistors such that there is a approximately a 0.0V voltage level between the control gate and the bulk region of the non-selected storage transistors.

15. The reconfigurable integrated logic device of claim 1 further comprising a plurality voltage follower sensing circuits connected such that each of the voltage follower sensing circuits are selectively connected to a source line for each column of NAND-like NOR flash nonvolatile memory cells.

16. The reconfigurable integrated logic device of claim 15 wherein selected charge retaining transistors are read by:
  connecting the source lines to the plurality of voltage follower sensing circuits;
  setting the word lines and thus the gates of the selected charge retaining transistors to a voltage level of a power supply voltage source;
  setting the bit lines and thus the drains of the selected charge retaining transistors to a voltage level of a power supply voltage source;
  setting the word lines and thus the gates of the non-selected charge retaining transistors to a first very high read voltage; and
  comparing a voltage developed at each of the source lines in the voltage follower sensing circuit associated with each source line with reference voltage level to determine the logic state of each of the selected charge retaining transistors.

17. The reconfigurable integrated logic device of claim 16 wherein the reference voltage level is approximately +2.0V to distinguish between a threshold voltage level for the first logic state and a threshold voltage level of the second logic.

18. The reconfigurable integrated logic device of claim 16 wherein the first very high read voltage is greater than +6.0V.

19. The reconfigurable integrated logic device of claim 16 wherein the word lines and thus the control gates of the non-selected charge retaining transistors are set to the ground reference voltage to turn off the charge retaining transistors.

20. A NOR flash nonvolatile reconfigurable logic circuit comprising:
  two NAND-like NOR flash memory cells connected in parallel, wherein each of the NAND-like NOR flash memory cells has a pair of serially connected charge retaining transistors forming a NAND string;
  wherein a first of the charge retaining transistor from each of the two NAND-like NOR flash memory cells selectively functions as a select gate transistor to prevent leakage current through the pair of charge retaining transistors and to prevent a logic input value from being selected when the NOR flash nonvolatile reconfigurable logic circuit is not selected for determining a logic state of the NOR flash nonvolatile reconfigurable logic circuit;
  wherein a second charge retaining transistor from each of the two NAND-like NOR flash memory cells functions as a logic state determination transistor for determining the logic state of NOR flash nonvolatile reconfigurable logic circuit.

21. The NOR flash nonvolatile reconfigurable logic circuit of claim 20 wherein the charge retaining transistors are connected in parallel to double an effective channel width of the charge retaining transistors without degrading a coupling ratio from a control gate to a floating gate of the charge retaining transistors.

22. The NOR flash nonvolatile reconfigurable logic circuit of claim 21 wherein a drain of the first charge retaining transistor of each of the two NAND-like NOR flash memory cells are connected together and then connected to a bit line associated with and parallel to NOR flash nonvolatile reconfigurable logic circuit.

23. The NOR flash nonvolatile reconfigurable logic circuit of claim 22 wherein a source of the second charge retaining transistor of each of the two NAND-like NOR flash memory cells are connected together and then connected to a source line associated with and parallel to NOR flash nonvolatile reconfigurable logic circuit and the bit line.

24. The NOR flash nonvolatile reconfigurable logic circuit of claim 23 wherein control gates of the two charge retaining transistors that function as the select gate transistor are connected to a select gate terminal for selectively activating the select gate transistor.

25. The NOR flash nonvolatile reconfigurable logic circuit of claim 24 wherein control gates of the two charge retaining transistors that function as the logic state determination transistor are connected to an input terminal for selectively transferring a logic state to the source line.

26. The NOR flash nonvolatile reconfigurable logic circuit of claim 25 wherein control gates of the two charge retaining transistors that function as the logic state determination transistor has threshold voltage level selectively set to a first threshold voltage level to provide a programmed logic state and to a second threshold voltage level to provide an erased logic state.

27. The NOR flash nonvolatile reconfigurable logic circuit of claim 26 wherein control gates of the two charge retaining transistors that function as the select gate transistor have a threshold voltage level that is set to a gating threshold voltage level such that when an input signal at the input terminal activates the logic state determination transistor, a logic state retained in the logic state determination transistor is transferred to the source line.

28. The NOR flash nonvolatile reconfigurable logic circuit of claim 26 wherein the programmed threshold voltage level is approximately +2.0V and the erased threshold voltage level is approximately −2.0V.

29. The NOR flash nonvolatile reconfigurable logic circuit of claim 27 wherein the gating threshold voltage level is approximately 0.0V.

30. The NOR flash nonvolatile reconfigurable logic circuit of claim 20 wherein the serially connected charge retaining transistors of the two NAND-like NOR flash memory cells connected in parallel are formed within a well of a first conductivity type that is formed within a deep well of a second conductivity type that is formed in a substrate of the first conductivity type.

31. The NOR flash nonvolatile reconfigurable logic circuit of claim 30 wherein the drains of the two charge retaining transistors that function as the select gate transistors are connected together with a first metal linking line and the sources of the two charge retaining transistors that function as the logic state determination transistors are connected with a second linking line.

32. The NOR flash nonvolatile-reconfigurable logic circuit of claim 31 wherein the source of the select gate transistor and the drain of the logic state determination transistor of each of the two NAND-like NOR flash memory cells are merged as one single diffusion region such that the merged diffusion regions of the two NAND-like NOR flash memory cells are not connected.

33. The NOR flash nonvolatile reconfigurable logic circuit of claim 32 wherein the two charge retaining transistors that function as the select gate transistor and the two charge retaining transistors that function as the logic state determination transistor are programmed and erased with a Fowler-Nordheim tunneling process.

34. The NOR flash nonvolatile reconfigurable logic circuit of claim 33 wherein programming a selected select gate transistor to the programmed threshold voltage level comprises applying incrementally in increasing steps a very high programming voltage level between the control gate of the select gate transistor and a bulk region of the select gate transistor until the selected select gate transistor is set to the gating threshold voltage level.

35. The NOR flash nonvolatile reconfigurable logic circuit of claim 34 wherein the very large programming level is of from approximately +15.0V to approximately +20.0V.

36. The NOR flash nonvolatile reconfigurable logic circuit of claim 33 wherein programming a selected logic state determination transistor to the gating threshold voltage level comprises applying a very high programming voltage level between the control gate of the logic state determination transistor and a bulk region of the logic state determination transistor until the selected logic state determination transistor is set to the gating threshold voltage level.

37. The NOR flash nonvolatile reconfigurable logic circuit of claim 36 wherein the very high voltage level is of from approximately +15.0V to approximately +20.0V.

38. The NOR flash nonvolatile-reconfigurable logic circuit of claim 33 wherein inhibiting the select gate transistor and the logic state determination transistor from programming comprises applying an intermediate inhibit voltage level between the gate select gate transistor and the logic state determination transistor and a bulk region of the select gate transistor and the logic state determination transistor.

39. The NOR flash nonvolatile reconfigurable logic circuit of claim 38 wherein the intermediate inhibit voltage level is less than +10.0V.

40. The NOR flash nonvolatile reconfigurable logic circuit of claim 33 wherein erasing the selected select gate transistor to an erased threshold volt comprises applying a very high negative erasing voltage level between the control gate of the selected select gate transistor and the bulk region of the selected select gate transistor.

41. The NOR flash nonvolatile reconfigurable logic circuit of claim 40 wherein the very high negative erasing voltage level is from approximately −15.0V to approximately −20.0V.

42. The NOR flash nonvolatile reconfigurable logic circuit of claim 33 wherein inhibiting the logic state determination transistor associated with the selected select gate transistor from erasing comprises applying an erase inhibit voltage the control gate.

43. The NOR flash nonvolatile reconfigurable logic circuit of claim 42 wherein the erase in inhibit voltage is approximately 5.0V.

44. The NOR flash nonvolatile reconfigurable logic circuit of claim 33 wherein erasing the selected logic state determination transistor to an erased threshold volt comprises applying the very high negative erasing voltage level between the control gate of the selected select gate transistor and the bulk region of the selected logic state determination transistor.

45. The NOR flash nonvolatile reconfigurable logic circuit of claim 44 wherein the very high erasing voltage level is from approximately −15.0V to approximately −20.0V.

46. The NOR flash nonvolatile reconfigurable logic circuit of claim 33 wherein inhibiting the select gate transistor associated with the selected logic state determination transistor from erasing comprises applying an erase inhibit voltage the control gate.

47. The NOR flash nonvolatile reconfigurable logic circuit of claim 46 wherein the erase in inhibit voltage is approximately 5.0V.

48. The NOR flash nonvolatile reconfigurable logic circuit of claim 27 wherein determining a logic state of the NOR flash nonvolatile reconfigurable logic circuit comprises:
   connecting the sources of the logic state determination transistors of the NOR flash nonvolatile reconfigurable logic circuit to a comparator sensing circuit;
   applying a read select voltage level to the control gates of the select gate transistor;
   applying a first logic state voltage level or a second logic state voltage level to the control gates the logic state determination transistors;
   applying a reference voltage source to a reference terminal of the comparator sensing circuit to distinguish between the threshold voltage level for the first logic state voltage level and the threshold voltage levels of the second logic state voltage level.

49. The NOR flash nonvolatile reconfigurable logic circuit of claim 48 wherein the read select voltage level is approximately 1.8V.

50. The NOR flash nonvolatile reconfigurable logic circuit of claim 48 wherein the first logic state voltage level is the voltage level of the power supply voltage source and the second logic state voltage level is the ground reference voltage level.

51. The NOR flash nonvolatile reconfigurable logic circuit of claim 48 wherein the first logic state voltage level is the ground reference voltage level and the second logic state voltage level is the voltage level of the power supply voltage source.

52. The NOR flash nonvolatile reconfigurable logic circuit of claim 48 wherein the reference voltage source is set to a voltage level that is greater than the ground reference voltage level and less than the voltage level of the power supply voltage source.

53. A NOR flash nonvolatile reconfigurable logic circuit comprising;
   a first charge retaining logic state determination transistor retaining a first logic state;
   a second charge retaining logic state determination transistor retaining a second logic state serially connected with the first charge retaining logic state determination transistor;
   wherein one of the first and second charge retaining logic state determination transistors selectively functions as a select gate transistor to prevent leakage current through the first and charge retaining logic state determination transistor and to prevent a logic input value from being selected when the NOR flash nonvolatile reconfigurable logic circuit is not selected for determining one of the first and second logic states.

54. The NOR flash nonvolatile reconfigurable logic circuit of claim 53 wherein the first and second charge retaining logic state determination transistor each comprise a pair of charge retaining transistors connected in parallel to double an effective channel width of the charge retaining transistors without degrading a coupling ratio from a control gate to a floating gate of the charge retaining transistors.

55. The NOR flash nonvolatile reconfigurable logic circuit of claim 54 wherein one of the pair of the charge retaining transistors from the first charge retaining logic state determination transistor and one of the charge retaining transistors from the second charge retaining logic state determination transistor are serially connected to form one NAND-like NOR flash memory cell.

56. The NOR flash nonvolatile reconfigurable logic circuit of claim 55 wherein a drain of the drains of the charge retaining transistors of first charge retaining logic state determination transistor are connected together and then connected to a bit line associated with and parallel to NOR flash nonvolatile reconfigurable logic circuit.

57. The NOR flash nonvolatile reconfigurable logic circuit of claim 56 wherein a sources of the charge retaining transistors of the second charge retaining logic state determination transistor are connected together and then connected to a source line associated with and parallel to NOR flash nonvolatile reconfigurable logic circuit and parallel to the bit line.

58. The NOR flash nonvolatile reconfigurable logic circuit of claim 57 wherein control gates of the two charge retaining transistors of the first charge retaining logic state determination transistor are connected to a first input terminal for selectively transferring a logic state to the source line and control gates of the two charge retaining transistors of the second charge retaining logic state determination transistor are connected to a second input terminal for selectively transferring a logic state to the source line.

59. The NOR flash nonvolatile reconfigurable logic circuit of claim 58 wherein the first and second charge retaining logic state determination transistors each have a threshold voltage level selectively set to a first threshold voltage level to provide a programmed logic state or to a second threshold voltage level to provide an erased logic state.

60. The NOR flash nonvolatile reconfigurable logic circuit of claim 59 wherein the programmed threshold voltage level is approximately +2.0V and the erased threshold voltage level is approximately −2.0V.

61. The NOR flash nonvolatile reconfigurable logic circuit of claim 55 wherein the serially-connected charge-retaining transistors of the two NAND-like NOR flash memory cells connected in parallel are formed within a well of a first conductivity type that is formed within a deep well of a second conductivity type that is formed in a substrate of the first conductivity type.

62. The NOR flash nonvolatile reconfigurable logic circuit of claim 61 wherein the drains of the first charge retaining logic state determination transistor are connected together with a first metal linking line and the sources of the second charge retaining logic state determination transistor are connected with a second metal linking line.

63. The NOR flash nonvolatile reconfigurable logic circuit of claim 62 wherein each source of the charge retaining transistors of the first charge retaining logic state determination transistor and the drains of the charge retaining transistors of the second charge retaining logic state determination transistor are merged as one single diffusion region such that the two merged diffusion regions are not connected.

64. The NOR flash nonvolatile reconfigurable logic circuit of claim 63 wherein the first and second charge retaining logic state determination transistors are programmed and erased with a Fowler-Nordheim tunneling process.

65. The NOR flash nonvolatile reconfigurable logic circuit of claim 64 wherein programming first or second charge retaining logic state determination transistors to the programmed threshold voltage level comprises applying incrementally in increasing steps a very high programming voltage level between the control gate first or second charge retaining logic state determination transistors and a bulk region of the first or second charge retaining logic state determination transistors until threshold voltage level of the first and second charge retaining logic state determination transistors are set to the programmed threshold voltage level.

66. The NOR flash nonvolatile reconfigurable logic circuit of claim 65 wherein the very large programming level is of from approximately +15.0V to approximately +20.0V.

67. The NOR flash nonvolatile reconfigurable logic circuit of claim 65 wherein inhibiting the first or second charge retaining logic state determination transistor from programming comprises applying an intermediate inhibit voltage level between the control gate first or second charge retaining logic state determination transistor and a bulk region.

68. The NOR flash nonvolatile reconfigurable logic circuit of claim 67 wherein the intermediate inhibit voltage level is less than +10.0V.

69. The NOR flash nonvolatile reconfigurable logic circuit of claim 64 wherein erasing the first or second charge retaining logic state determination transistors to an erased threshold voltage comprises applying a very high erasing voltage level between the control gate and the bulk region of the first or second charge retaining logic state determination transistor.

70. The NOR flash nonvolatile reconfigurable logic circuit of claim 69 wherein the very high erasing voltage level is from approximately −15.0V to approximately −20.0V.

71. The NOR flash nonvolatile reconfigurable logic circuit of claim 64 wherein inhibiting the first or second charge retaining logic state determination transistor from erasing comprises applying an erase inhibit voltage the control gate.

72. The NOR flash nonvolatile reconfigurable logic circuit of claim 43 wherein the erase in inhibit voltage is approximately 5.0V.

73. The NOR flash nonvolatile reconfigurable logic circuit of claim 64 wherein determining a logic state of the NOR flash nonvolatile reconfigurable logic circuit comprises:
connecting the sources of second charge retaining logic state determination transistor to a comparator sensing circuit;
applying a read select voltage level to the control gates of the first or second charge retaining logic state determination transistor that is to function as the select gate transistor;
applying a first logic state voltage level or a second logic state voltage level to the control gates the selected first or second charge retaining logic state determination transistor;
applying a reference voltage source to a reference terminal of a comparator sensing circuit to distinguish between the threshold voltage level for the first logic state voltage level and the threshold voltage levels of the second logic state voltage level.

74. The NOR flash nonvolatile reconfigurable logic circuit of claim 73 wherein the read select voltage level is greater than the erased threshold voltage level.

75. The NOR flash nonvolatile reconfigurable logic circuit of claim 73 wherein the first logic state voltage level is the voltage level of the power supply voltage source and the second logic state voltage level is the ground reference voltage level.

76. The NOR flash nonvolatile reconfigurable logic circuit of claim 73 wherein the first logic state voltage level is the ground reference voltage level and the second logic state voltage level is the voltage level of the power supply voltage source.

77. The NOR flash nonvolatile reconfigurable logic circuit of claim 73 wherein the reference voltage source is set to a voltage level of approximately 10.0V.

78. A NOR flash nonvolatile reconfigurable logic device comprising:
- an array of a plurality of NOR flash nonvolatile reconfigurable logic circuits arranged in rows and columns, wherein each of the NOR flash nonvolatile reconfigurable logic circuits comprises;
  - a first charge retaining logic state determination transistor retaining a first logic state;
  - a second charge retaining logic state determination transistor retaining a second logic state serially connected with the first charge retaining logic state determination transistor;
  - wherein one of the first and second charge retaining logic state determination transistors selectively functions as a select gate transistor to prevent leakage current through the first and charge retaining logic state determination transistor and to prevent a logic input value from being selected when the NOR flash nonvolatile reconfigurable logic circuit is not selected for determining one of the first and second logic states;
- a row voltage control circuit connected to a pair of logic input lines that are connected to each row of NOR flash nonvolatile reconfigurable logic circuits to provide voltage levels for erasing, programming, and determining logic states of selected NOR flash nonvolatile reconfigurable logic circuits;
- a column voltage control circuit connected to a plurality of drain lines and plurality of source lines wherein each of the drain lines and source lines is connected to a column of the NOR flash nonvolatile reconfigurable logic circuits to provide the voltage levels for erasing, programming, and determining the logic states of the selected NOR flash nonvolatile reconfigurable logic circuits;
- a plurality of comparator circuits wherein each of the comparator circuits is connected to the plurality of source lines the NOR flash nonvolatile reconfigurable logic circuits for determining the logic state of the selected NOR flash nonvolatile reconfigurable logic circuits.

79. The NOR flash nonvolatile reconfigurable logic device of claim 78 wherein the first and second charge retaining logic state determination transistor each comprise a pair of charge retaining transistors connected in parallel to double an effective channel width of the charge retaining transistors without degrading a coupling ratio from a control gate to a floating gate of the charge retaining transistors.

80. The NOR flash nonvolatile reconfigurable logic device of claim 79 wherein one of the pair of the charge retaining transistors from the first charge retaining logic state determination transistor and one of the charge retaining transistors from the second charge retaining logic state determination transistor are serially connected to form one NAND-like NOR flash memory cell.

81. The NOR flash nonvolatile reconfigurable logic device of claim 80 wherein one drain of the drains of the charge retaining transistors of first charge retaining logic state determination transistor are connected together and then connected to one bit line associated with and parallel to NOR flash nonvolatile reconfigurable logic circuit.

82. The NOR flash nonvolatile reconfigurable logic device of claim 81 wherein the sources of the charge retaining transistors of the second charge retaining logic state determination transistor are connected together and then connected to one source line associated with and parallel to NOR flash nonvolatile reconfigurable logic circuit and parallel to the associated bit line.

83. The NOR flash nonvolatile reconfigurable logic device of claim 82 wherein control gates of the two charge retaining transistors of the first charge retaining logic state determination transistor are connected to one logic input line of the pair of logic input lines for selectively transferring a logic state to the source line and control gates of the two charge retaining transistors of the second charge retaining logic state determination transistor are connected to a second input line of the pair of logic input lines for selectively transferring a logic state to the source line.

84. The NOR flash nonvolatile reconfigurable logic device of claim 83 wherein the first and second charge retaining logic state determination transistors each have a threshold voltage level selectively set to a first threshold voltage level to provide a programmed logic state or to a second threshold voltage level to provide an erased logic state.

85. The NOR flash nonvolatile reconfigurable logic device of claim 84 wherein the programmed threshold voltage level is approximately +2.0V and the erased threshold voltage level is approximately −2.0V.

86. The NOR flash nonvolatile reconfigurable logic device of claim 83 wherein the serially connected charge retaining transistors of the two NAND-like NOR flash memory cells connected in parallel are formed within a well of a first conductivity type that is formed within a deep well of a second conductivity type that is formed in a substrate of the first conductivity type.

87. The NOR flash nonvolatile reconfigurable logic device of claim 86 wherein the drains of the first charge retaining logic state determination transistor are connected together with a first metal linking line and the sources of the second charge retaining logic state determination transistor are connected with a second metal linking line.

88. The NOR flash nonvolatile reconfigurable logic device of claim 87 wherein each source of the charge retaining transistors of the first charge retaining logic state determination transistor and the drains of the charge retaining transistors of the second charge retaining logic state determination transistor are merged as one single diffusion region such that the two merged diffusion regions are not connected.

89. The NOR flash nonvolatile reconfigurable logic device of claim 86 wherein the first and second charge retaining logic state determination transistors are programmed and erased with a Fowler-Nordheim tunneling process.

90. The NOR flash nonvolatile reconfigurable logic device of claim 89 wherein programming first or second charge-retaining logic state determination transistors of selected NOR flash nonvolatile reconfigurable logic circuits to the programmed threshold voltage level comprises applying incrementally in increasing steps a very high programming voltage level between selected logic input lines and thus the control gate first or second charge retaining logic state determination transistors and a bulk region of the first or second charge retaining logic state determination transistors of the selected NOR flash nonvolatile reconfigurable logic circuits until threshold voltage level of the first and second charge retaining logic state determination transistors are set to the programmed threshold voltage level.

91. The NOR flash nonvolatile reconfigurable logic device of claim 90 wherein the very large programming level is of from approximately +15.0V to approximately +20.0V.

92. The NOR flash nonvolatile reconfigurable logic device of claim 90 wherein inhibiting unselected first or second charge retaining logic state determination transistors from programming comprises applying an intermediate inhibit voltage level between unselected logic input lines and thus the control gates of the unselected first or second charge retaining logic state determination transistor and a bulk region.

93. The NOR flash nonvolatile reconfigurable logic device of claim 92 wherein the intermediate inhibit voltage level is less than +10.0V.

94. The NOR flash nonvolatile reconfigurable logic device of claim 92 wherein erasing the first or second charge retaining logic state determination transistors of selected NOR flash nonvolatile reconfigurable logic circuits to an erased threshold volt comprises applying a very high erasing voltage level between the bulk region and control gate of the first or second charge retaining logic state determination transistor.

95. The NOR flash nonvolatile reconfigurable logic device of claim 94 wherein the very high erasing voltage level is applied to selected logic input lines and thus to the control gates of the first or second charge retaining logic state determination transistors and is from approximately −15.0V to approximately −20.0V.

96. The NOR flash nonvolatile reconfigurable logic device of claim 94 wherein inhibiting the first or second charge retaining logic state determination transistors of unselected NOR flash nonvolatile reconfigurable logic circuits from erasing comprises applying an erase inhibit voltage to the unselected logic input lines and thus to the control gates of the unselected first or second charge retaining logic state determination transistors.

97. The NOR flash nonvolatile reconfigurable logic device of claim 96 wherein the erase in inhibit voltage is approximately 5.0V.

98. The NOR flash nonvolatile reconfigurable logic device of claim 89 wherein determining a logic state of selected NOR flash nonvolatile reconfigurable logic devices comprises:
- activating the comparator sensing circuits connected to the source lines and thus the sources of second charge retaining logic state determination transistor of the selected NOR flash nonvolatile reconfigurable logic circuits;
- applying a read select voltage level to the logic input lines of the pairs of logic input lines and thus to the control gates of the first or second charge retaining logic state determination transistor of the selected NOR flash nonvolatile reconfigurable logic circuits that is to function as the select gate transistor;
- applying a first logic state voltage level or a second logic state voltage level to the logic input lines and thus the control gates the selected first or second charge retaining logic state determination transistor;
- applying a reference voltage source to a reference terminal of the comparator sensing circuits to distinguish between the threshold voltage level for the first logic state voltage level and the threshold voltage levels of the second logic state voltage level.

99. The NOR flash nonvolatile reconfigurable logic device of claim 98 wherein the read select voltage level is greater than the erased threshold voltage level.

100. The NOR flash nonvolatile reconfigurable logic device of claim 98 wherein the first logic state voltage level is the voltage level of the power supply voltage source and the second logic state voltage level is the ground reference voltage level.

101. The NOR flash nonvolatile reconfigurable logic device of claim 98 wherein the first logic state voltage level is the ground reference voltage level and the second logic state voltage level is the voltage level of the power supply voltage source.

102. The NOR flash nonvolatile reconfigurable logic device of claim 98 wherein the reference voltage source is set to a voltage level of approximately 1.0V.

103. A NOR flash nonvolatile reconfigurable logic circuit comprising:
- a first switching transistor having a source connected to a first interconnect conductor and a drain connected to a second interconnect conductor to selectively connect the logic of the first interconnect conductor to a second logic input/output line for transferring a first logic value signal between the first interconnect conductor and the second interconnect conductor;
- a switch control circuit connected to a gate of the first switching transistor selectively activates or deactivates the first switching transistor to determine if the first interconnect conductor is to be connected to the second interconnect conductor based on a program state of the switch control circuit.

104. The NOR flash nonvolatile reconfigurable logic circuit of claim 103 wherein if the first switching transistor is activated, the first logic value signal from the first interconnect conductor is transferred to the first interconnect conductor and if the first switching transistor is deactivated, first the logic value signal from the first interconnect conductor transferred to the first interconnect conductor.

105. The NOR flash nonvolatile reconfigurable logic circuit of claim 103 wherein the switch control circuit comprises:
- a first NAND-like NOR flash memory cell having a first pair of serially connected charge retaining transistors connected such that a drain a first charge retaining transistor of the first pair of charge retaining transistors is connected to a first drain line, a drain of a second charge retaining transistor of the first pair of charge retaining transistors is connected to a second drain line, and sources of the first and second charge retaining transistors of the first pair of serially connected charge retaining transistors are merged together;
- a first select gating transistor connected between the first NAND-like NOR flash memory cell and the first switching transistor for preventing damage to the first switching transistor from a very large erasing voltage level or a very large programming voltage level applied to the first NAND-like NOR flash memory cell;
- wherein a gate of the first charge retaining transistor pair of serially connected charge retaining transistors is connected to a first word line and the gate of the second charge retaining transistor pair of serially connected charge retaining transistors is connected to a second word line.

106. The NOR flash nonvolatile reconfigurable logic circuit of claim 105 wherein the first select gating transistor has a drain connected to the sources of the first and second charge retaining transistors of the first pair of serially connected charge retaining transistors, a source connected to a gate of the first switching transistor, and a gate connected to a select gating terminal.

107. The NOR flash nonvolatile reconfigurable logic circuit of claim 105 further comprising:
- a second switching transistor having a source connected to the first interconnect conductor, a drain connected to a third interconnect conductor selectively connects the third interconnect conductor to the first interconnect conductor for transferring a second logic value signal between the third interconnect conductor and the first interconnect conductor and a gate connected to the switch control circuit to selectively activate or deactivate the second switching transistor to determine if the third interconnect conductor is to be connected to the first interconnect conductor based on a program state of the switch control circuit.

108. The NOR flash nonvolatile reconfigurable logic circuit of claim 107 wherein if the second switching transistor is activated, the second logic value signal from the third interconnect conductor is included in the logic function of the first interconnect conductor and if the second switching transistor is deactivated, the second logic value signal from the logic input line is not included in the logic function of the first interconnect conductor.

109. The NOR flash nonvolatile reconfigurable logic circuit of claim of claim 107 wherein in the switch control circuit further comprises:
- a second NAND-like NOR flash memory cell having a second pair of serially connected charge retaining transistors connected such that a drain a first charge retaining transistor of the second pair of charge retaining transistors is connected to a third drain line, a drain of a second charge retaining transistor of the second pair of charge retaining transistors is connected to a fourth drain line, and sources of the first and second charge retaining transistors of the second pair of serially connected charge retaining transistors are merged together;
- a second select gating transistor connected between the second NAND-like NOR flash memory cell and the second switching transistor for preventing damage to the second switching transistor from a very large erasing voltage level or a very large programming voltage level applied to the second NAND-like NOR flash memory cell;
- wherein a gate of the first charge retaining transistor of the second pair of serially connected charge retaining transistors is connected to the first word line and the gate of the second charge retaining transistor of the pair of serially connected charge retaining transistors is connected to the second word line.

110. The NOR flash nonvolatile reconfigurable logic circuit of claim 109 wherein the second select gating transistor has a drain connected to the sources of the first and second charge retaining transistors of the second pair of charge retaining transistors, a source connected to a gate of the second switching transistor, and a gate connected to the select gating terminal.

111. The NOR flash nonvolatile reconfigurable logic circuit of claim 109 wherein the two switching transistors and the two select gating transistors are NMOS transistors.

112. The NOR flash nonvolatile reconfigurable logic circuit of claim 109 wherein the two switching transistors and the two select gating transistors are PMOS transistors.

113. The NOR flash nonvolatile reconfigurable logic circuit of claim 109 wherein erasing the first and second pair of charge retaining transistors to have a threshold voltage level of an erased threshold voltage level comprises:
- applying a very large erasing voltage level between the control gate and the drains of each of the charge retaining transistors.

114. The NOR flash nonvolatile reconfigurable logic circuit of claim 113 wherein the erased threshold voltage level is −2.0V.

115. The NOR flash nonvolatile reconfigurable logic circuit of claim 113 wherein applying the very large erasing voltage level between the control gate and the drains of the each of the charge retaining transistors of the two pair of charge retaining transistors comprises applying a very large negative voltage level to the first and second word lines and applying a ground reference voltage level to the drains of each of the charge retaining transistors of the first and second pair of the charge retaining transistors.

116. The NOR flash nonvolatile reconfigurable logic circuit of claim 115 wherein the very large negative erasing voltage level that is from approximately −15.0V to approximately −20.0V and applying the voltage level of the ground reference voltage level to a triple P-type well into which the switch control circuit is formed and the select line and thus the gates of the first and second select gating transistors.

117. The NOR flash nonvolatile reconfigurable logic circuit of claim 109 wherein programming one selected charge retaining transistor of the two pair of charge retaining transistors to have a threshold voltage level of a programmed threshold voltage level comprises:
- applying a very large programming voltage level between the control gate and the drain of the one selected charge retaining transistor of the two pair of charge retaining transistors.

118. The NOR flash nonvolatile reconfigurable logic circuit of claim 117 wherein the programmed threshold voltage level is greater than the voltage level of the power supply voltage source.

119. The NOR flash nonvolatile reconfigurable logic circuit of claim 117 wherein applying a very large programming voltage level between the control gate and the drain of the one selected charge retaining transistor of the two pair of charge retaining transistors comprises applying a very large positive programming voltage level to the word line which is connected to the control-gate of the one selected charge retaining transistor and applying a ground reference voltage level to the drains of each of the charge retaining transistors pair of the charge retaining transistors having the one selected charge retaining transistor.

120. The NOR flash nonvolatile reconfigurable logic circuit of claim 119 wherein the very large positive programming voltage level that is from approximately +15.0V to approximately +20.0V and applying the voltage level of the ground reference voltage level to the drain lines connected to the pair of the charge retaining transistors having the one selected charge retaining transistor, to a triple P-type well into which the switch control circuit is formed and to the select line and thus the gates of the first and second select gating transistors.

121. The NOR flash nonvolatile reconfigurable logic circuit of claim 117 wherein programming one selected charge retaining transistor of the two pair of charge retaining transistors further comprises inhibiting programming of the three charge retaining transistors not being programmed comprising applying an moderate programming inhibit voltage level to the word which is not connected to the control gate of the one selected charge retaining transistor and applying a large programming inhibit voltage level to the drain lines not connected to the pair of charge retaining transistors including the one selected charge retaining transistor.

122. The NOR flash nonvolatile reconfigurable logic circuit of claim 121 wherein the moderate programming inhibit voltage level is approximately +50.0V and the large programming inhibit voltage level is approximately +10.0V.

123. The NOR flash nonvolatile reconfigurable logic circuit of claim 109 wherein determining a logic state of the NOR flash nonvolatile reconfigurable logic circuit comprises:
- applying a read select voltage level to the first and second word lines and thus to the control gates of the first and second charge transistors of the two pair of charge retaining transistors such that those of the first and second charge transistors of the two pair of charge retaining transistors that are erased will be turned on and those of the first and second charge transistors of the two pair of charge retaining transistors that are programmed will not be turned on;
- applying a first read voltage to the first and third drain lines;
- applying a second read voltage to the second and fourth drain lines;
- applying a select gating signal to the select gating terminal thus to the gates of the first and second select gates to turn on the first and second select gates.

124. The NOR flash nonvolatile reconfigurable logic circuit of claim 123 wherein the read select voltage level is approximately the voltage level of the power supply voltage source.

125. The NOR flash nonvolatile reconfigurable logic circuit of claim 123 wherein the first read voltage level is the ground reference voltage level and the second read voltage level is the voltage level of the power supply voltage source plus a threshold voltage level of a transistor.

126. The NOR flash nonvolatile reconfigurable logic circuit of claim 123 wherein the first read voltage level is the ground reference voltage level less a threshold voltage level of a transistor and the second read voltage level is the voltage level of the power supply voltage source.

127. The NOR flash nonvolatile reconfigurable logic circuit of claim 123 wherein the select gating signal is set to be greater than a voltage level of the power supply voltage source plus twice the threshold voltage level of a transistor.

128. The NOR flash nonvolatile reconfigurable logic circuit of claim 123 wherein if the first charge retaining transistors of the two pair of charge retaining transistors is programmed to the programmed threshold voltage level and the second charge retaining transistors of the two pair of charge retaining transistors is erased to the erased threshold voltage level, the first and second switching transistors are activated and the first and second interconnect conductors are connected to the first interconnect conductor.

129. The NOR flash nonvolatile reconfigurable logic circuit of claim 123 wherein if the first charge retaining transistor of the first pair of charge retaining transistors is programmed to the programmed threshold voltage level and the second charge retaining transistors of the first pair of charge retaining transistors is erased to the erased threshold voltage level and the first charge retaining transistor of the second pair of charge retaining transistors is erased to the erased threshold voltage level and the second charge retaining transistors of the second pair of charge retaining transistors is programmed to the programmed threshold voltage level, the first switching transistor is activated and the first interconnect conductor is connected to the first interconnect conductor and the second switching transistor is deactivated and the second interconnect conductor is not connected to the first interconnect conductor.

130. The NOR flash nonvolatile reconfigurable logic circuit of claim 123 wherein if the first charge retaining transistor of the first pair of charge retaining transistors is erased to the erased threshold voltage level and the second charge retaining transistors of the first pair of charge retaining transistors is programmed to the programmed threshold voltage level and the first charge retaining transistor of the second pair of charge retaining transistors is programmed to the programmed threshold voltage level and the second charge retaining transistors of the second pair of charge retaining transistors is erased to the erased threshold voltage level, the first switching transistor is deactivated and the first interconnect conductor is not connected to the first interconnect conductor and the second switching transistor is activated and the second interconnect conductor is connected to the first interconnect conductor.

131. The NOR flash nonvolatile reconfigurable logic circuit of claim 123 wherein if the first charge retaining transistors of the two pair of charge retaining transistors is erased to the erased threshold voltage level and the second charge retaining transistors of the two pair of charge retaining transistors is programmed to the programmed threshold voltage level, the first and second switching transistors are deactivated and the first and second interconnect conductors are not connected to the first interconnect conductor.

132. A NOR flash nonvolatile reconfigurable logic device comprising:
- a plurality of first interconnect conductors for transferring a selected plurality of logic value signals;
- a plurality of second interconnect conductors selectively in communication with the plurality of first interconnect conductors for selectively transferring the logic input signals between the first interconnect conductors and the second interconnect conductors;
- a plurality of NOR flash nonvolatile reconfigurable logic circuits, wherein each of the NOR flash nonvolatile reconfigurable logic devices comprising:
  - a first switching transistor having a source connected to one interconnect conductor of the plurality of first interconnect conductors and a drain connected to one interconnect conductor of the plurality of second interconnect conductors to selectively connects the one interconnect conductor of the plurality second interconnect conductors to the one interconnect conductor of the plurality first interconnect conductors for transferring a first logic value signal between the one interconnect conductor of the plurality second interconnect conductors and the one interconnect conductor of the of the plurality first interconnect conductors, and
  - a switch control circuit connected to a gate of the first switching transistor selectively activates or deactivates the first switching transistor to determine if the one interconnect conductor of the of the plurality second interconnect conductors is to be connected to the one interconnect conductor of the plurality first interconnect conductors based on a program state of the switch control circuit.

133. The NOR flash nonvolatile reconfigurable logic device of claim 132 wherein if selected switching transistors are activated, the first logic value signal from the one interconnect conductor of the plurality of second interconnect conductors is transferred between the one interconnect conductor of the plurality of first interconnect conductor and if the selected switching transistor is deactivated, the first logic value signal from the one interconnect conductor of the plurality of second interconnect conductors is not transferred between the one interconnect conductor of the plurality of first interconnect conductors.

134. The NOR flash nonvolatile reconfigurable logic device of claim 133 further comprising a plurality of drain lines in communication with selected switch control circuits for transferring voltages for erasing, programming, and determining a connection state for determining if selected second interconnect conductors are to be connected to the first interconnect conductors.

135. The NOR flash nonvolatile reconfigurable logic device of claim 134 wherein the switch control circuit of each of the NOR flash nonvolatile reconfigurable logic circuits comprises:
   a first NAND-like NOR flash memory cell having a first pair of serially connected charge retaining transistors connected such that a drain a first charge retaining transistor of the first pair of charge retaining transistors is connected to a first drain line of the plurality of drain lines, a drain of a second charge retaining transistor of the first pair of charge retaining transistors is connected to a second drain line of the plurality of drain lines, and sources of the first and second charge retaining transistors of the first pair of serially connected charge retaining transistors are merged together;
   a first select gating transistor connected between the first NAND-like NOR flash memory cell and the first switching transistor for preventing damage to the first switching transistor from a very large erasing voltage level or a very large programming voltage level applied to the first NAND-like NOR flash memory cell;
   wherein a gate of the first charge retaining transistor pair of serially connected charge retaining transistors is connected to a first word line and the gate of the second charge retaining transistor pair of serially connected charge retaining transistors is connected to a second word line.

136. The NOR flash nonvolatile reconfigurable logic device of claim 135 wherein the first select gating transistor has a drain connected to the sources of the first and second charge retaining transistors of the first pair of serially connected charge retaining transistors, a source connected to a gate of the switching transistor, and a gate connected to a select gating terminal.

137. The NOR flash nonvolatile reconfigurable logic device of claim 134 wherein the each of the NOR flash nonvolatile reconfigurable logic circuits further comprising:
   a second switching transistor having a source connected to the one interconnect conductor of the plurality of first interconnect conductors, a drain connected to a second interconnect conductor of the plurality second interconnect conductors selectively connects the second interconnect conductor of the plurality of second interconnect conductors to the one interconnect conductor of the plurality first interconnect conductors for transferring a second logic value signal between the second interconnect conductor of the plurality second interconnect conductors and the first interconnect conductor of the plurality first interconnect conductors; and
   a second switch control circuit connected to a gate of the second switching transistor to selectively activate or deactivate the second switching transistor to determine if the second interconnect conductor of the of the plurality second interconnect conductors is to be connected to the one interconnect conductor of the plurality first interconnect conductors based on a program state of the second switch control circuit.

138. The NOR flash nonvolatile reconfigurable logic device of claim 137 wherein if selected second switching transistors are activated, the second logic value signal is transferred between the second interconnect conductor of the plurality of second interconnect conductors and the one interconnect conductor of the plurality first interconnect conductors and if the selected second switching transistors are deactivated, the second logic value signal is not transferred between the second interconnect conductor of the plurality second interconnect conductors and the first interconnect conductor of the plurality first interconnect conductors.

139. The NOR flash nonvolatile reconfigurable logic device of claim of claim 137 wherein in the second switch control circuit of each of the nonvolatile reconfigurable logic circuits further comprises:
   a second NAND-like NOR flash memory cell having a second pair of serially connected charge retaining transistors connected such that a drain a first charge retaining transistor of the second pair of charge retaining transistors is connected to a third drain line of the plurality of drain lines, a drain of a second charge retaining transistor of the second pair of charge retaining transistors is connected to a fourth drain line of the plurality of drain lines, and sources of the first and second charge retaining transistors of the second pair of serially connected charge retaining transistors are merged together;
   a second select gating transistor connected between the second NAND-like NOR flash memory cell and the second switching transistor for preventing damage to the second switching transistor from a very large erasing voltage level or a very large programming voltage level applied to the second NAND-like NOR flash memory cell;
   wherein a gate of the first charge retaining transistor of the second pair of serially connected charge retaining transistors is connected to the first word line and the gate of the second charge retaining transistor of the pair of serially connected charge retaining transistors is connected to the second word line.

140. The NOR flash nonvolatile reconfigurable logic device of claim 139 wherein the second select gating transistor has a drain connected to the sources of the first and second charge retaining transistors of the second pair of charge retaining transistors, a source connected to a gate of the second switching transistor, and a gate connected to the select gating terminal.

141. The NOR flash nonvolatile reconfigurable logic device of claim 139 wherein the two switching transistors and the two select gating transistors are NMOS transistors.

142. The NOR flash nonvolatile reconfigurable logic device of claim 140 wherein the two switching transistors and the two select gating transistors are PMOS transistors.

143. The NOR flash nonvolatile reconfigurable logic device of claim 140 further comprising:
   a first voltage control circuit connected to the plurality word lines provide erasing signals, programming signals, biasing signals for each switch control circuit of the plurality of NOR flash nonvolatile reconfigurable logic circuits; and
   a second voltage control circuit connected to the plurality of drain lines to provide the erasing signals, programming signals, and biasing signals for each switch control circuit of the plurality of NOR flash nonvolatile reconfigurable logic circuits.

144. The NOR flash nonvolatile reconfigurable logic device of claim 143 wherein erasing the first and second pair of charge retaining transistors to have a threshold voltage level of an erased threshold voltage level comprises:
   the first voltage control circuit applying a very large negative erasing voltage level to the plurality of word lines and thus the control gate of the charge retaining transistors of each of the plurality NAND-like NOR flash memory cells and the second voltage control circuit applying the ground reference voltage level to drain lines and thus to the drains of each of the charge retaining transistors of each of the plurality of NAND-like NOR flash memory cells.

145. The NOR flash nonvolatile reconfigurable logic device of claim 144 wherein the erased threshold voltage level is −2.0V.

146. The NOR flash nonvolatile reconfigurable logic device of claim 144:
wherein the very large negative erasing voltage level is from approximately −15.0V to approximately −20.0V;
wherein the voltage level of the ground reference voltage level is applied to a triple P-type well into which each of the switch control circuits is formed; and
wherein the first voltage control circuit applies the ground reference voltage level to the plurality of select line and thus the gates of the first and second select gating transistors.

147. The NOR flash nonvolatile reconfigurable logic device of claim 144 wherein programming one selected charge retaining transistor of the two pair of charge retaining transistors of each of the plurality of switch control circuits to have a threshold voltage level of a programmed threshold voltage level comprises:
the first voltage control circuit applying a very large positive programming voltage level to selected word lines of the plurality of word lines and thus to the control gates of the selected charge retaining transistors; and
the second voltage control circuit applying the ground reference voltage level to the drain lines thus to the drains of the one selected charge retaining transistor of the two pair of charge retaining transistors of each of the plurality of switch control circuits.

148. The NOR flash nonvolatile reconfigurable logic device of claim 147 wherein the programmed threshold voltage level is greater than the voltage level of the power supply voltage source.

149. The NOR flash nonvolatile reconfigurable logic device of claim 147:
wherein the very large positive programming voltage level that is from approximately +15.0V to approximately +20.0V;
wherein the column voltage control circuit applies the voltage level of the ground reference voltage level to the drain lines connected to the unselected charge retaining transistor of the pair of the charge retaining transistors having the one selected charge retaining transistor of each of the plurality of switch control circuits; and
wherein the voltage level of the ground reference voltage level is applied to a triple P-type well into which each of the switch control circuits is formed.

150. The NOR flash nonvolatile reconfigurable logic device of claim 149 wherein in programming one selected charge retaining transistor of the two pair of charge retaining transistors of each of the plurality of switch control circuits further comprises inhibiting programming of the three charge retaining transistors not being programmed in the two pair of charge retaining transistors of each of the plurality of switch control circuits, the first voltage control circuit applies a moderate programming inhibit voltage level to the unselected word lines of the plurality of word lines which is not connected to the control gate of the one selected charge retaining transistor of two pair of charge retaining transistors of each of the plurality of switch control circuits and the second voltage control circuit applies a large programming inhibit voltage level to the drain lines not connected to the pair of charge retaining transistors including the one selected charge retaining transistor of each of the plurality of switch control circuits.

151. The NOR flash nonvolatile reconfigurable logic device of claim 150 wherein the moderate programming inhibit voltage level is approximately +5.0V and the large programming inhibit voltage level is approximately +10.0V.

152. The NOR flash nonvolatile reconfigurable logic device of claim 144 wherein operating selected NOR flash nonvolatile reconfigurable logic circuits comprises:
the first voltage control circuit applies an select voltage level to the plurality of word lines and thus to the control gates of the first and second charge transistors of each of the plurality of switch control circuits such that those of the first and second charge retaining transistors that are erased will be turned on and those of the first and second charge transistors that are programmed will not be turned on;
the second voltage control circuit applies a first operate voltage to the first and third drain lines connected to each of switch control circuits in each column of the plurality of NOR flash nonvolatile reconfigurable logic circuits;
the column voltage control circuit applies a second operate voltage to the second and fourth drain lines connected to each of switch control circuits in each column of the plurality of NOR flash nonvolatile reconfigurable logic circuits; and
the row voltage control circuit applies a select gating signal to the plurality of select gating lines thus to the gates of the select gates to turn on the select gates.

153. The NOR flash nonvolatile reconfigurable logic device of claim 152 wherein the operate select voltage level is approximately the voltage level of the power supply voltage source.

154. The NOR flash nonvolatile reconfigurable logic device of claim 152 wherein the first operate voltage level is the ground reference voltage level and the second operate voltage level is the voltage level of the power supply voltage source plus a threshold voltage level of a transistor.

155. The NOR flash nonvolatile reconfigurable logic device of claim 152 wherein the first operate voltage level is the ground reference voltage level less a threshold voltage level of a transistor and the second operate voltage level is the voltage level of the power supply voltage source.

156. The NOR flash nonvolatile reconfigurable logic device of claim 152 wherein the select gating signal is set to be greater than a voltage level of the power supply voltage source plus twice the threshold voltage level of a transistor.

157. The NOR flash nonvolatile reconfigurable logic device of claim 152 wherein if the first charge retaining transistors of the two pair of charge retaining transistors of the first and second switch control circuits is programmed to the programmed threshold voltage level and the second charge retaining transistors of the two pair of charge retaining transistors of the first and second switch control circuits is erased to the erased threshold voltage level, the first and second switching transistors are activated and the first and second interconnect conductors are connected to the first interconnect conductor.

158. The NOR flash nonvolatile reconfigurable logic device of claim 152 wherein if the first charge retaining transistor of the first switch control circuit is programmed to the programmed threshold voltage level and the second charge retaining transistors of the first switch control circuit is erased to the erased threshold voltage level and the first charge retaining transistor of the second switch control circuit is erased to the erased threshold voltage level and the second charge retaining transistors of the second switch control circuit is programmed to the programmed threshold voltage level, the first switching transistor is activated and the first second interconnect conductor is connected to the first interconnect conductor and the second switching transistor is deactivated and the second interconnect conductor is not connected to the first interconnect conductor.

159. The NOR flash nonvolatile reconfigurable logic device of claim 152 wherein if the first charge retaining transistor of the first switch control circuit is erased to the erased threshold voltage level and the second charge retaining transistor of the first switch control circuit is programmed to the programmed threshold voltage level and the first charge retaining transistor of the second switch control circuit is programmed to the programmed threshold voltage level and the second charge retaining transistor of the second switch control circuit is erased to the erased threshold voltage level, the first switching transistor is deactivated and the first second interconnect conductor is not connected to the first interconnect conductor and the second switching transistor is activated and the second interconnect conductor is connected to the first interconnect conductor.

160. The NOR flash nonvolatile reconfigurable logic device of claim 152 wherein if the first charge retaining transistors of the first and second switch control circuits is erased to the erased threshold voltage level and the second charge retaining transistors of the first and second switch control circuits is programmed to the programmed threshold voltage level, the first and second switching transistors are deactivated and the first and second interconnect conductors are not connected to the first interconnect conductor.

* * * * *